(12) United States Patent
Aoyama et al.

(10) Patent No.: US 11,018,201 B2
(45) Date of Patent: May 25, 2021

(54) DISPLAY DEVICE

(71) Applicant: SEMICONDUCTOR ENERGY LABORATORY CO., LTD., Atsugi (JP)

(72) Inventors: Tomoya Aoyama, Kanagawa (JP); Ryu Komatsu, Kanagawa (JP); Daiki Nakamura, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 16/509,087

(22) Filed: Jul. 11, 2019

(65) Prior Publication Data
US 2019/0333969 A1 Oct. 31, 2019

Related U.S. Application Data

(63) Continuation of application No. 15/247,205, filed on Aug. 25, 2016, now Pat. No. 10,374,018.

(30) Foreign Application Priority Data

Aug. 28, 2015 (JP) ................................ 2015-169163
Jun. 16, 2016 (JP) ................................ 2016-119610

(51) Int. Cl.
*H01L 27/32* (2006.01)
*G02F 1/1335* (2006.01)
(Continued)

(52) U.S. Cl.
CPC ...... *H01L 27/322* (2013.01); *G02F 1/133514* (2013.01); *H01L 27/3246* (2013.01);
(Continued)

(58) Field of Classification Search
CPC ............ H01L 27/322; H01L 27/3246; H01L 51/5284; H01L 2251/558; G02F 1/133514; G02F 1/133512; G02F 1/13394
(Continued)

(56) References Cited

U.S. PATENT DOCUMENTS 6,825,488 B2   11/2004   Yamazaki et al.
7,738,050 B2   6/2010    Yamazaki et al.
(Continued)

FOREIGN PATENT DOCUMENTS

CN   001523406 A   8/2004
CN   101728419 A   6/2010
(Continued)

OTHER PUBLICATIONS

International Search Report (Application No. PCT/162016/054961) dated Nov. 22, 2016.
(Continued)

*Primary Examiner* — Nathanael R Briggs
*Assistant Examiner* — William D Peterson
(74) *Attorney, Agent, or Firm* — Nixon Peabody LLP; Jeffrey L. Costellia

(57) ABSTRACT

A display device with improved viewing angle characteristics is provided. A display device with suppressed mixture of colors between adjacent pixels is provided. The display device includes a first coloring layer, a second coloring layer, and a structure body therebetween. The structure body has a portion closer to a display surface side than a bottom surface of the first coloring layer or a bottom surface of the second coloring layer.

16 Claims, 32 Drawing Sheets

(51) Int. Cl.
 *H01L 51/52* (2006.01)
 *G02F 1/1339* (2006.01)
(52) U.S. Cl.
 CPC ...... *H01L 51/5284* (2013.01); *G02F 1/13394* (2013.01); *G02F 1/133512* (2013.01); *H01L 2251/558* (2013.01)
(58) Field of Classification Search
 USPC .......................................................... 349/42
 See application file for complete search history.

(56) References Cited

U.S. PATENT DOCUMENTS

| | | | |
|---|---|---|---|
| 7,799,590 | B2 | 9/2010 | Yamazaki et al. |
| 8,017,456 | B2 | 9/2011 | Yamazaki et al. |
| 8,111,362 | B2 | 2/2012 | Yamazaki et al. |
| 8,125,601 | B2 | 2/2012 | Kim et al. |
| 8,149,365 | B2 | 4/2012 | Kim et al. |
| 8,325,285 | B2 | 12/2012 | Yamazaki et al. |
| 8,462,286 | B2 | 6/2013 | Yamazaki et al. |
| 8,513,666 | B2 | 8/2013 | Yamazaki et al. |
| 8,842,230 | B2 | 9/2014 | Yamazaki et al. |
| 8,981,638 | B2 | 3/2015 | Isa |
| 9,088,006 | B2 | 7/2015 | Yamazaki et al. |
| 9,188,825 | B2 | 11/2015 | Yamazaki et al. |
| 9,356,082 | B2 | 5/2016 | Isa |
| 9,507,215 | B2 | 11/2016 | Choi et al. |
| 10,228,591 | B2 | 3/2019 | Choi et al. |
| 10,670,927 | B2 | 6/2020 | Choi et al. |
| 2005/0030450 | A1 | 2/2005 | Okamoto et al. |
| 2010/0097295 | A1 | 4/2010 | Kwak |
| 2012/0273804 | A1 | 11/2012 | Hatano |
| 2012/0286312 | A1* | 11/2012 | Hatano ............... H01L 27/3246 257/98 |
| 2014/0353630 | A1 | 12/2014 | Baek et al. |
| 2015/0325812 | A1 | 11/2015 | Yamazaki et al. |
| 2016/0011446 | A1 | 1/2016 | Yamazaki et al. |
| 2017/0147110 | A1 | 5/2017 | Xu |
| 2018/0095310 | A1* | 4/2018 | Nagami ................ G02F 1/1339 |

FOREIGN PATENT DOCUMENTS

| | | |
|---|---|---|
| CN | 104218183 A | 12/2014 |
| EP | 2178124 A | 4/2010 |
| EP | 2818534 A | 12/2014 |
| JP | 2003-344839 A | 12/2003 |
| JP | 2004-046223 A | 2/2004 |
| JP | 2004-213026 A | 7/2004 |
| JP | 2005-293946 A | 10/2005 |
| JP | 2007-279544 A | 10/2007 |
| JP | 2008-170483 A | 7/2008 |
| JP | 2009-300648 A | 12/2009 |
| JP | 2010-097925 A | 4/2010 |
| JP | 2010-287421 A | 12/2010 |
| JP | 2012-124103 A | 6/2012 |
| JP | 2012-238587 A | 12/2012 |
| JP | 2012-253014 A | 12/2012 |
| JP | 2014-170644 A | 9/2014 |
| JP | 2014-197522 A | 10/2014 |
| JP | 2015-011350 A | 1/2015 |
| JP | 2015-025909 A | 2/2015 |
| KR | 2004-0005694 A | 1/2004 |
| KR | 2010-0042799 A | 4/2010 |
| KR | 2014-0141372 A | 12/2014 |
| TW | 200401145 | 1/2004 |
| TW | 201507143 | 2/2015 |

OTHER PUBLICATIONS

Written Opinion (Application No. PCT/162016/054961) dated Nov. 22, 2016.

* cited by examiner

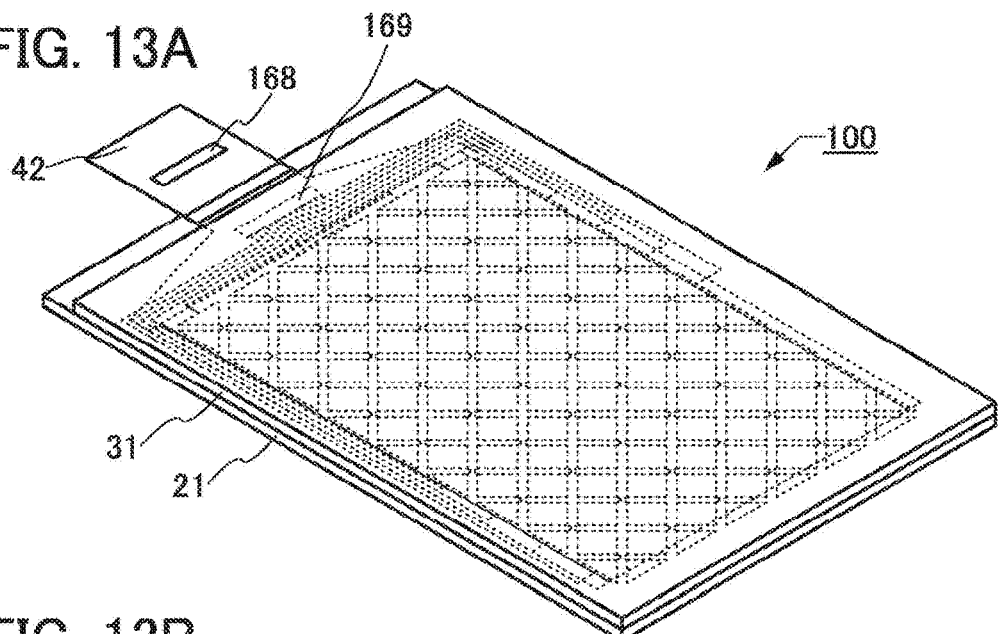
FIG. 13A
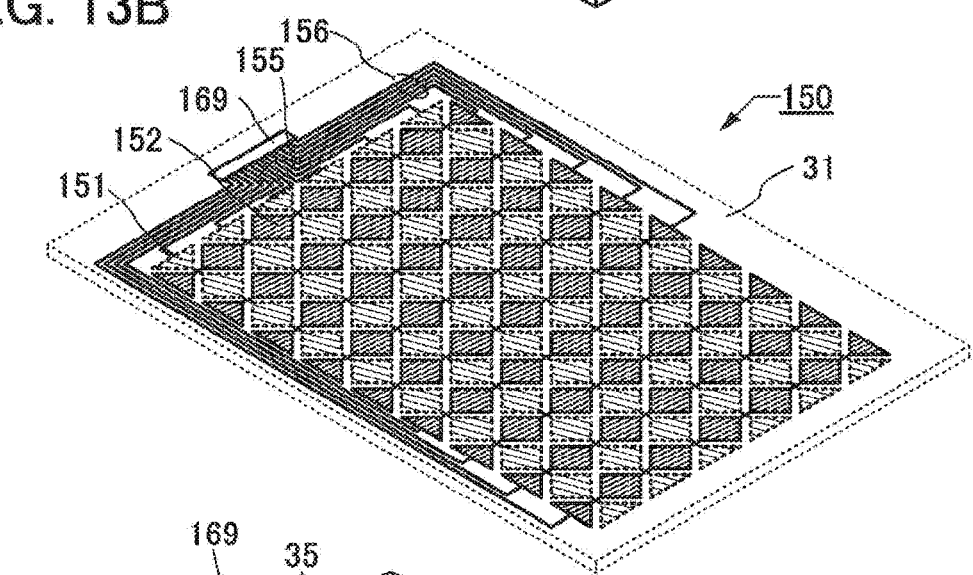
FIG. 13B
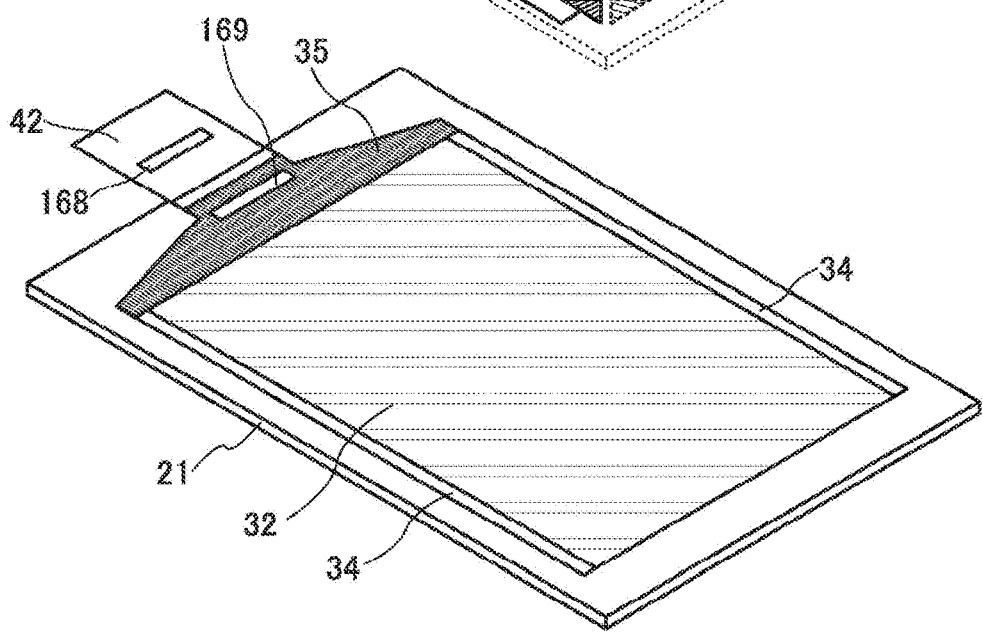

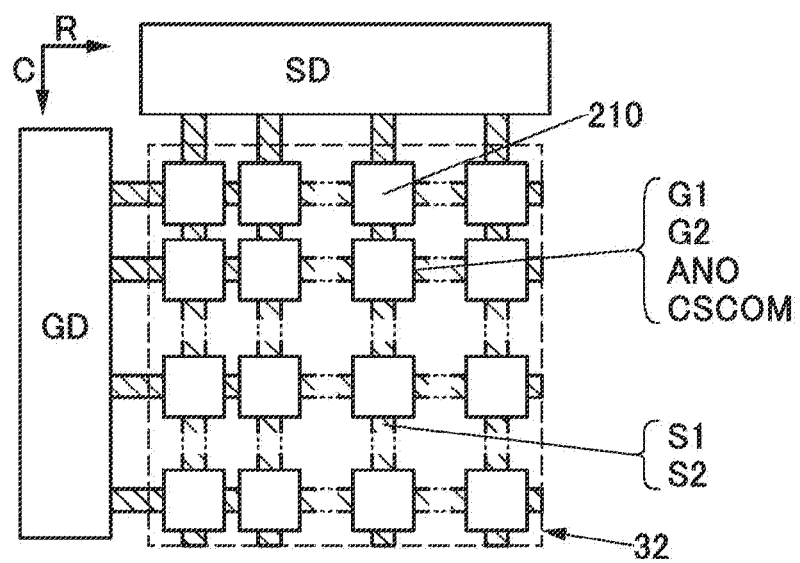
FIG. 16A
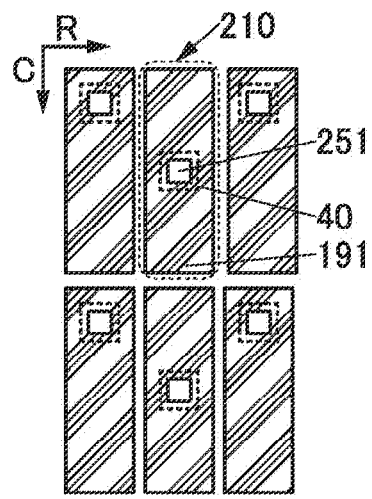
FIG. 16B1
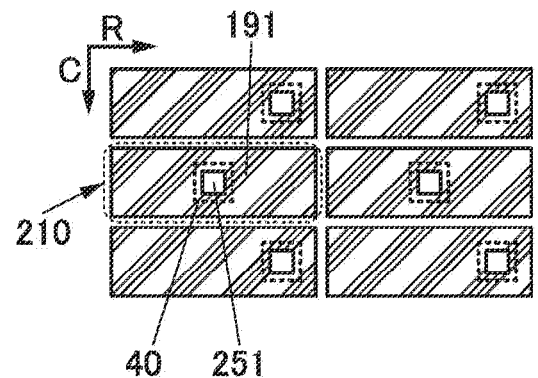
FIG. 16B2

FIG. 20A1
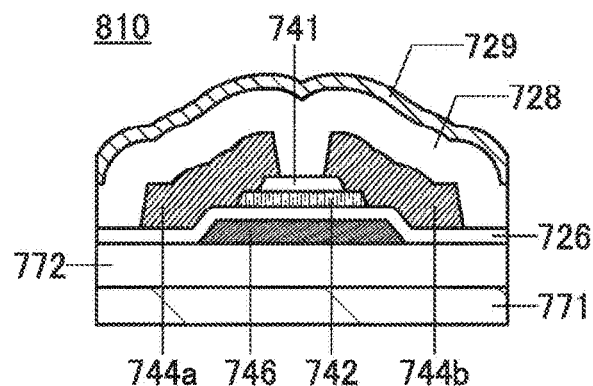
FIG. 20A2
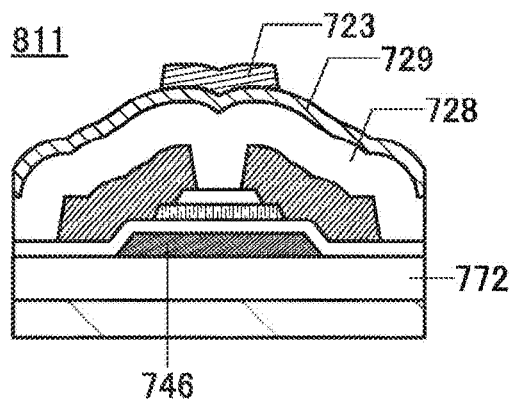
FIG. 20B1
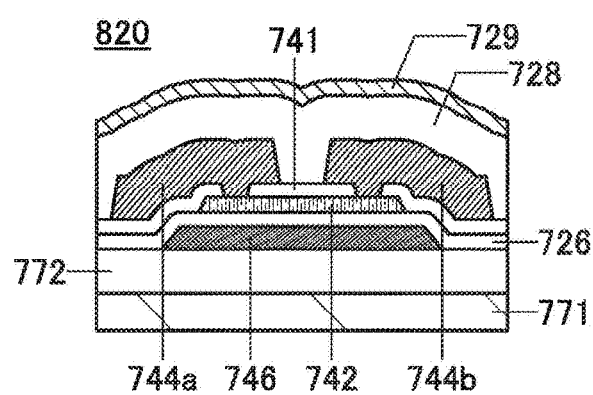
FIG. 20B2
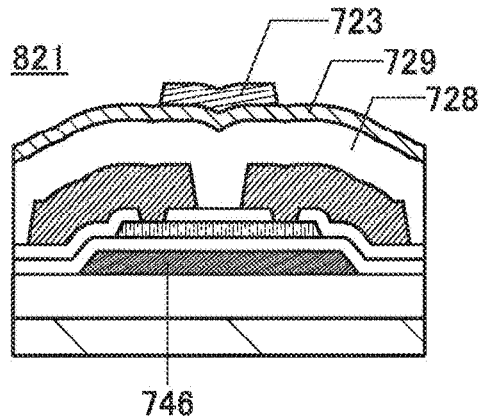
FIG. 20C1
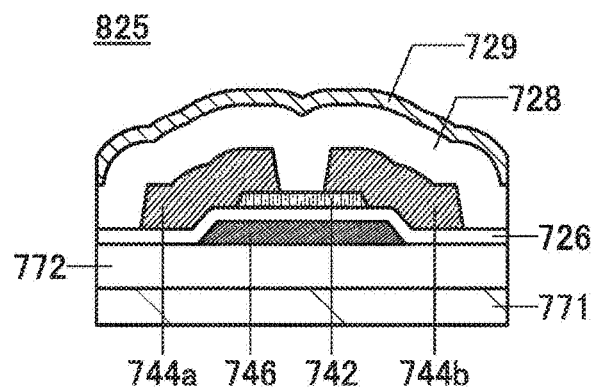
FIG. 20C2
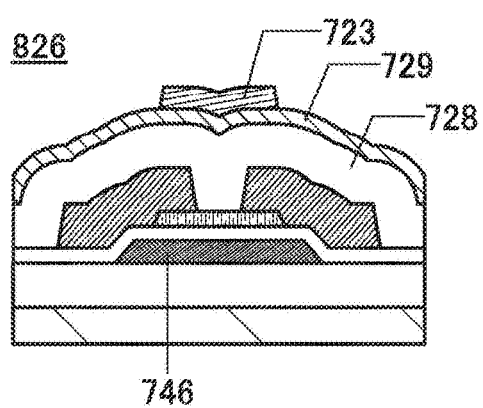

FIG. 21A1
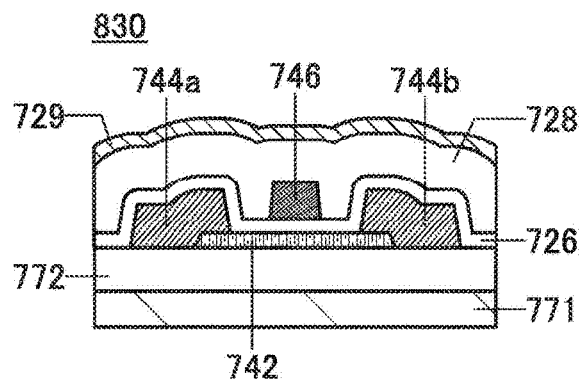
FIG. 21A2
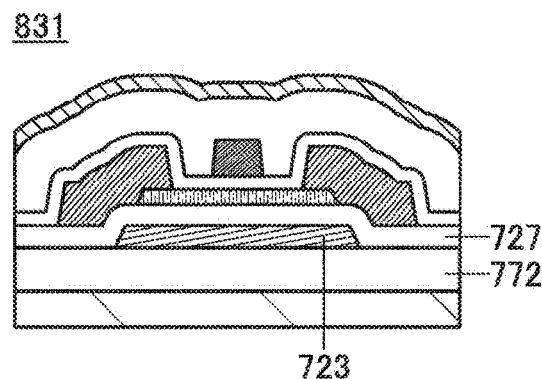
FIG. 21A3
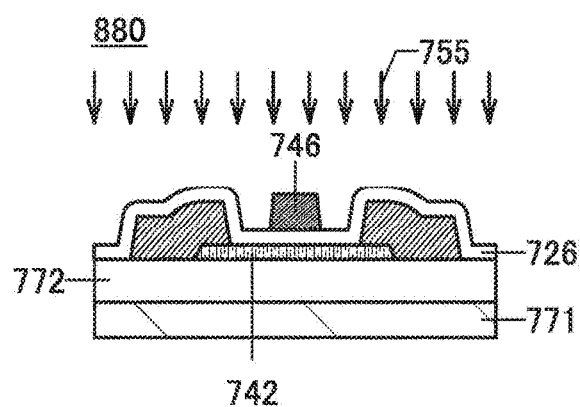
FIG. 21B1
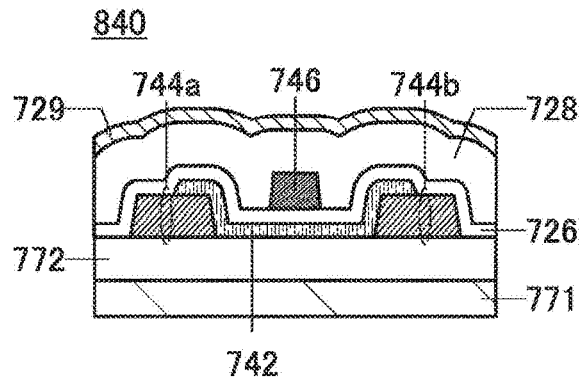
FIG. 21B2
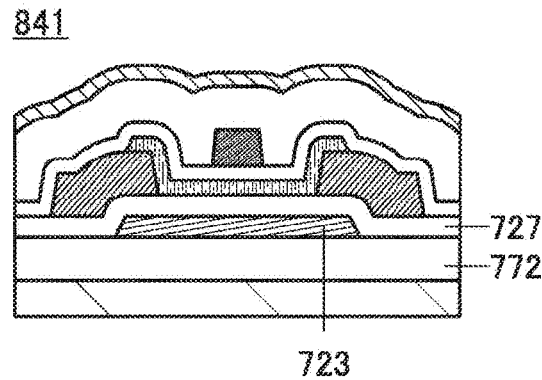

FIG. 22A1
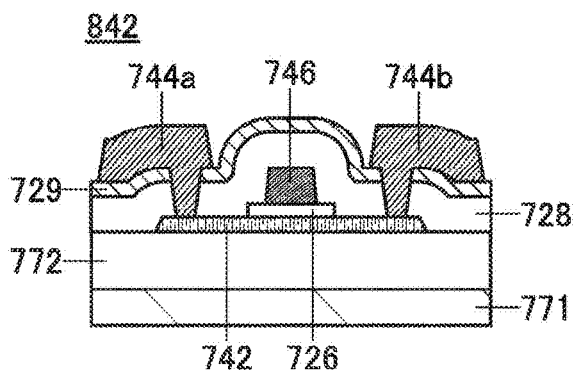
FIG. 22A2
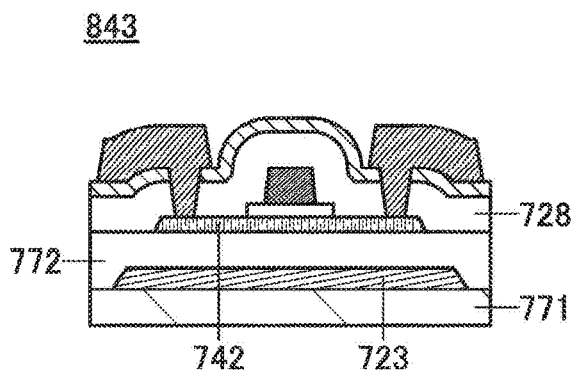
FIG. 22A3
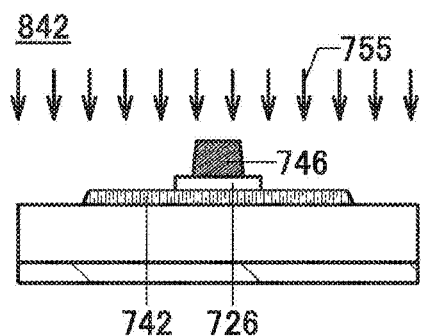
FIG. 22B1
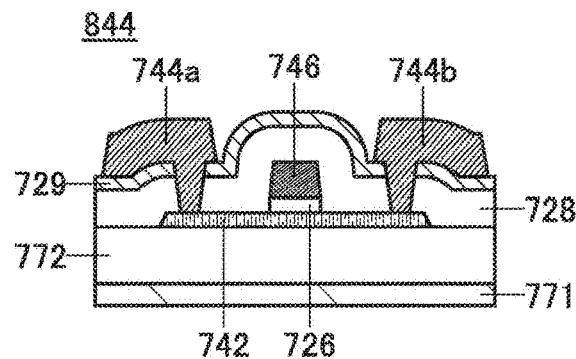
FIG. 22B2
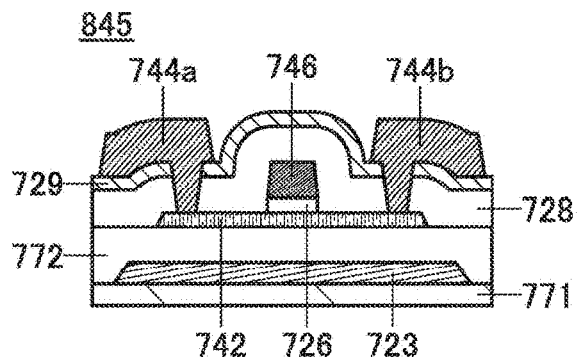
FIG. 22C1
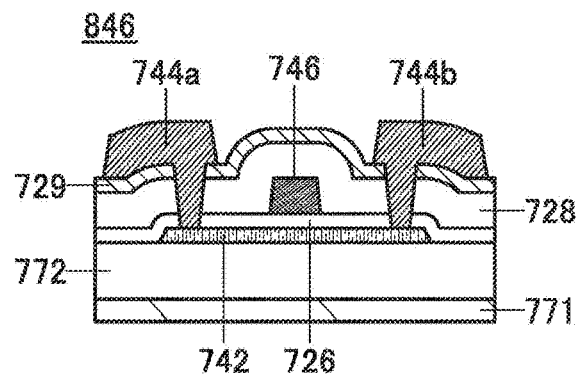
FIG. 22C2
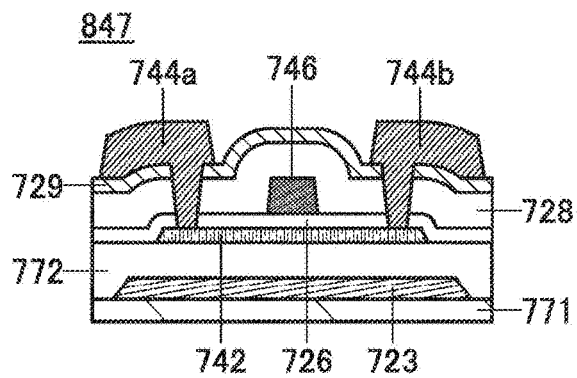

FIG. 26A
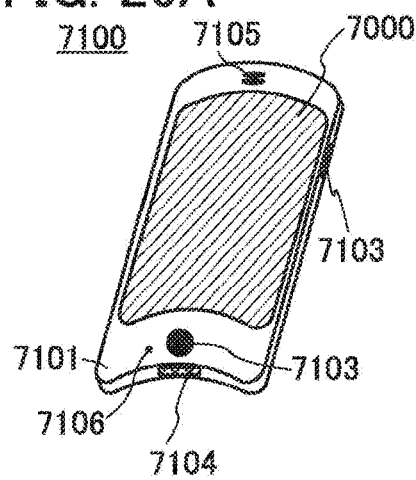
FIG. 26B
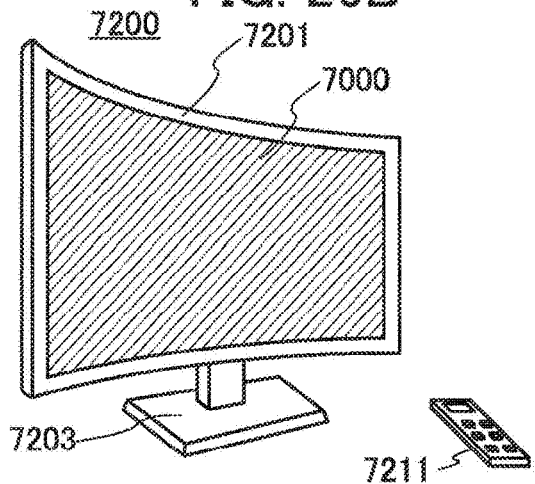
FIG. 26C1
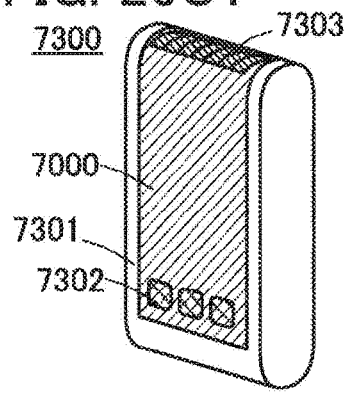
FIG. 26D
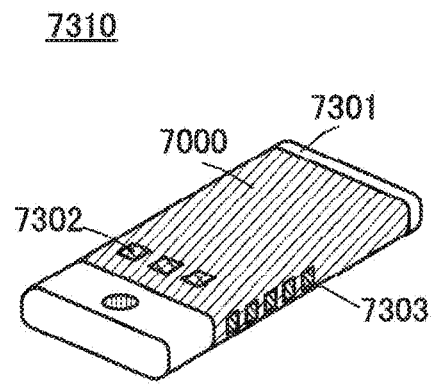
FIG. 26E
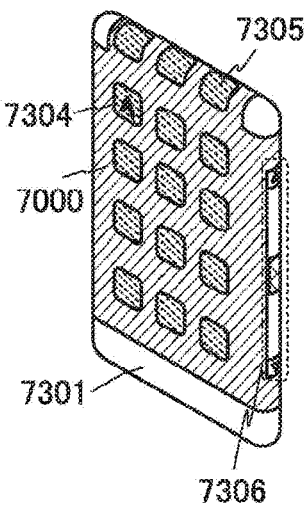
FIG. 26C2
FIG. 26F
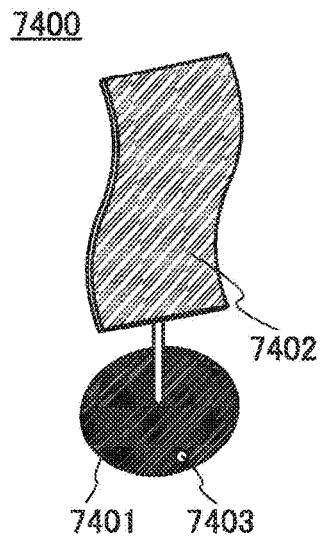
FIG. 26G
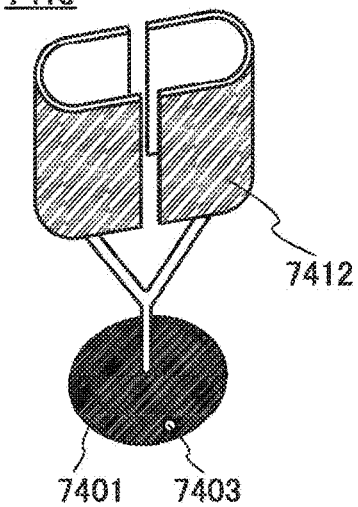
FIG. 26H
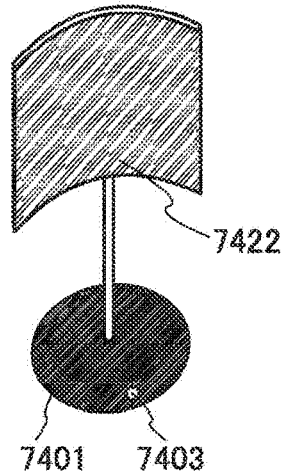

FIG. 27A1
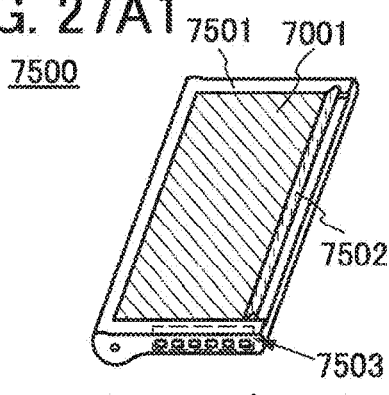
FIG. 27B
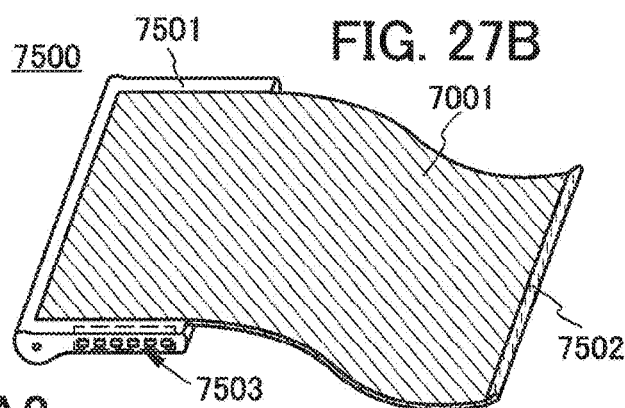
FIG. 27A2
FIG. 27C
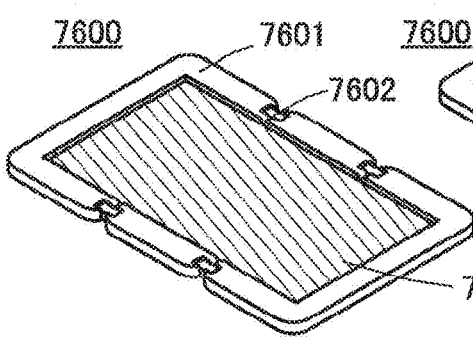
FIG. 27D
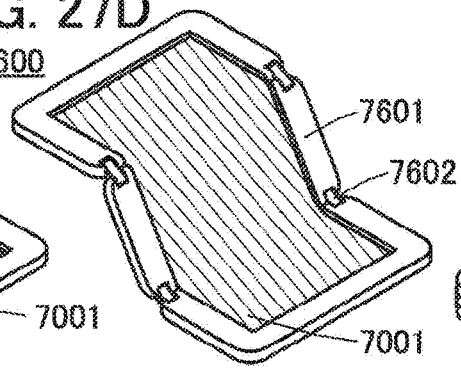
FIG. 27E
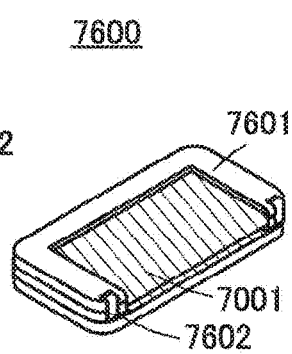
FIG. 27F
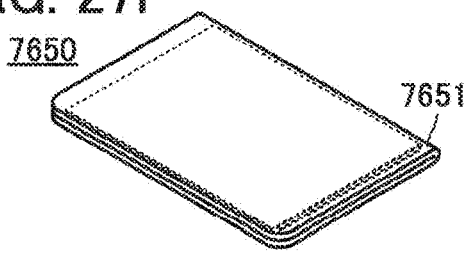
FIG. 27G
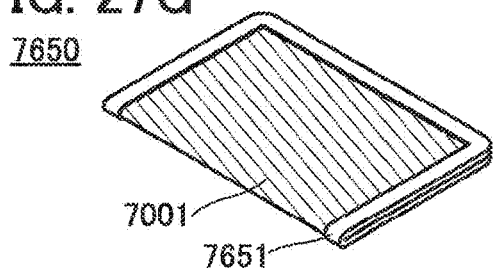
FIG. 27H
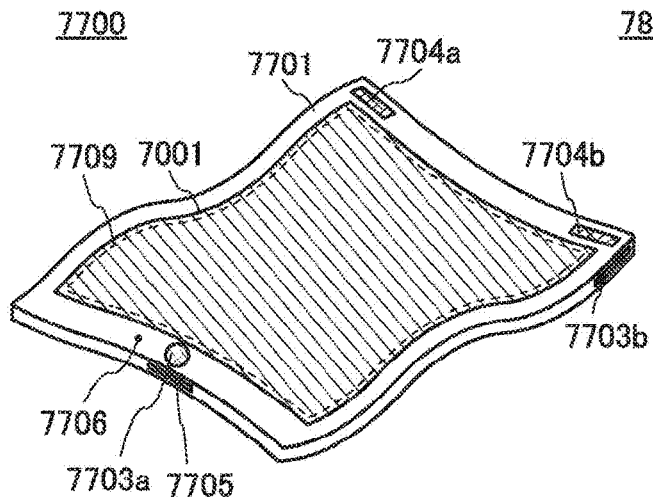
FIG. 27I
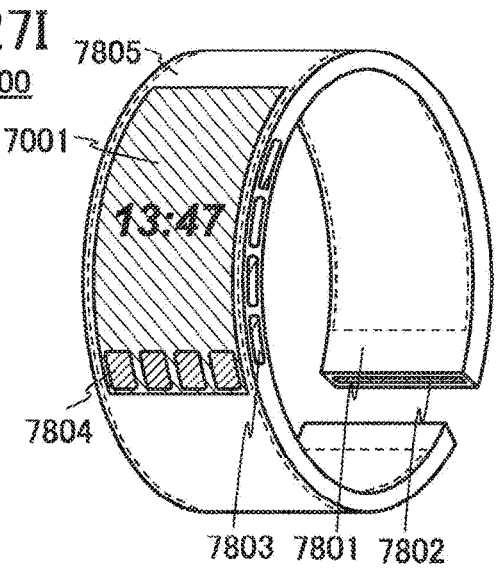

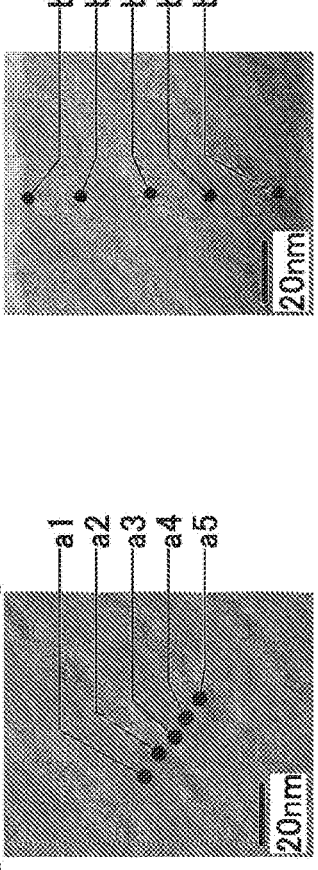
FIG. 31A plan-view TEM image
FIG. 31B cross-sectional TEM image
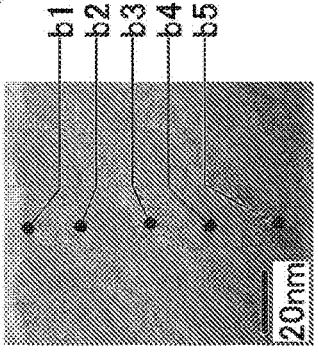
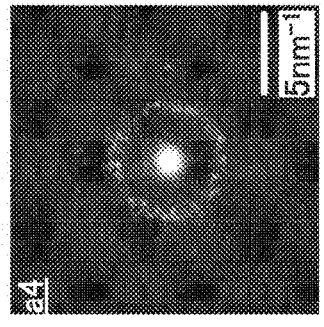 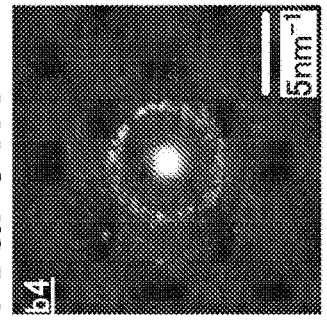
FIG. 31C  FIG. 31H
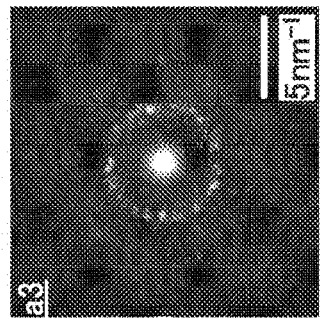 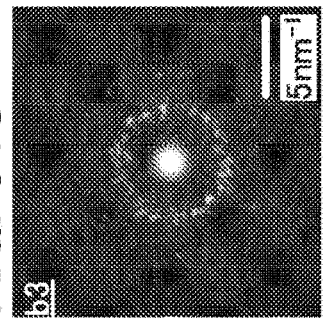
FIG. 31D  FIG. 31I
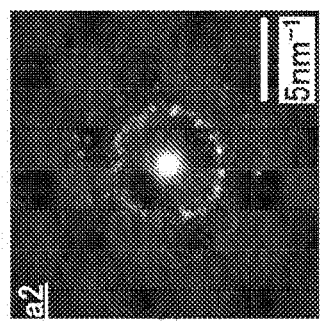 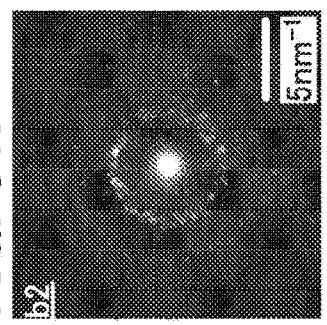
FIG. 31E  FIG. 31J
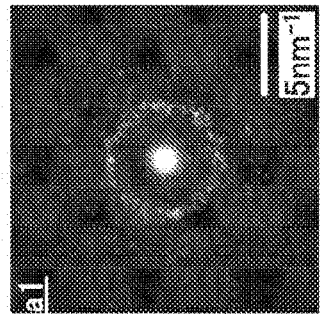 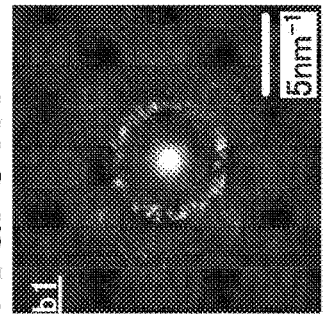
FIG. 31F  FIG. 31K
FIG. 31G  FIG. 31L
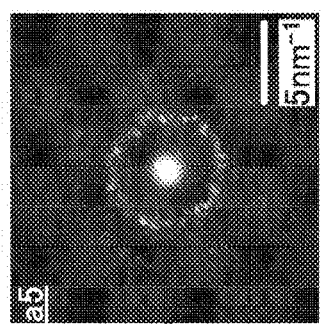 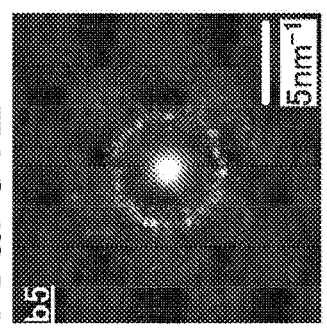

DISPLAY DEVICE

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With use of such an organic EL element, thin, lightweight, high-contrast, and low-power-consumption display devices can be achieved.

Patent Document 1 discloses a flexible light-emitting device using an organic EL element.

REFERENCE

Patent Document

[Patent Document 1] Japanese Published Patent Application No. 2014-197522

DISCLOSURE OF INVENTION

Viewing angle characteristics are a measure of performance of display devices. Poor viewing angle characteristics cause a decreased luminance or a varied chromaticity to be visible when a display surface of a display device is seen obliquely. Hence, an improvement in the viewing angle characteristics of display devices is necessary in applications requiring a wide viewing angle.

Furthermore, display devices are required to have higher definition to achieve higher resolution. For example, as compared to large-sized devices like home-use television sets, relatively small-sized portable information terminals such as cellular phones, smart phones, and tablet terminals need to have higher definition to have increased resolution.

An object of one embodiment of the present invention is to provide a display device with improved viewing angle characteristics. Another object of one embodiment of the present invention is to provide a display device with suppressed mixture of colors between adjacent pixels. Another object of one embodiment of the present invention is to provide a high-definition display device. Another object of one embodiment of the present invention is to provide a thin display device. Another object of one embodiment of the present invention is to provide a display device easily manufactured. Another object of one embodiment of the present invention is to provide a low-power-consumption display device. Another object of one embodiment of the present invention is to provide a highly reliable display device.

Note that the description of these objects does not preclude the existence of other objects. In one embodiment of the present invention, there is no need to achieve all the objects. Other objects can be derived from the description of the specification and the like.

One embodiment of the present invention is a display device including a first coloring layer, a second coloring layer, and a structure body. The first coloring layer and the second coloring layer are apart from each other. The structure body is positioned between the first coloring layer and the second coloring layer and has a portion closer to a display surface side than a bottom surface of the first coloring layer or a bottom surface of the second coloring layer.

In the above, the thickness of the first coloring layer is preferably different from that of the second coloring layer.

In addition, preferably, a first electrode is provided to overlap with the first coloring layer, and a second electrode is provided between the first electrode and the first coloring layer. In that case, preferably, a layer containing a light-emitting substance is provided between the first electrode and the second electrode, and the distance between the second electrode and the first coloring layer is partly greater than or equal to 0 μm and less than or equal to 20 μm.

Also preferably, an insulating layer covering an end portion of the first electrode is provided, and the structure body is formed over the insulating layer. In that case, the second electrode preferably has a portion covering a top surface of the structure body.

In addition, the layer containing the light-emitting substance preferably has a portion positioned between the structure body and the second electrode. Furthermore, a cross section of the structure body preferably has a portion in which the angle between a side surface and a bottom surface is greater than or equal to 25° and less than or equal to 155°.

Furthermore, the layer containing the light-emitting substance preferably has a portion that is positioned between the structure body and the second electrode and is thinner than a portion overlapping with the first electrode.

The aforementioned display device of one embodiment of the present invention can include a third electrode overlapping with the first coloring layer and include a liquid crystal between the third electrode and the first coloring layer.

In addition, a fourth electrode having a slit is preferably provided between the third electrode and the liquid crystal. In that case, preferably, the distance between the fourth electrode and the first coloring layer is partly greater than or equal to 1 μm and less than or equal to 20 μm.

Alternatively, preferably, a fifth electrode is provided between the third electrode and the first coloring layer, and the liquid crystal is positioned between the third electrode and the fifth electrode. In that case, preferably, the distance between the third electrode and the first coloring layer is partly greater than or equal to 1 μm and less than or equal to 20 μm.

According to one embodiment of the present invention, a display device with improved viewing angle characteristics can be provided. A display device with suppressed mixture of colors between adjacent pixels can be provided. A high-definition display device can be provided. A thin display device can be provided. A display device easily manufactured can be provided. A low-power-consumption display device can be provided. A highly reliable display device can be provided.

Note that one embodiment of the present invention does not necessarily achieve all the effects listed above. Other effects can be derived from the description of the specification, the drawings, the claims, and the like.

BRIEF DESCRIPTION OF DRAWINGS

In the accompanying drawings:

FIGS. 13A and 13B illustrate structure examples of a display device of one embodiment;

FIGS. 16A, 16B1, and 16B2 illustrate structure examples of a display device of one embodiment;

FIGS. 20A1, 20A2, 20B1, 20B2, 20C1, and 20C2 illustrate structure examples of a transistor of one embodiment;

FIGS. 21A1, 21A2, 21A3, 21B1, and 21B2 illustrate structure examples of a transistor of one embodiment;

FIGS. 22A1, 22A2, 22A3, 22B1, 22B2, 22C1, and 22C2 illustrate structure examples of a transistor of one embodiment;

FIGS. 26A, 26B, 26C1, 26C2, and 26D to 26H illustrate electronic devices of one embodiment;

FIGS. 27A1, 27A2, and 27B to 27I illustrate electronic devices of one embodiment;

FIGS. 31A and 31B are TEM images of samples and FIGS. 31C to 31L are electron diffraction patterns thereof.

BEST MODE FOR CARRYING OUT THE INVENTION

Figure 1A:
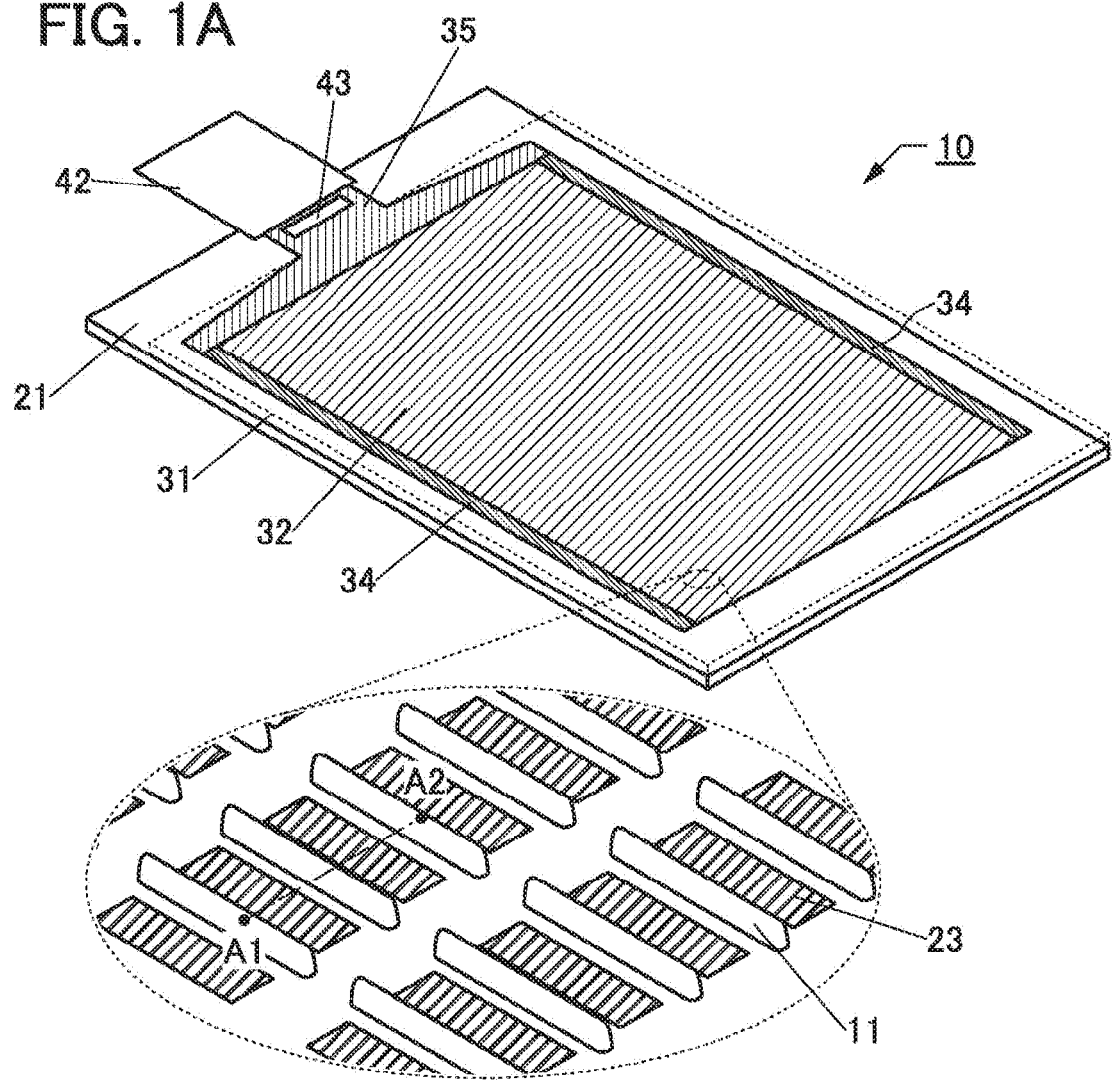
FIGS. 1A and 1B illustrate a structural example of a display device of one embodiment.

Embodiments will be described in detail with reference to the drawings. Note that the present invention is not limited to the description below, and it is easily understood by those skilled in the art that the mode and details can be variously changed without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and the description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases, and therefore, it is not limited to the illustrated scale.

Note that in this specification and the like, ordinal numbers such as "first" and "second" are used in order to avoid confusion among components and do not limit the components numerically.

Embodiment 1

In this embodiment, structure examples of a display device of one embodiment of the present invention will be described.

The display device of one embodiment of the present invention includes a plurality of pixels. Each pixel includes a display element and a coloring layer for coloring light from the display element. An electrode (e.g., a pixel electrode) of the display element and the coloring layer can be provided to face each other. The coloring layers in adjacent pixels are arranged apart from each other.

In addition, a structure body is positioned between two coloring layers in adjacent pixels. The structure body can be positioned, for example, between two pixels corresponding to different colors.

The display device can have a structure, for example, in which a display element, a coloring layer, and a structure body are interposed between a pair of substrates. For example, one of the substrates can be provided with an electrode of the display element and the other substrate can be provided with the coloring layer, and the substrates can be bonded with an adhesive layer. Here, the structure body may be formed on either substrate side.

The structure body may have a function as a spacer for preventing the pair of substrates from getting closer more than necessary. The structure body may also have a function of inhibiting mixture of colors between adjacent pixels. For example, in the case where an EL element is used as the display element, the structure body may have a function of reducing a leakage current between adjacent EL elements to inhibit mixture of colors between adjacent pixels.

Preferably, the structure body is partly positioned on an upper side (closer to the display surface side) than a surface (bottom surface) of the coloring layer that faces the display element. In other words, the structure body preferably fits between the coloring layers apart from each other. Note that the structure body is not necessarily in contact with the coloring layers, and a space, an adhesive layer, or the like may be positioned therebetween.

This structure can significantly reduce the distance between the pair of substrates. In addition, the structure can drastically reduce the distance between the display element and the coloring layer, more specifically, the distance between at least one of the pair of electrodes of the display element and the coloring layer, leading to improved viewing angle characteristics. Furthermore, light from the display element including light emitted obliquely can be taken out effectively, reducing power consumption. Moreover, a display device with a small thickness can be achieved.

As the display element, a light-emitting element such as an LED, an organic light-emitting diode (OLED), or a quantum-dot light-emitting diode (QLED), or an optical element such as a liquid crystal element can be used. The luminance of light emitted from or through such an element is controlled by current or voltage.

Besides the above, a micro electro mechanical systems (MEMS) element, an electron emitter, another optical element, or the like can be used as the display element. Examples of the MEMS display element include a MEMS shutter display element and an optical interference type MEMS display element. A carbon nanotube may be used for the electron emitter. As another optical element, an element using a microcapsule method, an electrophoretic method, an electrowetting method, an Electronic Liquid Powder (registered trademark) method, or the like can be used.

More specific structure examples will be described below with reference to drawings.

Structure Example 1

FIG. 1A is a schematic perspective view illustrating a display device 10 of one embodiment of the present invention. The display device 10 includes a substrate 21 and a substrate 31 which are bonded to each other. In FIG. 1A, the substrate 31 is denoted by a dashed line.

The display device 10 includes a display portion 32, circuits 34, a wiring 35, and the like. For example, a conductive layer 23, which is included in the circuit 34, the wiring 35, and the display portion 32 and serves as a pixel electrode, is provided on the substrate 21 FIG. 1A shows an example in which an IC 43 and an FPC 42 are mounted on the substrate 21.

A circuit serving as a scan line driver circuit can be used as the circuit 34, for example.

The wiring 35 is configured to supply a signal or electric power to the display portion 32 or the circuit 34, The signal or electric power is input to the wiring 35 from the outside through the FPC 42 or from the IC 43.

In FIG. 1A, the IC 43 is mounted on the substrate 21 by a chip on glass (COG) method as an example. As the IC 43, for example, an IC serving as a scan line driver circuit or a signal line driver circuit can be used. Note that it is possible that the IC 43 is not provided when, for example, the display device 10 includes circuits serving as a scan line driver circuit and a signal line driver circuit and when the circuits serving as a scan line driver circuit and a signal line driver circuit are provided outside and a signal for driving the display device 10 is input through the FPC 42. Alternatively, the IC 43 may be mounted on the FPC 42 by a chip on film (COF) method.

FIG. 1A shows an enlarged view of part of the display portion 32. The conductive layers 23 included in a plurality of display elements are arranged in a matrix in the display portion 32. The conductive layer 23 serves as, for example, a pixel electrode. A structure body 11 is provided between the two conductive layers 23 adjacent to each other. Here, the structure body 11 is preferably provided between the two conductive layers 23 included in two pixels corresponding to different colors. Alternatively, the structure body 11 may be provided between the conductive layers 23 included in two pixels corresponding to the same color.

Cross-Sectional Structure Example 1

Cross-Sectional Structure Example 1-1

Figure 1B:
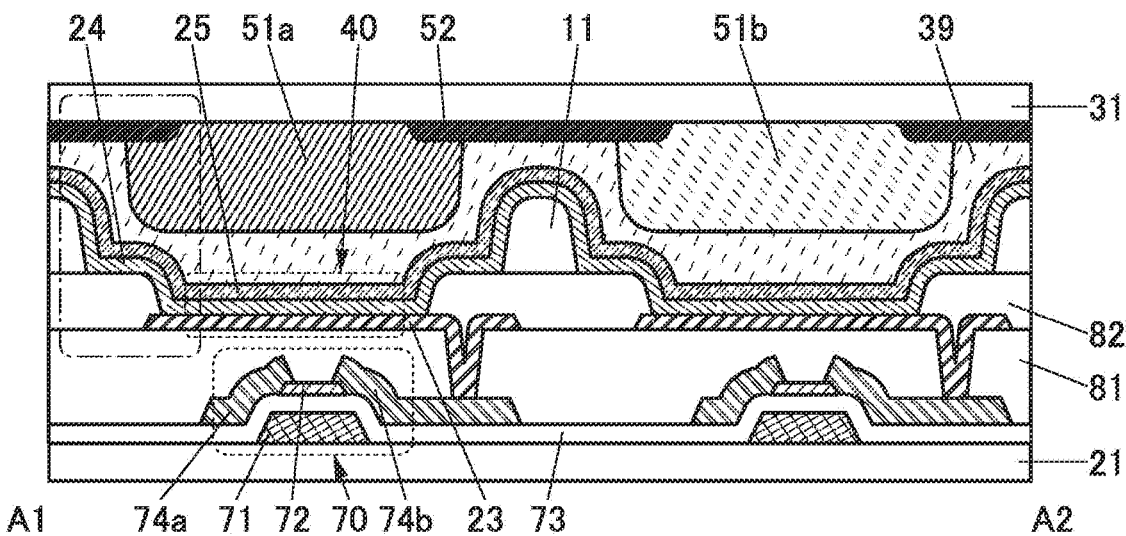

FIG. 1B shows an example of a cross section along line A1-A2 in FIG. 1A. FIG. 1B shows the cross section of a region including two adjacent pixels (sub-pixels). In this example, a light-emitting element 40 with a top-emission structure is used as a display element; thus, the display surface is on the side of the substrate 31.

The display device 10 has a structure in which the substrate 21 and the substrate 31 are bonded with an adhesive layer 39. In other words, the light-emitting element 40 is sealed with the adhesive layer 39.

A transistor 70, the light-emitting element 40, the structure body 11, and the like are provided over the substrate 21. In addition, insulating layers 73, 81, 82, and the like are provided over the substrate 21. On the surface of the substrate 31 that faces the substrate 21, provided are a coloring layer 51a, a coloring layer 51b, a light-blocking layer 52, and the like.

The coloring layers 51a and 51b are apart from each other. The light-blocking layer 52 is positioned between the coloring layers 51a and 51b. As illustrated in FIG. 1B, the light-blocking layer 52 and the coloring layer 51a are preferably arranged to partly overlap with each other. The same applies to the light-blocking layer 52 and the coloring layer 51b.

The transistor 70 includes a conductive layer 71 serving as a gate, a semiconductor layer 72, the insulating layer 73 serving as a gate insulating layer, a conductive layer 74a serving as one of a source and a drain, a conductive layer 74b serving as the other of the source and the drain, and the like.

The insulating layer 81 is provided to cover the transistor 70, and the conductive layer 23 is provided over the insulating layer 81. The conductive layer 23 is electrically connected to the conductive layer 74b through an opening in the insulating layer 81. Part of the conductive layer 23 serves as a pixel electrode.

The insulating layer 82 is provided to cover an end portion of the conductive layer 23.

The insulating layer 82 preferably has a tapered shape.

The structure body 11 is provided over the insulating layer 82. The structure body 11 is positioned between the two light-emitting elements 40 adjacent to each other in a plan view. Furthermore, the structure body 11 includes a portion positioned between the two coloring layers (the coloring layers 51a and 51b) adjacent to each other in a plan view. The structure body 11 is also preferably arranged to overlap with part of the light-blocking layer 52 in a plan view.

The light-emitting element 40 includes an EL layer 24 and a conductive layer 25 which are provided over the conductive layer 23. Part of the conductive layer 25 serves as a common electrode of the light-emitting element 40. When a potential difference is generated between the conductive layers 23 and 25 and current flows through the EL layer 24, the light-emitting element 40 emits light.

FIG. 1B shows an example in which the EL layer 24 and the conductive layer 25 are shared with a plurality of pixels. The EL layer 24 covers the insulating layer 82 and the structure body 11 as well as an exposed portion of the conductive layer 23. The conductive layer 25 covers the EL layer 24.

In FIG. 1B, the structure body 11 includes a portion positioned above the surfaces (bottom surfaces) of the coloring layers 51a and 51b that face the light-emitting element 40. This provides a structure in which the structure body 11 fits between the coloring layers 51a and 51b. In that case, the coloring layer 51a, the coloring layer 51b, or the light-blocking layer 52 is not necessarily in contact with the structure body 11 (or the surface of the conductive layer 25 covering the structure body 11), and the adhesive layer 39 may be provided therebetween as illustrated in FIG. 1B.

Such a structure enables the distance between the substrates 21 and 31 to be extremely small. The smaller the distance between the light-blocking layer 52 and the light-emitting element 40 is, the wider the angle of light emitted from the light-emitting element 40 through an opening of the light-blocking layer 52 can be. As a result, a display device with improved viewing angle characteristics can be achieved.

In addition, the distance between the light-emitting element 40 and the coloring layer 51a can be extremely small; hence, almost all of the light emitted from the light-emitting element 40 to the display surface side enters the coloring layer 51a. Even in the case where light is emitted obliquely to a coloring layer (e.g., the coloring layer 51b) in an adjacent pixel, the light is absorbed first by the coloring layer 51a except for a specific color, and therefore is not emitted to the outside through the coloring layer 51b. This significantly reduces the mixture of colors between adjacent pixels, resulting in a smaller change in chromaticity when the display surface is obliquely seen.

Figure 2A:
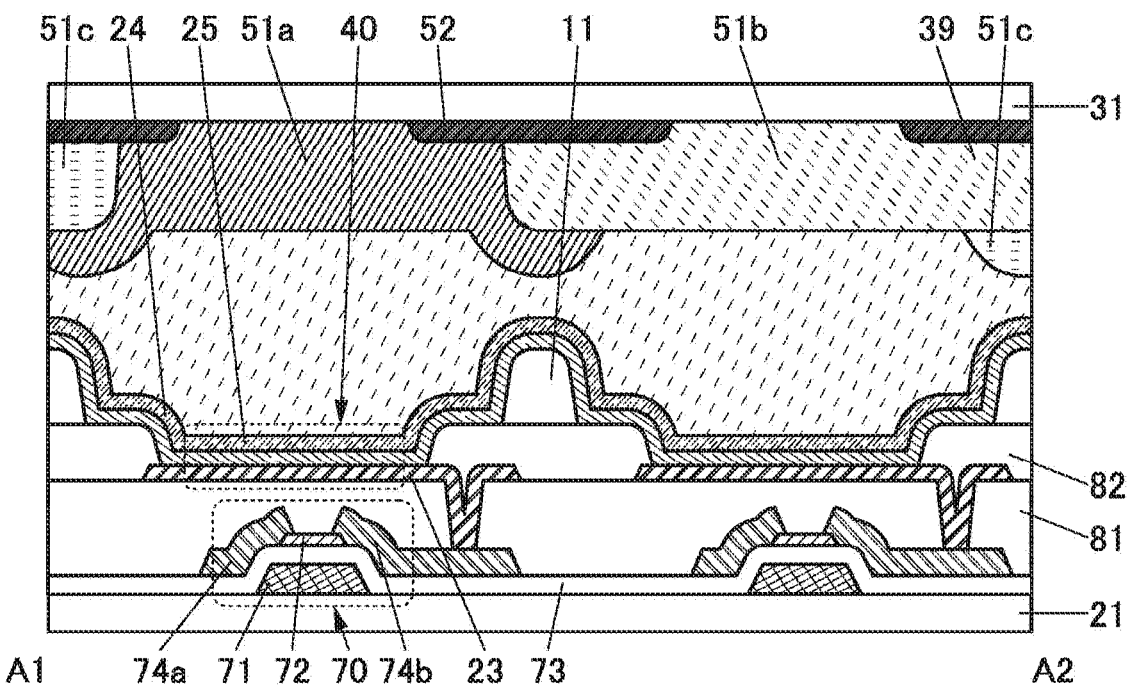
FIGS. 2A and 2B illustrate structure examples of a display device of one embodiment.
Figure 2B:
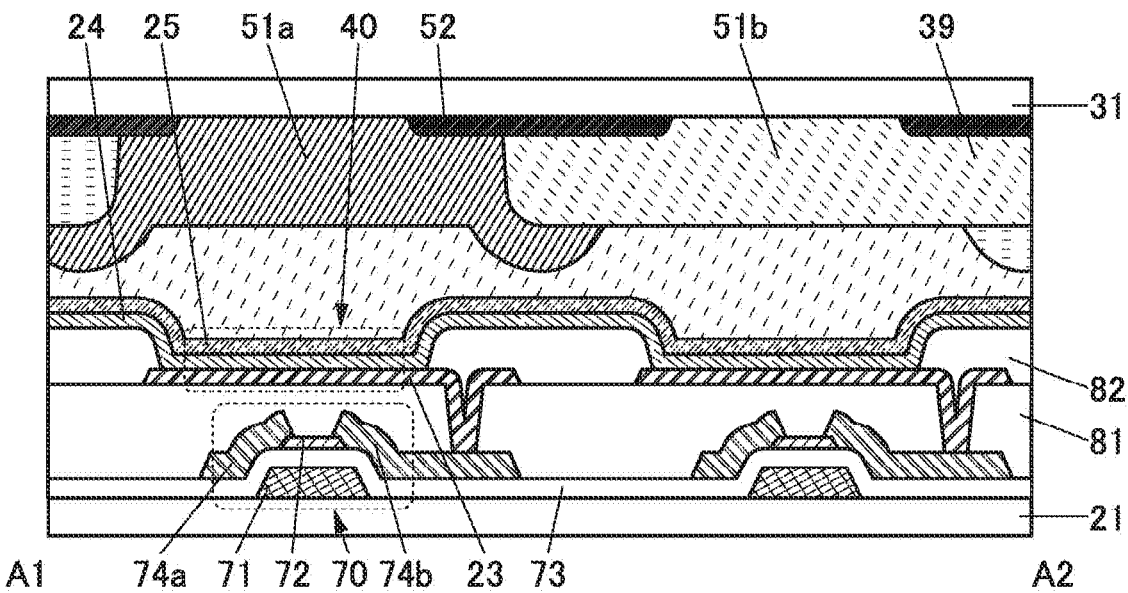

For comparison, FIG. 2A shows an example in which coloring layers of two adjacent pixels are arranged to overlap with each other to reduce the mixture of colors between the adjacent pixels. FIG. 2A illustrates part of a coloring layer 51c in addition to the coloring layers 51a and 51b. FIG. 2B is a modification example of FIG. 2A in which the structure body 11 is not provided so that the distance between the substrates 31 and 21 is reduced.

In the structures illustrated in FIGS. 2A and 2B, the mixture of colors between the adjacent pixels can be reduced because the two coloring layers partly overlap between the adjacent pixels. However, a reduction in the distance between the substrates 21 and 31 is restricted by the thickness of the portion where the two coloring layers overlap, and the distance cannot be reduced substantially as compared to that in the structure with the coloring layers not overlapping. In contrast, FIG. 1B shows the structure in which the coloring layers are apart from each other and the structure body 11 fits therebetween; accordingly, the mixture of color can be reduced and the distance between the substrates can be made quite small. Thus, in the structure of FIG. 1B, a change in luminance from an oblique angle can be reduced more effectively than in the structures of FIGS. 2A and 2B.

The structure body 11 may have a function as a spacer for preventing the substrates 21 and 31 from getting closer more than necessary. Hence, the surface of the structure body 11, or the surface of a layer (e.g., the conductive layer 25) covering the structure body 11 may be in contact with a component such as the light-blocking layer 52 provided on the substrate 31.

The structure body 11 may have a function of absorbing at least part of visible light. This makes it possible to partly absorb light emitted obliquely to the coloring layer in an adjacent pixel through the structure body 11 and to reduce the mixture of colors between adjacent pixels more effectively. The structure body 11 may be formed using a material similar to that for the coloring layer 51a or 51b or the light-blocking layer 52.

Although the display device 10 described here is an active matrix display device including an active element such as the transistor 70, a passive matrix display device including no active elements can also be used. In that case, the transistor 70 is not necessary and for example, components between the conductive layer 23 and the substrate 21 can be omitted.

Figure 3A:
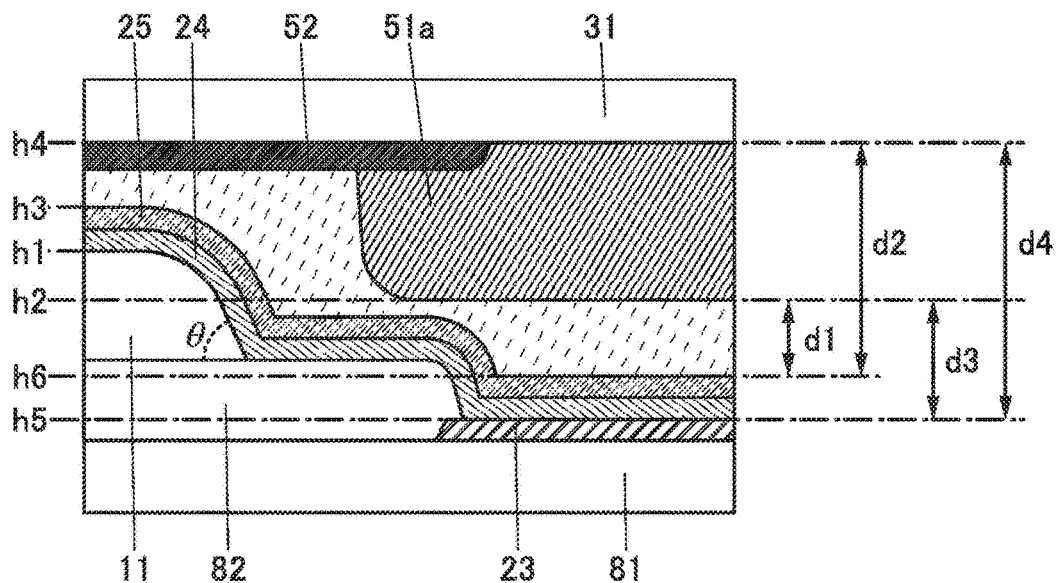
FIGS. 3A to 3E illustrate structure examples of a display device of one embodiment.

FIG. 3A is an enlarged view of a region surrounded by the dashed-dotted line in FIG. 1B.

As illustrated in FIG. 3A, h1 denotes the height of the highest (thickest) point of the structure body 11; h2, the height of the lowest point of the coloring layer 51a; h3, the height of the highest point of the conductive layer 25 over the structure body 11; h4, the height of the highest point of the coloring layer 51a, i.e., the height of a surface where the coloring layer 51a is formed; h5, the height of the top surface of the conductive layer 23; and h6, the height of the top surface of the conductive layer 25 that overlaps with the conductive layer 23. Here, the height of a point refers to, for example, the distance from the surface of the substrate 21 to the point.

As illustrated in FIG. 3A, the structure body 11 is formed so that the height h1 of the structure body 11 is higher than the height h2 of the bottom surface of the coloring layer 51a. Similarly, the conductive layer 25 is formed so that the height h3 of the top surface of the conductive layer 25 over the structure body 11 is higher than the height h2. Here, the top surface of the conductive layer 25 and the bottom surface of the light-blocking layer 52 may be partly in contact with each other.

Distance dl is the distance between the top surface of the conductive layer 25 and the bottom surface of the coloring layer 51a in the direction perpendicular to the surface of the substrate 21. That is, the distance d1 is equal to a value obtained by subtracting the height h6 from the height h2. The mixture of colors between adjacent pixels can be reduced as the distance dl decreases. The distance d1 can be, for example, greater than or equal to 0 μm and less than or equal to 20 μm, preferably greater than or equal to 0 μm and less than or equal to 10 μm, and more preferably greater than or equal to 0 µm and less than or equal to 5 µm. The distance d1 of 0 µm means that the conductive layer 25 is in contact with the coloring layer 51a.

Distance d2 is the distance between the top surface of the conductive layer 25 and the surface where the coloring layer 51a is formed in the direction perpendicular to the surface of the substrate 21. That is, the distance d2 is equal to a value obtained by subtracting the height h6 from the height h4, and equal to a value obtained by adding the distance d1 to the thickness of the coloring layer 51a. A decrease in luminance at the time of obliquely viewing the display surface can be reduced as the distance d2 decreases. The thickness of the coloring layer 51a can be, for example, greater than or equal to 100 nm and less than or equal to 5 µm, preferably greater than or equal to 200 nm and less than or equal to 4 µm, and more preferably greater than or equal to 500 nm and less than or equal to 3 µm.

Here, in the case where the distance between A and B is greater than or equal to x and less than or equal to y, a portion where the distance between A and B is greater than or equal to x and less than or equal to y only needs to be included in an observed area.

Distance d3 is the distance between the top surface of the conductive layer 23 and the bottom surface of the coloring layer 51a in the direction perpendicular to the surface of the substrate 21. That is, the distance d3 is equal to a value obtained by subtracting the height h5 from the height h2, and equal to a value obtained by adding the distance d1 to the thicknesses of the EL layer 24 and the conductive layer 25. Note that in the case where an optical adjustment layer is provided to achieve a microcavity structure, the thickness of the optical adjustment layer is assumed to be included in the thickness of the EL layer 24. The mixture of colors between adjacent pixels can be reduced as the distance d3 decreases. The thickness of the EL layer 24 can be optimized in accordance with the structure or formation method of the light-emitting element 40; for example, can be greater than or equal to 20 nm and less than or equal to 1 µm. The thickness of the conductive layer 25 can be optimized in accordance with the material or required resistance thereof; for example, can be greater than or equal to 0.3 nm and less than or equal to 1 µm.

The distance d3 between the top surface of the conductive layer 23 and the bottom surface of the coloring layer 51a can be, for example, greater than or equal to 20 nm and less than or equal to 22 µm, preferably greater than or equal to 20 nm and less than or equal to 20 µm, more preferably greater than or equal to 20 nm and less than or equal to 10 µm, and still further preferably greater than or equal to 20 nm and less than or equal to 5 µm.

Distance d4 is the distance between the top surface of the conductive layer 23 and the surface where the coloring layer 51a is formed in the direction perpendicular to the surface of the substrate 21. That is, the distance d4 is equal to a value obtained by subtracting the height h5 from the height h4, and equal to a value obtained by adding the distance d3 to the thickness of the coloring layer 51a. A decrease in luminance at the time of obliquely viewing the display surface can be reduced as the distance d4 decreases.

Next, the shape of the structure body 11 is described. As illustrated in FIG. 3A, a taper angle of the structure body 11 is denoted as a taper angle θ. Here, the taper angle of the structure body 11 refers to an angle between a bottom surface (a surface in contact with the surface where the structure body 11 is formed) and a side surface at an end portion of the structure body 11. The taper angle is greater than 0° and less than 180°. A taper with an angle less than or equal to 90° is referred to as a forward taper whereas a taper with an angle greater than 90° is referred to as an inverse taper in some cases.

The taper angle θ of the structure body 11 is preferably greater than or equal to 25° and less than or equal to 155°, more preferably greater than or equal to 30° and less than or equal to 150°, and still further preferably greater than or equal to 35° and less than or equal to 145°.

In the case where the EL layer 24 is shared with a plurality of pixels as illustrated in FIG. 1B and FIG. 3A, if the EL layer 24 includes a highly conductive layer, current might flow to the light-emitting element 40 in an adjacent pixel through the highly conductive layer. The same applies to the case where the EL layer 24 includes a layer containing both a donor substance and an acceptor substance. This causes a problem of lower color reproducibility due to the light emission of the light-emitting element 40 in the adjacent pixel, which should not emit light. Such a phenomenon can be referred to as crosstalk.

The taper angle θ of the structure body 11 in the above range allows the EL layer 24 covering the structure body 11 to be partly thin. In particular, a portion of the EL layer 24 that covers the side surface of the structure body 11 can be formed thinner than another portion that covers the top surface of the structure body 11 or another portion over the conductive layer 23. The EL layer 24 can also be divided particularly when the structure body 11 has an inverse tapered shape. Such a structure body 11 contributes to a reduction in the current flowing to an adjacent pixel through the EL layer 24 even when the EL layer 24 includes highly conductive layer or a layer containing both a donor substance and an acceptor substance. As a result, crosstalk can be reduced.

Figure 3B:
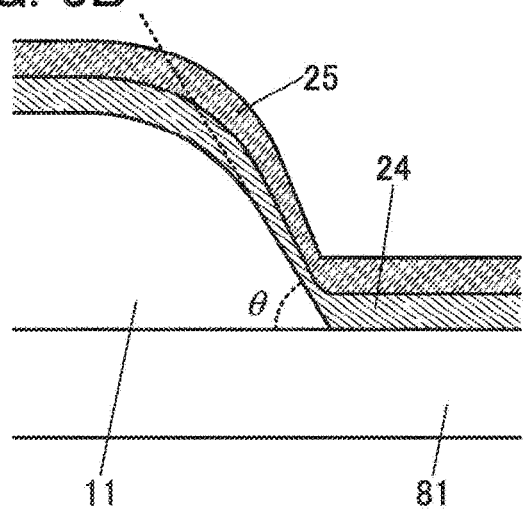
Figure 3C:
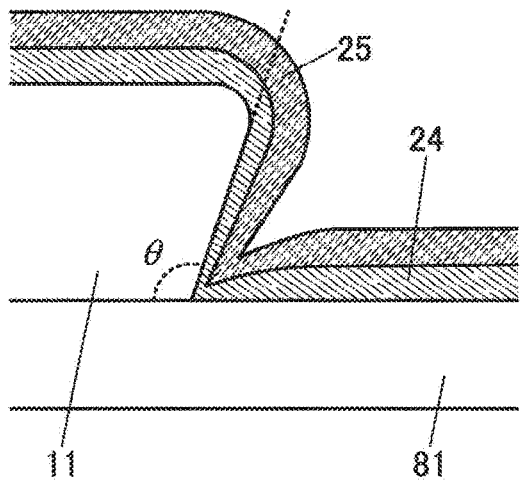
Figure 3D:
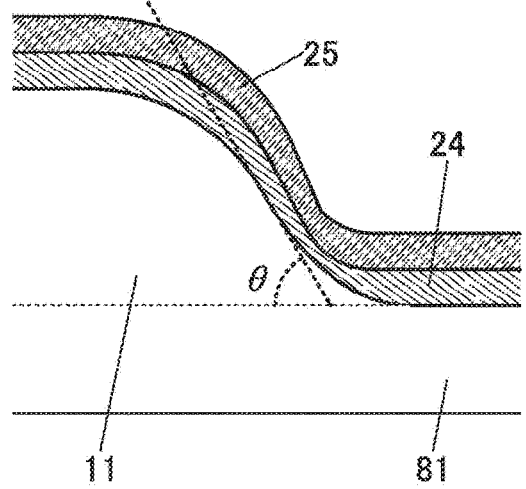

FIGS. 3B to 3D illustrate examples of the cross section of the structure body 11 and the EL layer 24 and the conductive layer 25 which are provided to cover the structure body 11.

The structure body 11 illustrated in FIG. 3B has a forward tapered shape, and a portion of the EL layer 24 that covers the end portion of the structure body 11 is reduced in thickness.

The structure body 11 illustrated in FIG. 3C has an inverse tapered shape, and the portion of the EL layer 24 that covers the end portion of the structure body 11 is reduced in thickness.

In FIG. 3D, the end portion of the structure body 11 has a continuous curvature to reduce the thickness of the portion of the EL layer 24 that covers the end portion of the structure body 11. In the case where the end portion of the structure body 11 has a continuous curvature as illustrated in FIG. 3D, the widest angle between the bottom surface and the side surface of the structure body 11 can be regarded as the taper angle θ of the structure body 11.

Note that in the cross section observation, the boundary between the insulating layer 82 and the structure body 11 cannot be clearly seen depending on their materials. In addition, the boundary does not actually exist in the case where, for example, the insulating layer 82 and the structure body 11 are formed using the same material or formed with the same film by using an exposure technique with a half-tone mask, a gray-tone mask, or the like, or a multiple exposure technique. In that case, a portion extending up and the other portion can be regarded as the structure body 11 and the insulating layer 82, respectively. FIG. 3D shows an example including no boundary between the insulating layer 82 and the structure body 11, and a dashed line denotes an example of a line that can be regarded as the boundary.

Figure 3E:
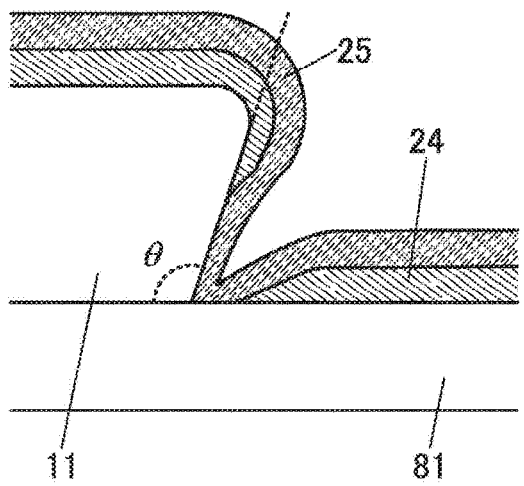

In the case where the structure body 11 has an inverse tapered shape, as illustrated in FIG. 3E, the EL layer 24 covering the structure body 11 is sometimes divided in the vicinity of the side surface of the structure body 11. In that case, preferably, the conductive layer 25 covering the structure body 11 is not divided though it may be reduced in thickness in the vicinity of the side surface of the structure body 11. This allows the EL layer 24 to be covered with the conductive layer 25 without being exposed also in the vicinity of the side surface of the structure body 11, resulting in improved reliability.

The above is the description of Cross-sectional structure example 1-1.

Described below is an example of a structure partly different from the above cross-sectional structure example 1-1.

Cross-Sectional Structure Example 1-2

Figure 4A:
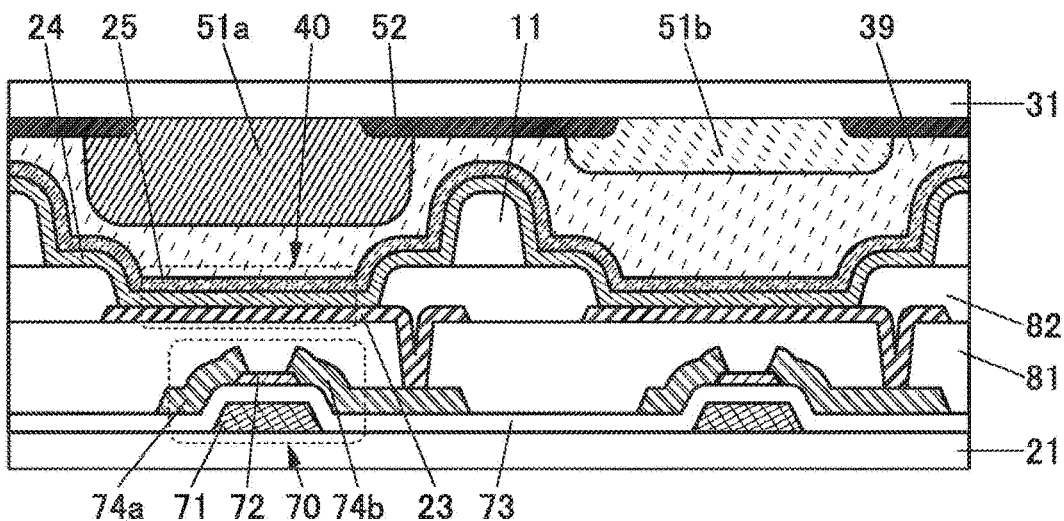
FIGS. 4A to 4C illustrate structure examples of a display device of one embodiment.

FIG. 4A illustrates an example different from FIG. 1B in that the thickness of the coloring layer 51b is smaller than that of the coloring layer 51a.

The bottom surface of the coloring layer 51a is positioned below the top surface of the structure body 11, and the bottom surface of the coloring layer 51b is positioned above the top surface of the structure body 11. In such a case where the coloring layers have different thicknesses between pixels, the structure body 11 only needs to be partly positioned above the bottom surface of at least one coloring layer.

Cross-Sectional Structure Example 1-3

Figure 4B:
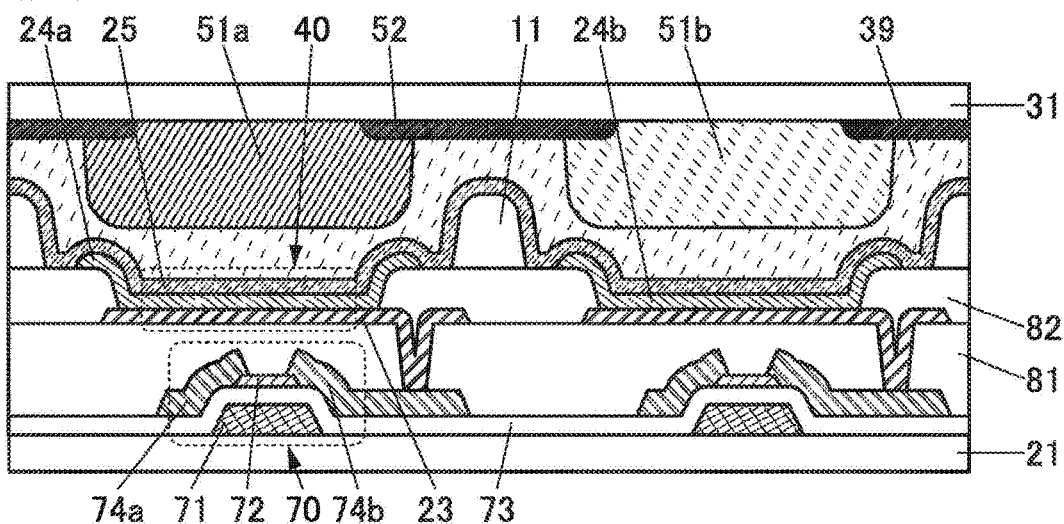

FIG. 4B illustrates an example different from FIG. 1B in that the EL layer 24 is separately formed for each pixel. In the structure of FIG. 4B, an EL layer 24a and an EL layer 24b are provided to overlap with the coloring layer 51a and the coloring layer 51b, respectively. The EL layers 24a and 24b contain light-emitting substances emitting light of different colors. The conductive layer 25 is shared with adjacent pixels and partly covers the structure body 11. Note that the EL layers 24a and 24b may be formed without being divided between pixels of the same color.

Even in such a case where the EL layers are separately formed, the color reproducibility of the display device can be significantly improved due to the coloring layers.

In that case, the structure body 11 may have a function as a spacer for preventing a mask (metal mask) used for the deposition of the EL layers 24a and 24b from being in contact with the surface where the EL layer 24a or 24b is formed.

Cross-Sectional Structure Example 1-4

Figure 4C:
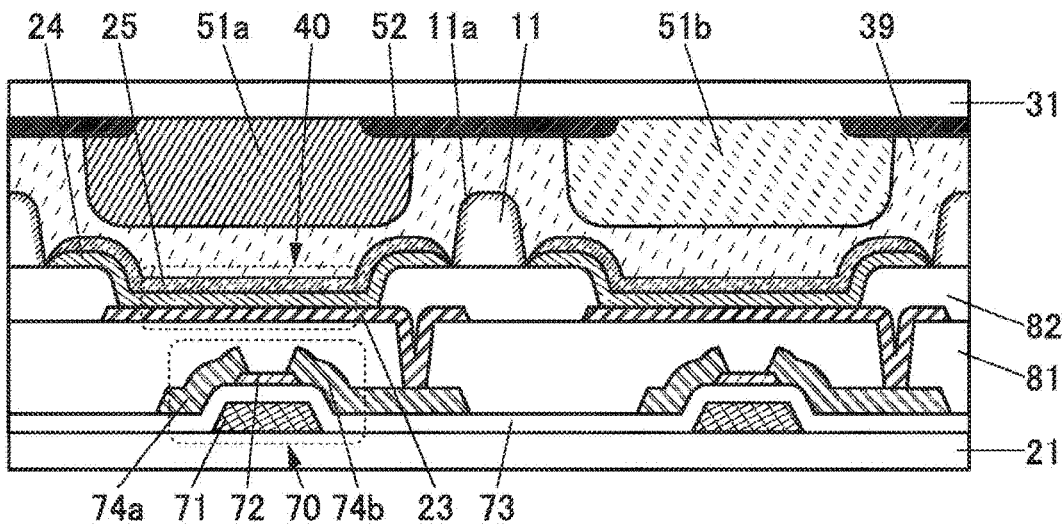

FIG. 4C illustrates an example in which the EL layer 24 and the conductive layer 25 are separately formed for each pixel.

In the example of FIG. 4C, the surface of the structure body 11 includes a liquid-repellent portion 11a. Thus, in the case where the EL layer 24 and the conductive layer 25 are formed by a method using a liquid material, such as an inkjet method, a dispensing method, or a screen printing, materials of the EL layer 24 and the conductive layer 25 can be prevented from spreading over the structure body 11 to an adjacent pixel. As a result, the EL layer 24 and the conductive layer 25 can be positioned between the two structure bodies 11 as illustrated in FIG. 4C.

Although both the EL layer 24 and the conductive layer 25 are formed separately for each pixel in this example, the conductive layer 25 may be formed by an evaporation method, a sputtering method, or the like so as to be shared with adjacent pixels.

The EL layer 24 may be formed without being divided between adjacent pixels of the same color. The conductive layer 25 is preferably formed without being divided between adjacent pixels in the width direction of FIG. 4C.

Cross-Sectional Structure Example 1-5

Figure 5A:
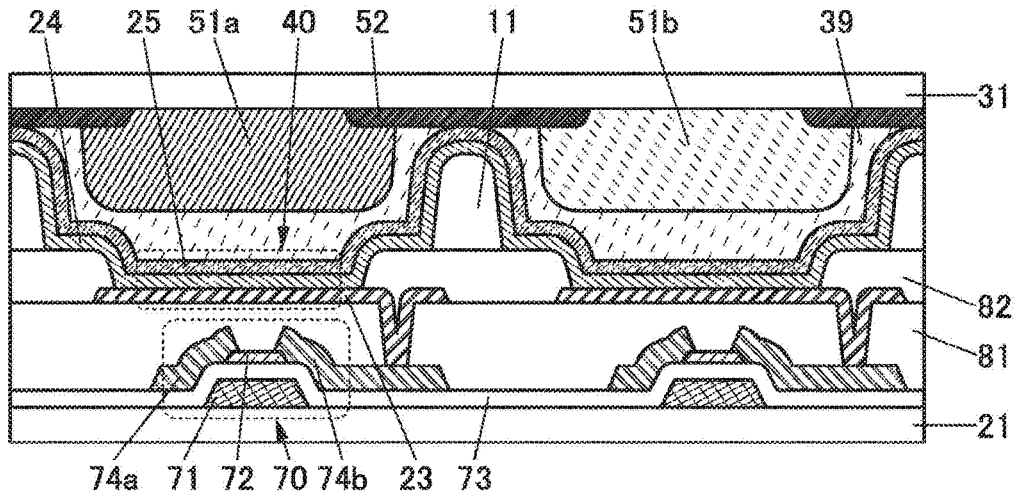
FIGS. 5A to 5C illustrate structure examples of a display device of one embodiment.

FIG. 5A illustrates an example in which the conductive layer 25 over the structure body 11 is in contact with the light-blocking layer 52. Part of the conductive layer 25 and the light-blocking layer 52 may be in contact with each other in part or the whole of the display portion 32. When the conductive layer 25 is in contact with the light-blocking layer 52 in the whole of the display portion 32, the distance between the substrates 31 and 21 is unlikely to vary, reducing display unevenness.

Cross-Sectional Structure Example 1-6

Figure 5B:
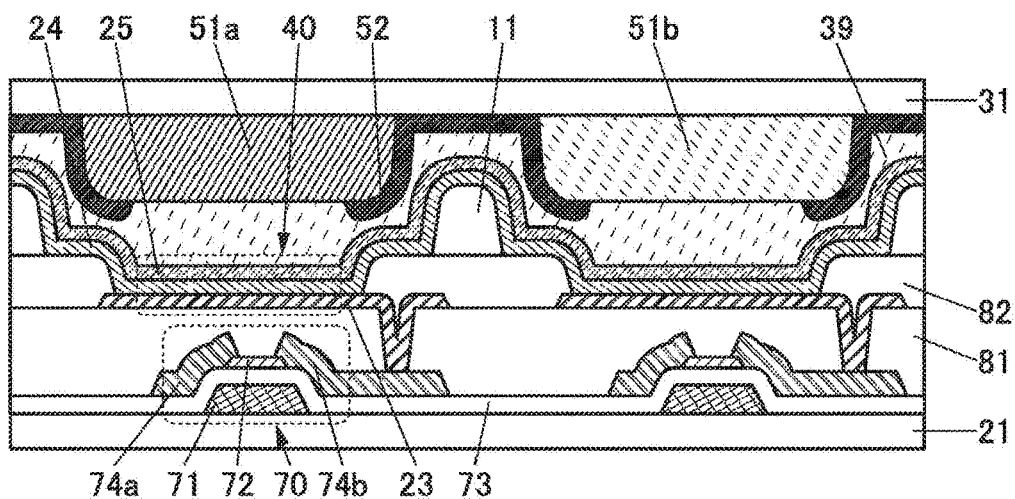

FIG. 5B illustrates an example in which an end portion of the coloring layer 51a is covered with the light-blocking layer 52. With such a structure, light traveling through the coloring layer 51a to an adjacent pixel can be prevented effectively.

Cross-Sectional Structure Example 1-7

Figure 5C:
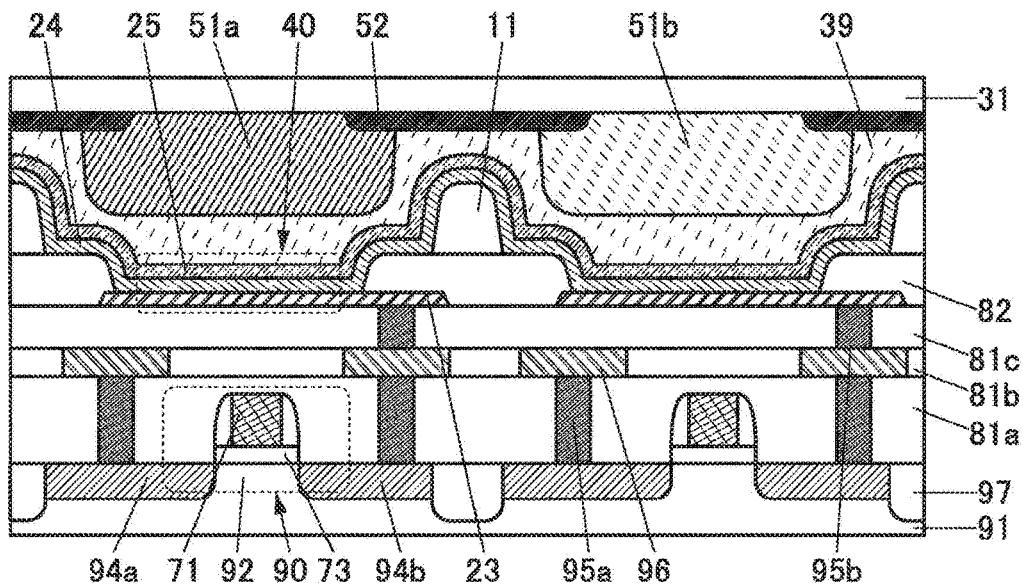

FIG. 5C illustrates an example in which the transistor 70 is replaced with a transistor 90 which includes a semiconductor layer formed in part of a single crystal substrate 91.

The transistor 90 illustrated in FIG. 5C includes a channel region 92, a low-resistance region 94a serving as one of a source and a drain, a low-resistance region 94b serving as the other of the source and the drain, the insulating layer 73 serving as a gate insulating layer, the conductive layer 71 serving as a gate, and the like. The channel region 92 and the low-resistance regions 94a and 94b are formed in the single crystal substrate 91. Furthermore, a separation layer 97 for separating components is provided in the single crystal substrate 91.

Insulating layers 81a, 81b, and 81c are provided to cover the transistor 90. A conductive layer 96 is provided over the insulating layer 81a and connected to the low-resistance region 94a or 94b through a connection layer 95a embedded in the insulating layer 81a. The conductive layer 23 is provided over the insulating layer 81c and connected to the conductive layer 96 through a connection layer 95b embedded in the insulating layer 81c. The conductive layer 96 is formed to be embedded in the insulating layer 81b, and the surfaces thereof are planarized.

Such a structure enables minute pixels to be formed on the single crystal substrate 91, and therefore achieves a display device with extremely high definition.

Cross-Sectional Structure Example 1-8

Figure 6A:
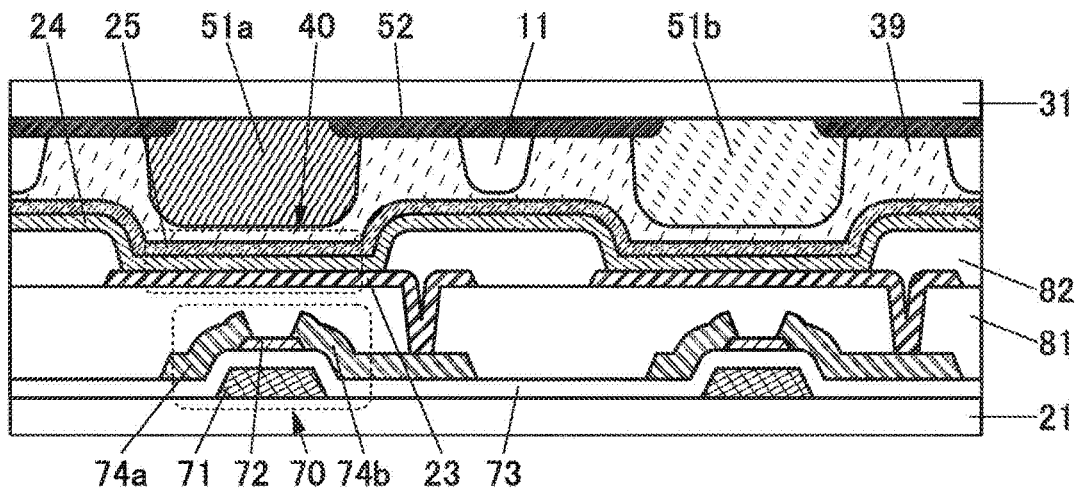
FIGS. 6A to 6C illustrate structure examples of a display device of one embodiment.

FIG. 6A illustrates an example in which the structure body 11 is provided on the substrate 31 side.

The structure body 11 illustrated in FIG. 6A is provided so as to have the bottom surface which is closer to the substrate 31 side than the bottom surfaces of the coloring layers 51a and 51b are.

The coloring layers 51a and 51b are preferably provided on the inner side of the opening in the insulating layer 82, which results in a smaller distance between the coloring layers 51a and 51b and the light-emitting element 40.

The structure body 11 is provided to overlap with the insulating layer 82. The structure body 11 and the conductive layer 25 may be in contact with each other or the adhesive layer 39 may be positioned therebetween.

Cross-Sectional Structure Example 1-9

Figure 6B:
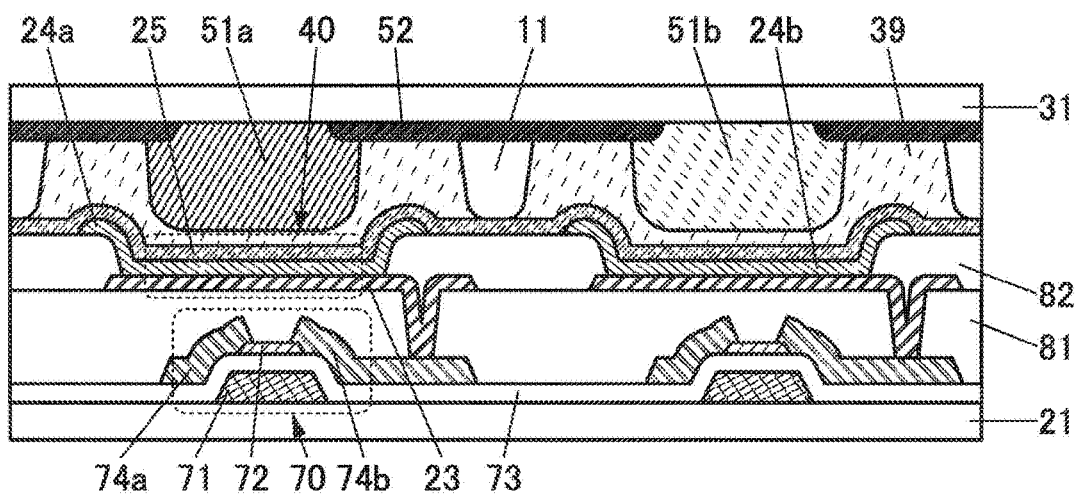

FIG. 6B illustrates an example different from FIG. 6A in that the EL layer 24 is separately formed for each pixel. The EL layer 24a and the EL layer 24b are provided to overlap with the coloring layer 51a and the coloring layer 51b, respectively. The conductive layer 25 is shared with adjacent pixels.

FIG. 6B illustrates an example in which the structure body 11 and the conductive layer 25 are partly in contact with each other in a region overlapping with the insulating layer 82.

Cross-Sectional Structure Example 1-10

Figure 6C:
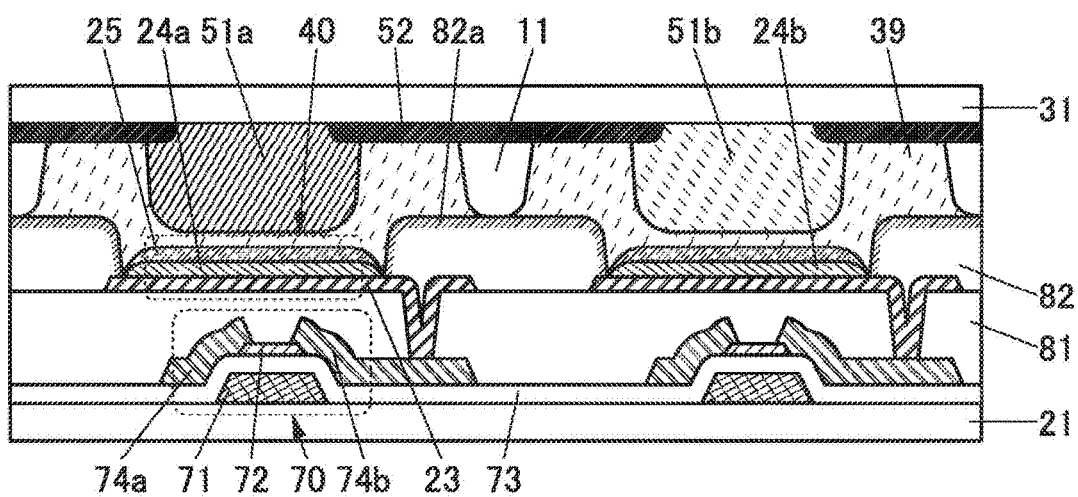

FIG. 6C illustrates an example in which the EL layer 24 and the conductive layer 25 are separately formed for each pixel.

Shown here is an example in which the surface of the insulating layer 82 includes a liquid-repellent portion 82a, and the EL layer 24a, the EL layer 24b, and the conductive layer 25 are positioned on the inner side of the opening in the insulating layer 82

In FIG. 6C, the structure body 11 and the insulating layer 82 are partly in contact with each other.

Cross-Sectional Structure Example 1-11

Figure 7A:
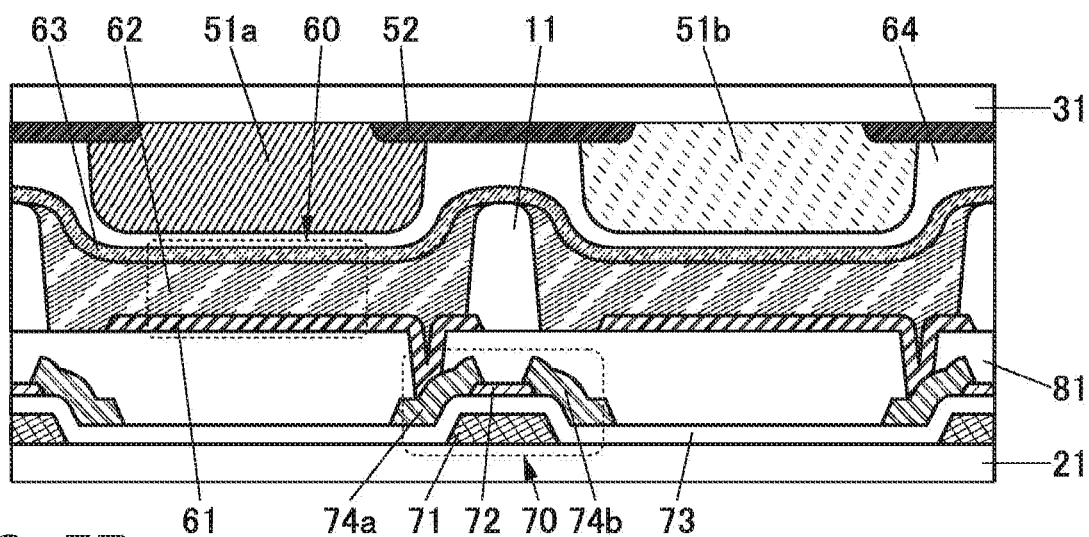
FIGS. 7A and 7B illustrate structure examples of a display device of one embodiment.

FIG. 7A illustrates an example in which a liquid crystal element 60 is used as the display element. The liquid crystal element 60 includes a conductive layer 61, a liquid crystal 62, and a conductive layer 63. The liquid crystal element 60 illustrated in FIG. 7A is a transmissive liquid crystal element using a vertical alignment (VA) mode.

The conductive layer 61 is provided over the insulating layer 81. The conductive layer 61 is electrically connected to the conductive layer 74a of the transistor 70 through the opening in the insulating layer 81.

On the substrate 31 side, an insulating layer 64 is provided to cover the coloring layer 51a, the coloring layer 51b, and the light-blocking layer 52. The insulating layer 64 may have a function of preventing diffusion of impurities, which are contained in the coloring layer 51a or 51b or the light-blocking layer 52, to the liquid crystal 62.

The conductive layer 63 is provided to cover the insulating layer 64. The liquid crystal element 60 has a structure in which the liquid crystal 62 is interposed between the conductive layers 61 and 63.

Preferably, a top surface of the insulating layer 64 is partly positioned on an upper side (closer to the substrate 31 side) than the bottom surface of the coloring layer 51a between the coloring layers 51a and 51b. In other words, the surface of the insulating layer 64 preferably has a depressed portion between the coloring layers 51a and 51b. The structure body 11 on the substrate 21 side fits in the depressed portion of the insulating layer 64. With such a structure, the structure body 11 on the substrate 21 side can be positioned to fit between the two coloring layers adjacent to each other. This can reduce the distance between the substrates 21 and 31 as compared to the case where the insulating layer 64 has a flat surface, thereby improving the viewing angle characteristics.

The structure body 11 serves as a spacer for maintaining a predetermined distance between the substrates 21 and 31. The structure body 11 allows an optimum distance between the conductive layers 61 and 63 to be kept in the liquid crystal element 60.

Although not illustrated here, an alignment film for adjusting the alignment of the liquid crystal 62 may be provided between the conductive layer 61 and the liquid crystal 62 and between the conductive layer 63 and the liquid crystal 62.

The distance between the top surface of the conductive layer 61 and the bottom surface of the coloring layer 51a or the like is equivalent to the distance d3 illustrated in FIG. 3A. The distance may be optimized in accordance with the structure of the liquid crystal element 60; for example, can be greater than or equal to 1 μm and less than or equal to 20 μm, preferably greater than or equal to 1.5 μm and less than or equal to 10 μm, and more preferably greater than or equal to 2 μm and less than or equal to 5 μm.

Cross-Sectional Structure Example 1-12

Figure 7B:
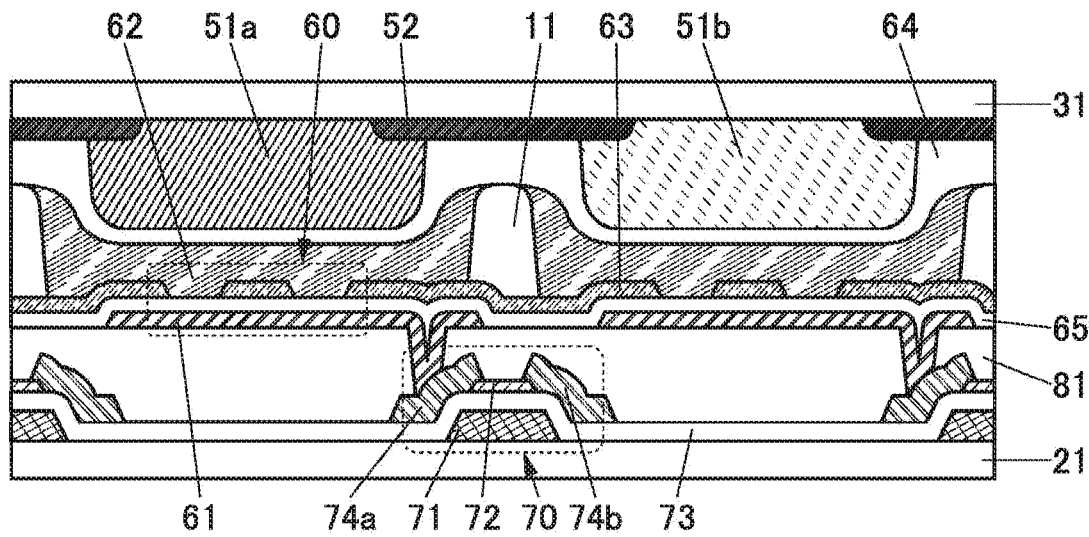

FIG. 7B illustrates an example in which the liquid crystal element 60 using a fringe field switching (FFS) mode is used as the display element. The conductive layers 61 and 63 in the liquid crystal element 60 are provided on the substrate 21 side.

The conductive layer 61 is provided over the insulating layer 81, and the insulating layer 65 is provided to cover the conductive layer 61. The conductive layer 63 is provided over the insulating layer 65. The top surface of the conductive layer 63 has a comb-like shape or a shape with at least one opening (slit).

The conductive layer 61 is electrically connected to the transistor 70 and serves as a pixel electrode. The conductive layer 63 provided over the conductive layer 61 with the insulating layer 65 therebetween serves as a common electrode. Note that the conductive layer 63 may be electrically connected to the conductive layer 74a of the transistor 70 through openings in the insulating layers 65 and 81 so as to serve as a pixel electrode. In that case, the conductive layer 61 can be shared with adjacent pixels and may be used as a common electrode.

When a material transmitting visible light is used for the conductive layer 61 in FIGS. 7A and 7B, a transmissive liquid crystal element can be obtained. A conductive material transmitting visible light is preferably used for both of the conductive layers 61 and 63, because the aperture ratio can be further increased.

In the case where the liquid crystal element 60 is a reflective liquid crystal element, a material reflecting visible light may be used for one or both of the conductive layers 61 and 63. When a material reflecting visible light is used for both of them, the aperture ratio can be increased. Alternatively, a material reflecting visible light may be used for one of the conductive layers 61 and 63 and a material transmitting visible light may be used for the other.

Alternatively, a material reflecting visible light and a material transmitting visible light may be used for the conductive layer 61 and the conductive layer 63, respectively, so that a semi-transmissive liquid crystal element is achieved. In that case, a reflective mode using light reflected by the conductive layer 61 and a transmissive mode using light from a backlight which passes through a slit in the conductive layer 61 can be switched.

Although not illustrated in FIGS. 7A and 7B, a backlight can be provided on the outer side of the substrate 21 or 31. In addition, a polarizing plate can be provided on each outer side of the substrates 21 and 31.

The distance between the top surface of the conductive layer 63 and the bottom surface of the coloring layer 51a or the like is equivalent to the distance d3 illustrated in FIG. 3A. The distance may be optimized in accordance with the structure of the liquid crystal element 60; for example, can be greater than or equal to 1 μm and less than or equal to 20 μm, preferably greater than or equal to 1.5 μm and less than or equal to 10 μm, and more preferably greater than or equal to 2 μm and less than or equal to 5 μm.

Example of Arranging Method of Structure Body

FIGS. 8A to 8F are enlarged views of part of the display portion 32 seen from the display surface side. Shown here is an example in which the light-blocking layer 52 is on the outermost display surface, the coloring layers 51a, 51b, and 51c are provided thereunder, and the conductive layer 23 and the structure body 11 are provided thereunder. The structure body 11, the conductive layer 23, and the like are denoted by dashed lines.

FIGS. 8A to 8D illustrate examples in which the coloring layers 51a, 51b, and 51c and the light-blocking layer 52 are arranged in stripes. The light-blocking layer 52 and each of the coloring layers partly overlap with each other.

Figure 8A:
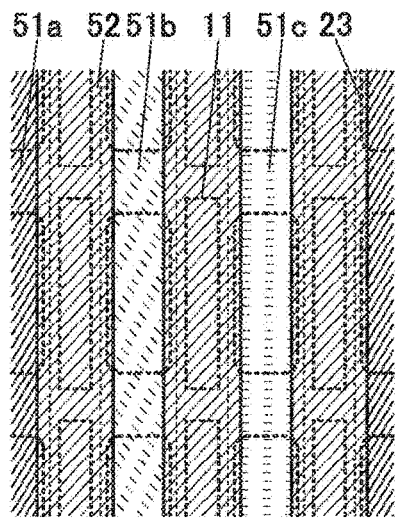
FIGS. 8A to 8F illustrate structure examples of a display device of one embodiment.

FIG. 8A illustrates an example in which the structure body 11 with an island shape is provided between the two conductive layers 23. The structure body 11 overlaps with the light-blocking layer 52.

Figure 8B:
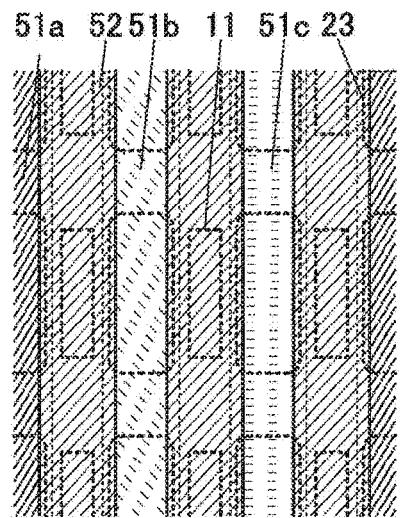
Figure 8C:
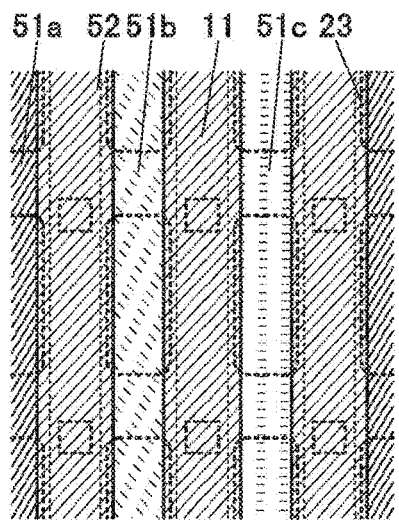
Figure 8D:
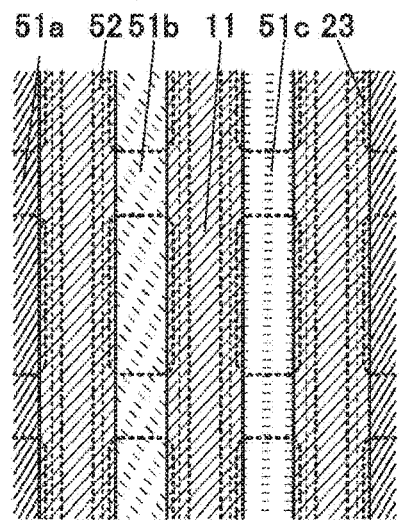

In FIG. 8A, the length of the structure body 11 is longer than that of the conductive layer 23 in the longitudinal direction. In FIG. 8B, the length of the structure body 11 is shorter than that of the conductive layer 23 in the longitudinal direction. In FIG. 8C, the structure body 11 has a dot-like shape. In FIG. 8D, the structure body 11 is arranged in a stripe like the light-blocking layer 52 and the like.

Figure 8E:
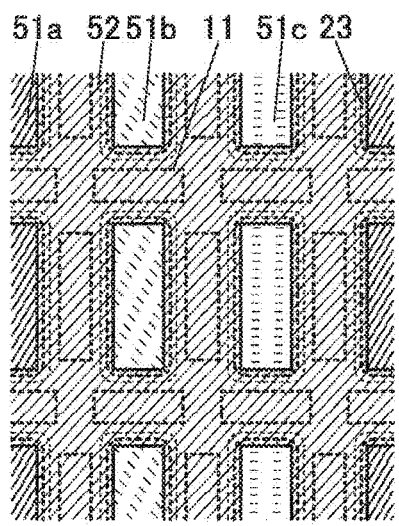
Figure 8F:
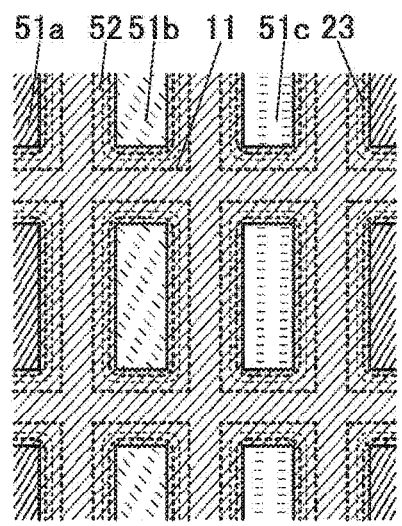

FIGS. 8E and 8F illustrate examples in which the light-blocking layer 52 has a lattice shape. Here, the coloring layers 51a, 51b, and 51c each have an island shape to overlap with the conductive layer 23.

In FIG. 8E, the island-like structure body 11 is provided on each side of the conductive layer 23. In FIG. 8F, the structure body 11 has a lattice shape.

Note that the shape and the arrangement of the structure body 11 are not limited to the above, and the structure body 11 can be provided so as to be interposed between two adjacent coloring layers.

Cross-Sectional Structure Example 2

Hereinafter, the cross-sectional structure example of the display device 10 of one embodiment of the present invention will be described more specifically. In particular, a top-emission light-emitting element is used as the display element.

Cross-Sectional Structure Example 2-1

Figure 9:
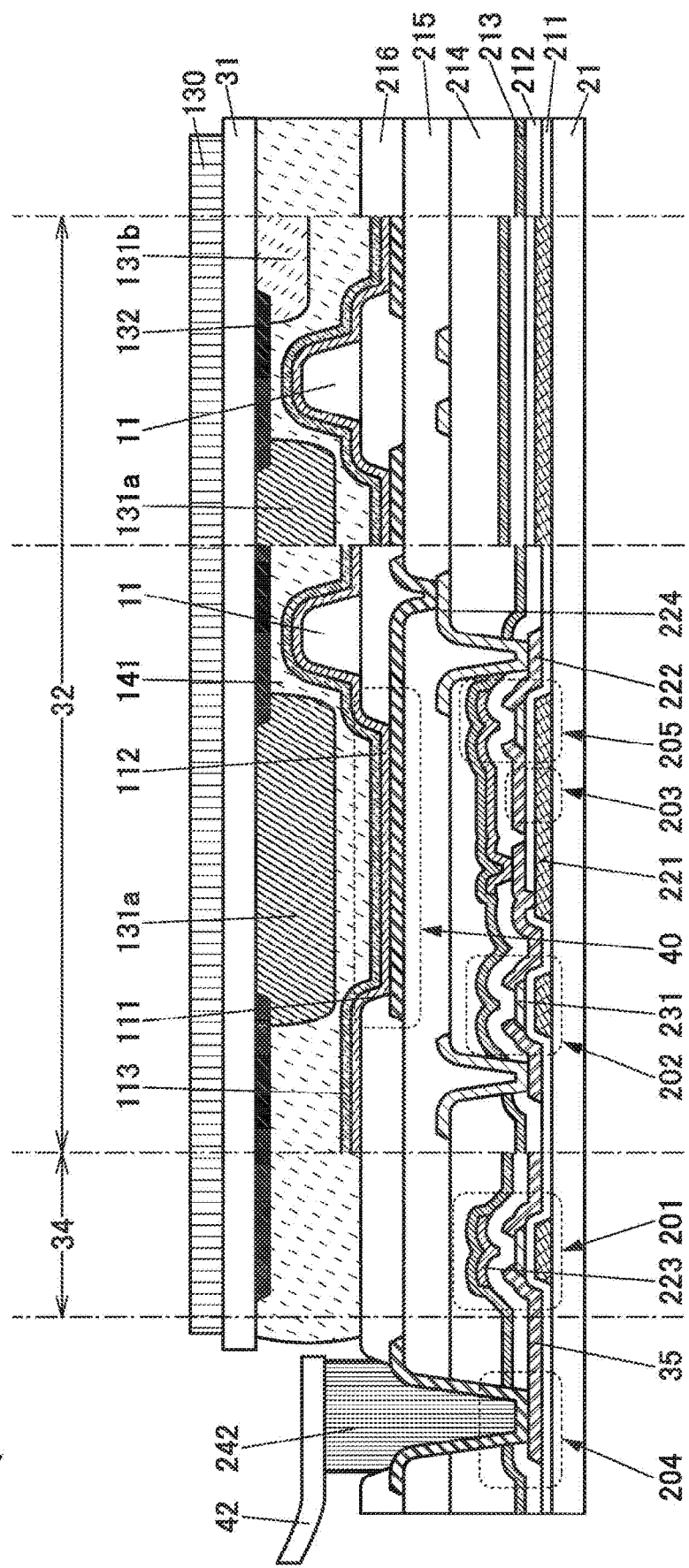
FIG. 9 illustrates a structure example of a display device of one embodiment.

FIG. 9 is a schematic cross-sectional view of the display device 10. FIG. 9 illustrates an example of the cross sections of a region including the FPC 42, a region including the circuit 34, a region including the display portion 32, and the like in FIG. 1A. Furthermore, in FIG. 9, the cross section of a region including a transistor and the like and the cross section of a region between adjacent pixels are shown side-by-side as the display portion 32.

The substrates 21 and 31 are bonded with an adhesive layer 141. Part of the adhesive layer 141 has a function of sealing the light-emitting element 40, The polarizing plate 130 is preferably provided on the outer side of the substrate 31.

The light-emitting element 40, a transistor 201, a transistor 202, a transistor 205, a capacitor 203, a terminal portion 204, the wiring 35, the structure body 11, and the like are provided over the substrate 21. A coloring layer 131a, a coloring layer 131b, a light-blocking layer 132, and the like are provided on the substrate 31 side. The light-emitting element 40 has a stacked structure of a conductive layer 111, an EL layer 112, and a conductive layer 113. Part of the conductive layer 111 serves as a pixel electrode whereas part of the conductive layer 113 serves as a common electrode. The light-emitting element 40 is a top-emission light-emitting element in which light is emitted to the substrate 31 side.

FIG. 9 illustrates a cross section including one sub-pixel as an example of the display portion 32. The sub-pixel includes, for example, the transistor 202, the capacitor 203, the transistor 205, the light-emitting element 40, and the coloring layer 131a. For example, the transistor 202 is a switching transistor (selection transistor), and the transistor 205 is a transistor for controlling current flowing in the light-emitting element 40 (a driving transistor).

In FIG. 9, a cross section including the transistor 201 is illustrated as an example of the circuit 34.

Materials transmitting different colors can be used for the coloring layers 131a, 131b, and the like. For example, when a sub-pixel exhibiting a red color, a sub-pixel exhibiting a green color, and a sub-pixel exhibiting a blue color are arranged, full-color display can be achieved.

Insulating layers such as insulating layers 211 to 216 are provided over the substrate 21. A portion of the insulating layer 211 serves as a gate insulating layer of each transistor, and another portion thereof serves as a dielectric of the capacitor 203. The insulating layers 212, 213, and 214 are provided to cover each transistor, the capacitor 203, and the like. The insulating layer 214 serves as a planarization layer. Shown here is an example in which the three insulating layers 212, 213, and 214 are provided to cover the transistors and the like; however, one embodiment of the present invention is not limited to this example, and four or more insulating layers, a single insulating layer, or two insulating layers may be provided. The insulating layer 214 serving as a planarization layer is not necessarily provided when not needed. The insulating layer 215 is provided to cover a conductive layer 224. The insulating layer 215 may have a function as a planarization layer. The insulating layer 216 is provided to cover an end portion of the conductive layer 111, a contact portion that electrically connects the conductive layers 111 and 224, and the like. The insulating layer 216 has a function as a planarization layer.

The structure body 11 is provided over the insulating layer 216. As illustrated in FIG. 9, part of the structure body 11 is positioned on an upper side than the bottom surface of the coloring layer 131a.

The transistors 201, 202, and 205 each include a conductive layer 221 part of which serves as a gate electrode, a conductive layer 222 part of which serves as a source or a drain electrode, and a semiconductor layer 231. Here, a plurality of layers obtained by processing the same conductive film are shown with the same hatching pattern.

In the example in FIG. 9, the capacitor 203 includes part of the conductive layer 221 serving as a gate electrode of the transistor 205, part of the insulating layer 211, and part of the conductive layer 222 serving as a source or a drain electrode of the transistor 205.

In the transistor 202, one of the pair of conductive layers 222 that is not electrically connected to the capacitor 203 serves as part of a signal line. The conductive layer 221 serving as a gate electrode of the transistor 202 also serves as part of a scan line.

FIG. 9 illustrates an example in which the transistor 202 includes one gate electrode. The transistors 201 and 205 are each a transistor in which the semiconductor layer 231 where a channel is formed is provided between two gate electrodes (the conductive layers 221 and 223). When the transistor has the two gate electrodes, the threshold voltage thereof can be controlled. Alternatively, the two gate electrodes may be connected to each other and supplied with the same signal to operate the transistor. Such a transistor can have a higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a large-sized or higher-resolution display device which has an increased number of wirings.

Note that the transistor included in the circuit 34 and the transistor included in the display portion 32 may have the same structure. A plurality of transistors included in the circuit 34 may have the same structure or different structures. A plurality of transistors included in the display portion 32 may have the same structure or different structures.

A material through which impurities such as water or hydrogen are not easily diffused is preferably used for at least one of the insulating layers 212 and 213 covering the transistors. Such an insulating layer can serve as a barrier film. This structure can effectively prevent the diffusion of impurities into the transistors from the outside, and a highly reliable display device be provided.

The conductive layer 224 over the insulating layer 214 serves as a wiring. The conductive layer 224 is electrically connected to one of a source and a drain of any of the transistors through an opening provided in the insulating layers 214, 213, and 212. Furthermore, the conductive layer 111 serving as a pixel electrode is provided over the insulating layer 215. The conductive layer 111 is electrically connected to any of the conductive layers 224 through an opening provided in the insulating layer 215. In FIG. 9, the conductive layer 111 is electrically connected to one of the source and the drain of the transistor 205 through the conductive layer 224.

The insulating layer 216 is provided to cover an end portion of the conductive layer 111. The EL layer 112 is provided to cover the top surfaces of the conductive layer 111, the insulating layer 216, and the structure body 11. The conductive layer 113 is provided to cover the EL layer 112.

In the light-emitting element 40, a material reflecting visible light is used for the conductive layer 111 and a material transmitting visible light is used for the conductive layer 113. With such a structure, a top-emission light-emitting element in which light is emitted to the substrate 31 side can be provided. Components such as the transistors and capacitors can be positioned under the top-emission light-emitting element, leading to improved aperture ratio. Note that a material transmitting visible light may be used for both of the conductive layers 111 and 113, in which case a dual-emission light-emitting element emitting light to both of the substrate 31 side and the substrate 21 side is obtained.

A light-emitting element exhibiting a white color can be preferably used as the light-emitting element 40. Thus, the light-emitting elements 40 do not need to be separately fabricated in sub-pixels corresponding to different colors; accordingly, a display device with an extremely high definition can be provided. In that case, when light from the light-emitting element 40 passes through the coloring layer 131a or the like, light out of a specific wavelength range is absorbed by the coloring layer 131a or the like. Consequently, red light is extracted, for example.

Alternatively, the light-emitting element 40 may have a microcavity structure by using a material reflecting visible light for the conductive layer 111, using a semi-transmissive or semi-reflective material for the conductive layer 113, and providing an optical adjustment layer transmitting visible light between the conductive layers 111 and 113. In that case, the optical adjustment layer preferably has a different thickness in each sub-pixel corresponding to a different color. A sub-pixel including the optical adjustment layer may be provided in combination with a sub-pixel including no optical adjustment layer.

The light-blocking layer 132 is provided on the surface of the substrate 31 that faces the substrate 21. The coloring layers 131a and 131b are provided to cover end portions of the light-blocking layer 132 and an opening in the light-blocking layer 132. The coloring layer 131a and the like each overlap with the light-emitting element 40. Part of the light-blocking layer 132 overlaps with the structure body 11.

The structure body 11 can be formed using an insulating or conductive material. For example, the structure body 11 may be formed using an insulating material similar to that for the insulating layer 216. In the case where a conductive material is used for the structure body 11, the structure body 11 is brought into an electrically floating state or supplied with the same potential as the conductive layer 113, so that the EL layer 112 over the structure body 11 can be prevented from emitting light.

FIG. 9 illustrates an example in which a polarizing plate 130 is provided on the surface of the substrate 31 that is opposite to the surface facing the substrate 21. As the polarizing plate 130, a circularly polarizing plate is preferably used. As the circularly polarizing plate, for example, a stack including a linear polarizing plate and a quarter-wave retardation plate can be used. This results in suppression of external light reflection on a reflective member (e.g., the conductive layer 111) provided in the display portion 32.

FIG. 9 illustrates an example in which the light-emitting element 40 is sealed with the adhesive layer 141. When the adhesive layer 141 is formed using a material with a higher refractive index than air, the efficiency of extraction of light emitted from the light-emitting element 40 can be increased as compared to the case where a space is made between the light-emitting element 40 and the substrate 31.

Note that the adhesive layer 141 may be arranged on the outer edge of the display portion 32, i.e., a so-called sealed hollow structure may be employed. In that case, a space formed by the substrates 21 and 31 and the adhesive layer 141 may be filled with air; preferably, filled with an inert gas such as a rare gas or a nitrogen gas. When the space in a steady state is under reduced pressure relative to the atmospheric pressure, the following phenomenon can be prevented: the space expands depending on the usage environment (e.g., pressure or temperature) and thus the substrate 31 or the substrate 21 expands. Meanwhile, when the space is under positive pressure relative to the atmospheric pressure, impurities such as moisture can be prevented from being diffused from the substrate 31, the substrate 21, the adhesive layer 141, or a gap therebetween into the space.

The terminal portion 204 is provided in a region near an end portion of the substrate 21. The terminal portion 204 is electrically connected to the FPC 42 through a connection layer 242. In the structure in FIG. 9, the terminal portion 204 is formed by stacking part of the wiring 35 and the conductive layer 111.

The above is the description of Cross-sectional structure example 2-1.

Cross-Sectional Structure Example 2-2

Figure 10:
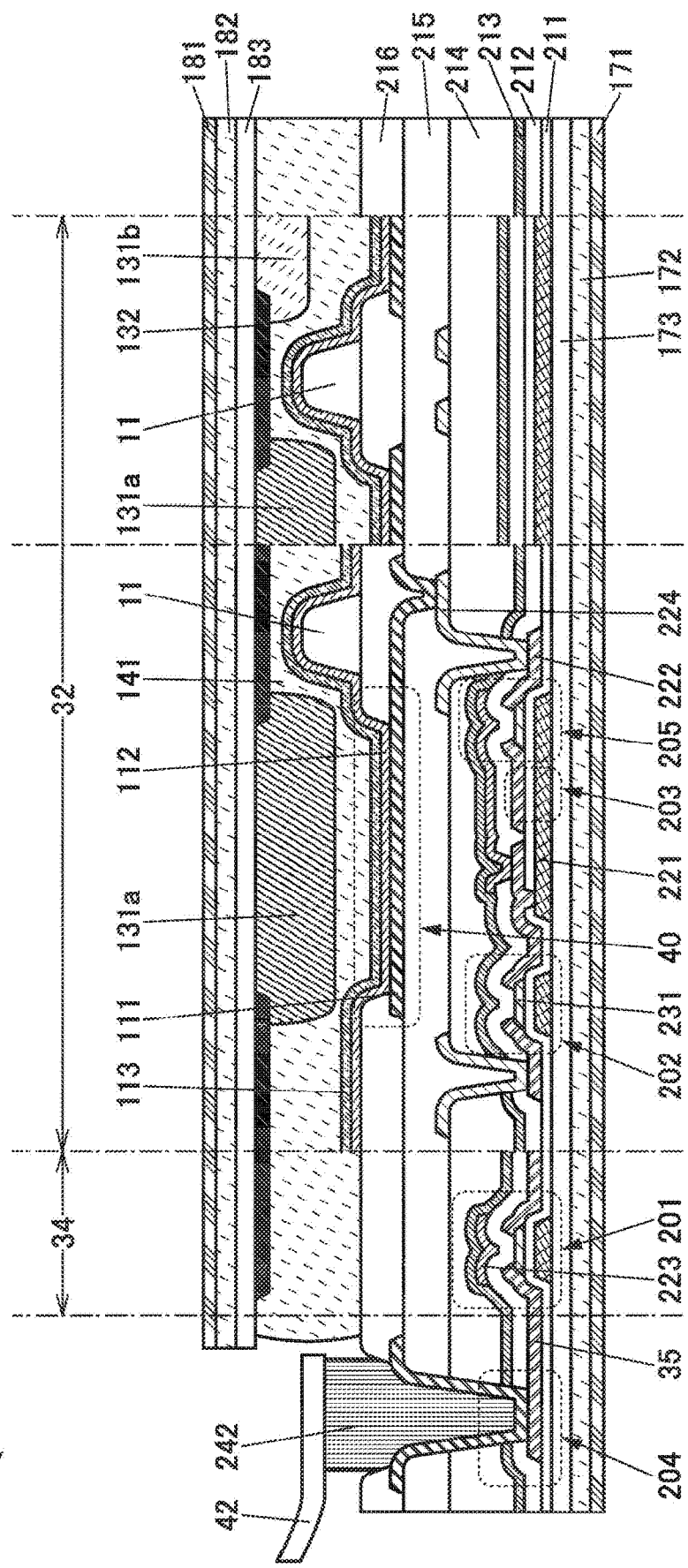
FIG. 10 illustrates a structure example of a display device of one embodiment.

FIG. 10 illustrates a cross-sectional structure example of the display device 10 in which a substrate 171 and a substrate 181 having flexibility are used as a pair of substrates. Part of a display surface of the display device 10 in FIG. 10 is bendable.

In the display device 10 illustrated in FIG. 10, the substrate 171, an adhesive layer 172, and an insulating layer 173 are provided instead of the substrate 21 in FIG. 9. Furthermore, the substrate 181, an adhesive layer 182, and an insulating layer 183 are provided instead of the substrate 31.

The insulating layers 173 and 183 are preferably formed using a material through which impurities such as water are not easily diffused.

The display device 10 in FIG. 10 has a structure in which each transistor and the light-emitting element 40 are sandwiched between the insulating layers 173 and 183. Thus, even in the case where the substrate 171, the substrate 181, the adhesive layer 172, the adhesive layer 182, or the like is formed using a material through which impurities such as water or hydrogen are easily diffused, the insulating layers 173 and 183 positioned further inward (closer to each transistor or the light-emitting element 40) than these components can suppress impurity diffusion, so that reliability can be increased. In addition, a variety of materials can be used because there is no need to consider the diffusion properties of impurities in the selection of materials for the substrates 171 and 181, the adhesive layers 172 and 182, and the like.

Example of Manufacturing Method

Here, a method for manufacturing a flexible display device is described.

For convenience, a layered structure including a pixel and a circuit, a layered structure including an optical member such as a coloring layer (color filter), a layered structure including an electrode or a wiring of a touch sensor, or the like is referred to as an element layer. The element layer includes, for example, a display element, and may additionally include a wiring electrically connected to the display element or an element such as a transistor used in a pixel or a circuit.

Here, a substrate refers to a member that supports an element layer in the end and has flexibility (e.g., the substrate 171 or the substrate 181 in FIG. 10). For example, an extremely thin (10 nm to 200 μm) film is also referred to a substrate.

As a method for forming an element layer over a flexible substrate provided with an insulating surface, the following two methods can be typically used: a method in which an element layer is formed directly over a substrate; and a method in which an element layer is formed over a support substrate that is different from the substrate and then the element layer is separated from the support substrate and transferred to the substrate.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to a supporting base material, in which case transfer thereof in an apparatus and between apparatuses can be easy.

In the case of employing the method in which the element layer is formed over the supporting base material and then transferred to the substrate, first, a separation layer and an insulating layer are stacked over the supporting base material, and then the element layer is formed over the insulating layer. Next, the element layer is separated from the supporting base material and then transferred to the substrate. At this time, selected is a material with which separation at an interface between the supporting base material and the separation layer, at an interface between the separation layer and the insulating layer, or in the separation layer occurs. In this method, a high heat-resistant material is preferably used for the supporting base material and the separation layer, because the upper temperature limit in manufacturing the element layer can be increased to improve reliability.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating layer over the separation layer. Note that in this specification, oxynitride contains more oxygen than nitrogen, and nitride oxide contains more nitrogen than oxygen.

The element layer and the supporting base material can be separated by applying mechanical power, by etching the separation layer, by injecting a liquid into the separation interface, or the like. Alternatively, separation may be performed by heating or cooling two layers of the separation interface by utilizing a difference in thermal expansion coefficient.

The separation layer is not necessarily provided in the case where separation can occur at an interface between the supporting base material and the insulating layer.

For example, glass and an organic resin such as polyimide can be used as the supporting base material and the insulating layer, respectively. In that case, a separation trigger may be formed by, for example, locally heating part of the organic resin with laser light or the like, or by physically cutting part of or making a hole through the organic resin with a sharp tool, so that separation may be performed at an interface between the glass and the organic resin.

Alternatively, a heat-generation layer may be provided between the supporting base material and the insulating layer formed of an organic resin, and separation may be performed at the interface between the heat-generation layer and the insulating layer by heating the heat-generation layer. The heat-generation layer can be formed using a variety of materials such as a material that generates heat when current flows therethrough, a material that generates heat when absorbs light, or a material that generates heat when applied with a magnetic field. For example, a semiconductor, a metal, or an insulator can be selected for the heat-generation layer.

In the aforementioned methods, the insulating layer formed of an organic resin can be used as a substrate after the separation.

In the structure illustrated in FIG. 10, for example, a first separation layer and the insulating layer 173 are formed in this order over a first supporting base material, and then components in a layer thereover are formed. Separately, a second separation layer and the insulating layer 183 are formed in this order over a second supporting base material, and then components in a layer thereover are formed. Next, the first supporting base material and the second supporting base material are attached to each other with the adhesive layer 141. After that, separation at an interface between the second separation layer and the insulating layer 183 is conducted so that the second supporting base material and the second separation layer are removed, and then the insulating layer 183 is attached to the substrate 181 with the adhesive layer 182. Further, separation at an interface between the first separation layer and the insulating layer 173 is conducted so that the first supporting base material and the first separation layer are removed, and then the substrate 171 is attached to the insulating layer 173 with the adhesive layer 172. Note that either side may be subjected to separation and attachment first.

The above is the description of a manufacturing method of a flexible display device.

[Components]

The above components will be described below.

A material having a flat surface can be used as the substrate included in the display device. The substrate on the side from which light from the display element is extracted is formed using a material transmitting the light. For example, a material such as glass, quartz, ceramics, sapphire, or an organic resin can be used.

The weight and thickness of the display device can be reduced by using a thin substrate. A flexible display device can be obtained by using a substrate that is thin enough to have flexibility.

Since the substrate through which light emission is not extracted does not need to have a light-transmitting property, a metal substrate or the like can be used in addition to the above-mentioned substrates. A metal material, which has high thermal conductivity, is preferable because it can easily conduct heat to the whole substrate and accordingly can prevent a local temperature rise in the display device. To obtain flexibility and bendability, the thickness of a metal substrate is preferably greater than or equal to 10 µm and less than or equal to 200 µm, more preferably greater than or equal to 20 µm and less than or equal to 50 µm.

Although there is no particular limitation on a material of a metal substrate, it is favorable to use, for example, a metal such as aluminum, copper, or nickel, an aluminum alloy, or an alloy such as stainless steel.

It is also possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere, an anodic oxidation method, or the like.

Examples of the material that has flexibility and transmits visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display device using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded with an adhesive layer may be used.

A hard coat layer (e.g., a silicon nitride layer or an aluminum oxide layer) by which a touch panel surface is protected from damage, a layer (e.g., an aramid resin layer) that can disperse pressure, or the like may be stacked over the flexible substrate. Furthermore, to suppress a decrease in the lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. Particularly when a glass layer is used, a barrier property against water and oxygen can be improved and thus a highly reliable display device can be provided.

[Transistor]

The transistor includes a conductive layer serving as the gate electrode, the semiconductor layer, a conductive layer serving as the source electrode, a conductive layer serving as the drain electrode, and an insulating layer serving as the gate insulating layer. In the above, a bottom-gate transistor is used.

Note that there is no particular limitation on the structure of the transistor included in the touch panel of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

As a semiconductor material used for the transistor, for example, an element of Group 14 (e.g., silicon or germanium), a compound semiconductor, or an oxide semiconductor can be used. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because the off-state leakage current of the transistor can be reduced.

For the semiconductor layer, it is particularly preferable to use an oxide semiconductor including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be preferably used for a flexible touch panel which is used in a bent state, or the like.

Moreover, the use of such an oxide semiconductor with crystallinity for the semiconductor layer makes it possible to provide a highly reliable transistor with a small change in electrical characteristics.

A transistor with an oxide semiconductor whose band gap is larger than the band gap of silicon has a low off-state current and therefore can hold charges stored in a capacitor that is series-connected to the transistor for a long time. When such a transistor is used for a pixel, operation of a driver circuit can be stopped while a gray scale of each pixel is maintained. As a result, a display device with extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to indium, zinc, and M.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might vary the metal compositions.

The energy gap of the oxide semiconductor included in the semiconductor layer is 2 eV or more, preferably 2.5 eV or more, and more preferably 3 eV or more. With the use of the oxide semiconductor having such a wide energy gap, the off-state current of the transistor can be reduced.

In the case where the oxide semiconductor included in the semiconductor layer is an In—M—Zn oxide, it is preferable that the atomic ratio of metal elements of a sputtering target used for forming a film of the In—M—Zn oxide satisfy In≥M and Zn≥M. As the atomic ratio of metal elements of such a sputtering target, In:M:Zn=1:1:1, In:Al:Zn=1:1:1.2, In:M:Zn=3:1:2, In:M:Zn=4:2:4.1, and the like are preferable. Note that the atomic ratio of metal elements in the formed semiconductor layer varies from the above atomic ratio of metal elements of the sputtering target within a range of ±40% as an error.

An oxide semiconductor film with a low carrier density is used as the semiconductor layer. For example, the semiconductor layer is an oxide semiconductor film whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor included in the semiconductor layer, the semiconductor layer includes an increased number of oxygen vacancies, and thus becomes n-type. Hence, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$;

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the oxide semiconductor included in the semiconductor layer, electrons serving as carriers are generated and the carrier density increases, so that the semiconductor layer easily becomes n-type. Thus, a transistor including an oxide semiconductor which contains nitrogen is likely to be normally on. Hence, the concentration of nitrogen which is measured by secondary ion mass spectrometry is preferably set to lower than or equal to $5\times10^{18}$ atoms/cm$^3$.

The semiconductor layer may have a non-single-crystal structure, for example. The non-single-crystal structure includes, for example, CAAC-OS (c-axis aligned crystalline oxide semiconductor, or c-axis aligned and a-b-plane-anchored crystalline oxide semiconductor), a polycrystalline structure, a microcrystalline structure, or an amorphous structure. Among the non-single-crystal structures, an amorphous structure has the highest density of defect states, whereas CAAC-OS has the lowest density of defect states.

An oxide semiconductor film having an amorphous structure has, for example, disordered atomic arrangement and no crystalline component. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a stacked-layer structure including two or more of the above regions in some cases.

<Composition of CAC-OS>

Described below is the composition of a cloud aligned complementary oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ and In$_{X2}$Zn$_{Y2}$O$_{Z2}$ forming the mosaic pattern are evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1-x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure.

Note that the CAAC structure is a crystal structure in which a plurality of IGZO nanocystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 30:
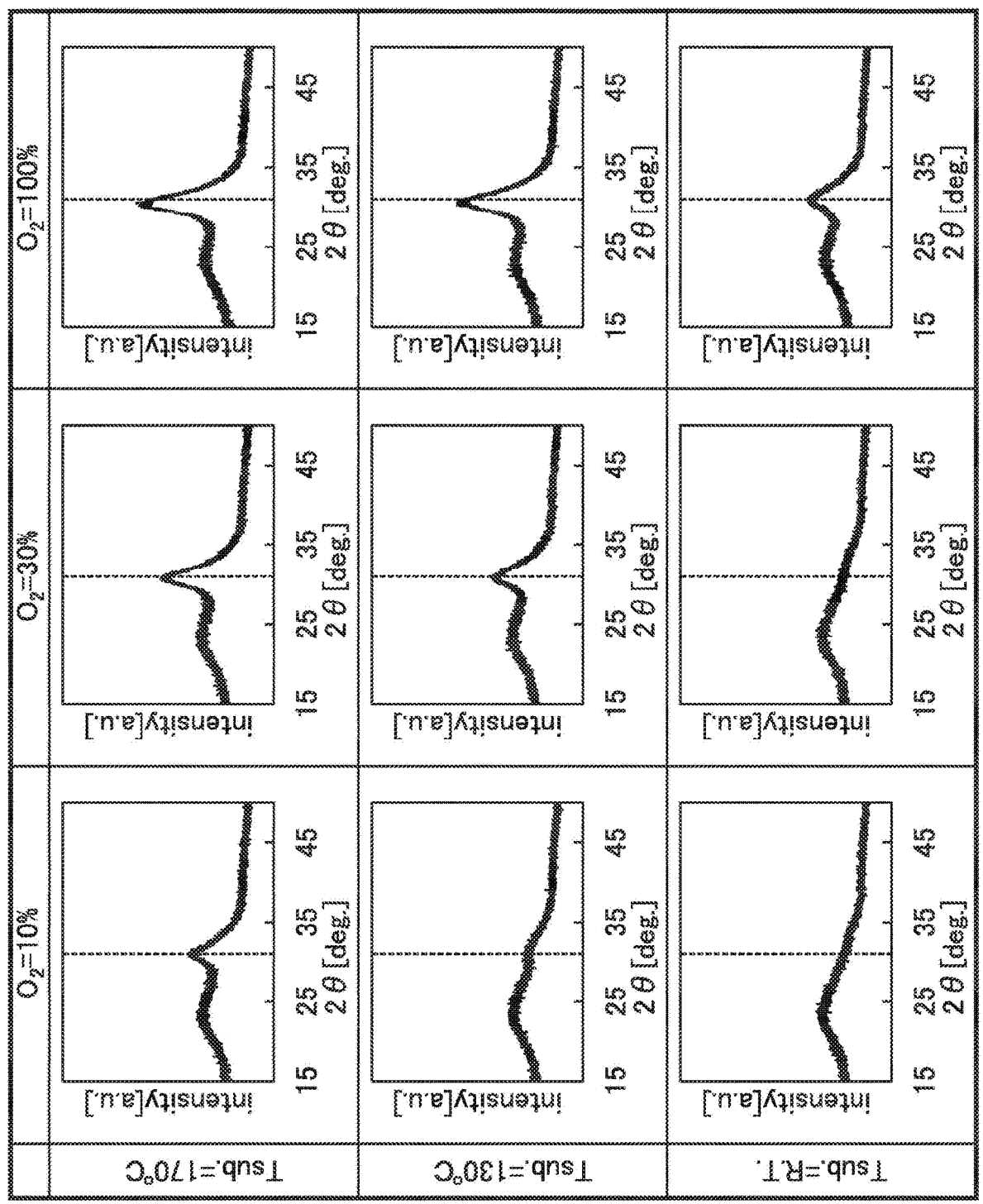
FIG. 30 shows measured XRD spectra of samples.

FIG. 30 shows XRD spectra measured by an out-of-plane method. In FIG. 30, the top row shows the measurement results of the samples formed at a substrate temperature of 170° C.; the middle row shows the measurement results of the samples formed at a substrate temperature of 130° C.; and the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; and the right column shows the measurement results of the samples formed with an oxygen gas flow rate ratio of 100%.

In the XRD spectra shown in FIG. 30, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 30, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis With Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 31A is a plan-view TEM image of the sample formed at a substrate temperature of R.T. and with an oxygen gas flow rate ratio of 10%. FIG. 31B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 31A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 31C, 31D, 31E, 31F, and 31G show the results of the points indicated by the black dots a1, a2, a3, a4, and a5, respectively.

In FIGS. 31C, 31D, 31E, 31F, and 31G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 31B of the sample formed at a substrate temperature of R.T. and an oxygen gas flow rate ratio of 10% are observed. FIGS. 31H, 31I, 31J, 31K, and 31L show the results of the points indicated by the black dots b11, b2, b3, b4, and b5, respectively.

In FIGS. 31H, 31I, 31J, 31K, and 31L, regions with high luminance in a ring pattern can be shown. Furthermore, a plurality of spots can be shown in a ring-like shape.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 32A:
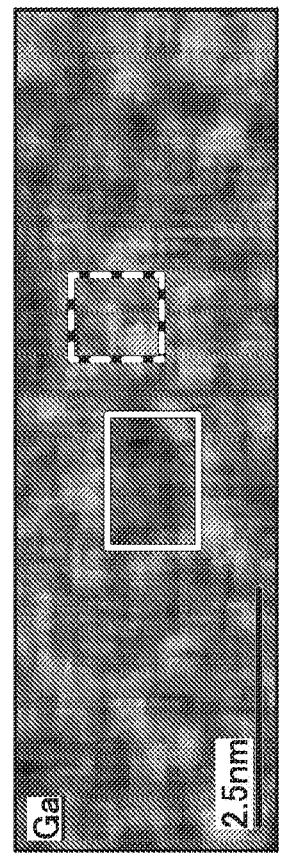
FIGS. 32A to 32C show EDX mapping images of a sample.
Figure 32B:
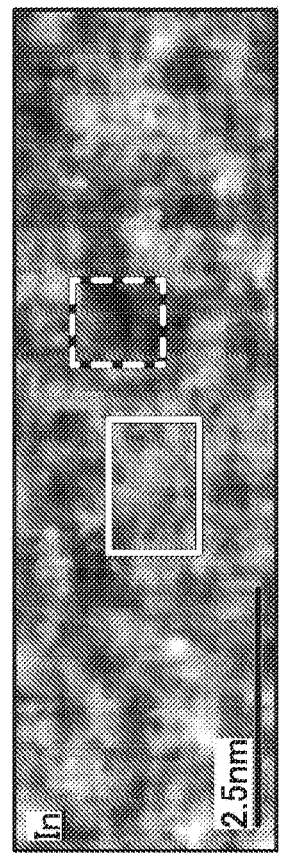
Figure 32C:
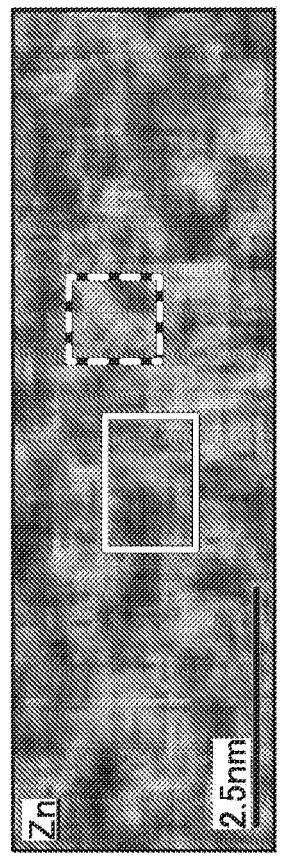

FIGS. 32A to 32C show EDX mapping images in a cross section of the sample formed at a substrate temperature of R.T. and with an oxygen gas flow rate ratio of 10%. FIG. 32A shows an EDX mapping image of Ga atoms. The proportion of the Ga atoms in all the atoms is 1.18 atomic % to 18.64 atomic %. FIG. 32B shows an EDX mapping image of In atoms. The proportion of the In atoms in all the atoms is 9.28 atomic % to 33.74 atomic %. FIG. 32C shows an EDX mapping image of Zn atoms. The proportion of the Zn atoms in all the atoms is 6.69 atomic % to 24.99 atomic %. FIGS. 32A to 32C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 32A to 32C is 7200000 times.

The EDX mapping images in FIGS. 32A to 32C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 32A to 32C are examined.

In FIG. 32A, a relatively dark region occupies a large area in the area surrounded by the solid line, while a relatively bright region occupies a large area in the area surrounded by the dashed line. In FIG. 32B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 32C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 32C, the upper left portion of the area surrounded by the dashed line is relatively bright and the lower right portion thereof is relatively dark. Thus, the area surrounded by the dashed line is a region including $GaO_{X3}$, $Ga_{Y4}Zn_{Y4}O_{Z4}$, and the like as main components.

Furthermore, as shown in FIGS. 32A to 32C, the In atoms are relatively more uniformly distributed than the Ga atoms, and regions including $InO_{X1}$ as a main component is seemingly joined to each other through a region including $In_{x2}Zn_{y2}O_{z2}$ as a main component. Thus, the regions including $In_{x2}Zn_{y2}O_{z2}$ and $InO_{x1}$ as main components extend like a cloud.

An In—Ga—Zn oxide having a composition in which the regions including $GaO_{x3}$ or the like as a main component and the regions including $In_{x2}Zn_{y2}O_{z2}$ or $InO_{x1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 32A to 32C, each of the regions including $GaO_{x3}$ or the like as a main component and the regions including $In_{x2}Zn_{y2}O_{z2}$ or $InO_{x1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{x3}$ or the like as a main component and regions including $In_{x2}Zn_{y2}O_{z2}$ or $InO_{x1}$ as a main component are separated to form a mosaic pattern.

The conductivity of a region including $In_{x2}Zn_{y2}O_{z2}$ or $InO_{x1}$ as a main component is higher than that of a region including $GaO_{x3}$ or the like as a main component. In other words, when carriers flow through regions including $In_{x2}Zn_{y2}O_{z2}$ or $InO_{x1}$ as a main component, the conductivity of an oxide semiconductor exhibits. Accordingly, when regions including $In_{x2}Zn_{y2}O_{z2}$ or $InO_{x1}$ as a main component are distributed in an oxide semiconductor like a cloud, high field-effect mobility ($\mu$) can be achieved.

In contrast, the insulating property of a region including $GaO_{x3}$ or the like as a main component is higher than that of a region including $In_{x2}Zn_{y2}O_{z2}$ or $InO_{x1}$ as a main component. In other words, when regions including $GaO_{x3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{x3}$ or the like and the conductivity derived from $In_{x2}Zn_{y2}O_{z2}$ or $InO_{x1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices typified by a display.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single crystal silicon, or the like is particularly preferable.

[Conductive Layer]

As materials for a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element, preventing a decrease in the reliability of the device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], and still further preferably lower than or equal to $1\times10^{-8}$ [g/(m$^2$·day)].

[Light-Emitting Element]

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be included. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stacked film of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium, or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may each be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

The liquid crystal element controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

The liquid crystal element may be a transmissive liquid crystal element, a reflective liquid crystal element, a semi-transmissive liquid crystal element, or the like.

In the case where a transmissive or semi-transmissive liquid crystal element is used, two polarizing plates are provided such that a pair of substrates are sandwiched therebetween. Furthermore, a backlight is provided on the outer side of the polarizing plate. The backlight may be a direct-below backlight or an edge-light backlight. The direct-below backlight including a light-emitting diode (LED) is preferably used because local dimming is easily performed to improve contrast. The edge-light type backlight is preferably used because the thickness of a touch panel module including the backlight can be reduced.

In the case where a reflective liquid crystal element is used, a polarizing plate is provided on a display surface. In addition, a light diffusion plate is preferably provided on the display surface to improve visibility.

[Adhesive Layer]

As the adhesive layer, a variety of curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs water by chemical adsorption, such as oxide of an alkaline earth metal (e.g., calcium oxide or barium oxide), can be used. Alternatively, a substance that adsorbs water by physical adsorption, such as zeolite or silica gel, may be used. The drying agent is preferably included because it can prevent impurities such as water from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, a metal, a metal oxide, and a composite oxide containing a solid solution of a plurality of metal oxides. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of each of the components.

Structure Example 2

As examples of the display device of one embodiment of the present invention, structure examples of an input/output device (touch panel), an input device (touch sensor), and the like will be described below.

Note that in this specification and the like, a display panel as one embodiment of the display device has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

In this specification and the like, a touch sensor has a function of sensing contact or approach of an object such as a finger or a stylus; hence, the touch sensor is one embodiment of an input device.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel which is one embodiment of the display device has a function of displaying (outputting) an image or the like on (to) a display surface and a function as a touch sensor capable of sensing contact or approach of an object such as a finger or a stylus on or to the display surface. Therefore, the touch panel is one embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel.

In this specification and the like, a structure in which a connector such as an FPC or a TCP is attached to a substrate of a touch panel, or a structure in which an IC is mounted on a substrate by a COG method or the like is referred to as a touch panel module or a display module, or simply referred to as a touch panel or the like in some cases.

Structure Example of Touch Sensor

A structure example of the input device (touch sensor) will be described below with reference to drawings.

Figure 11A:
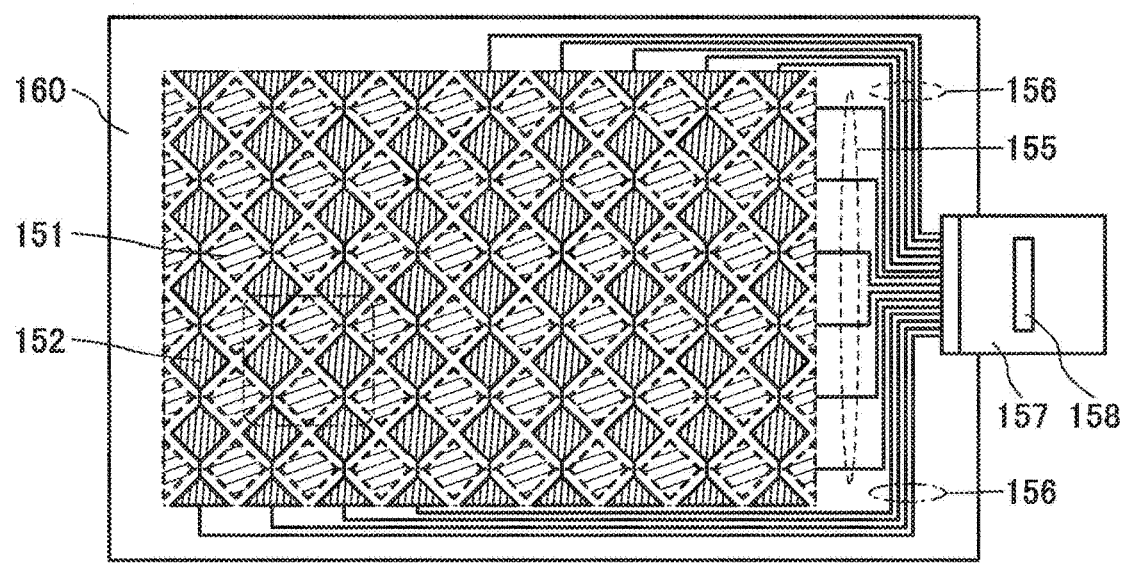
FIGS. 11A to 11D illustrate structure examples of an input device of one embodiment.

FIG. 11A is a schematic top view of an input device 150. The input device 150 includes a plurality of electrodes 151, a plurality of electrodes 152, a plurality of wirings 155, and a plurality of wirings 156 over a substrate 160. The substrate 160 is provided with a flexible printed circuit (FPC) 157 which is electrically connected to each of the plurality of electrodes 151 and the plurality of electrodes 152. FIG. 11A illustrates an example in which the FPC 157 is provided with an IC 158.

Figure 11B:
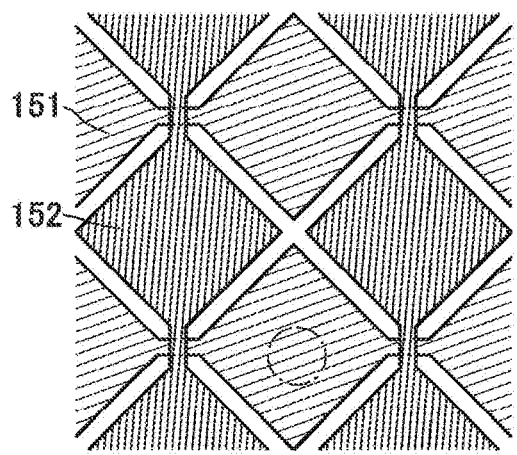

FIG. 11B is an enlarged view of a region surrounded by a dashed dotted line in FIG. 11A. The electrodes 151 are each in the form of a row of rhombic electrode patterns arranged in a lateral direction of this figure. The rhombic electrode patterns aligned in a line are electrically connected to each other. The electrodes 152 are also each in the form of a row of rhombic electrode patterns arranged in a longitudinal direction of this figure, and the rhombic electrode patterns aligned in a line are electrically connected to each other. Part of the electrode 151 and part of the electrode 152 overlap and intersect with each other. At this intersection portion, an insulator is sandwiched in order to avoid an electrical short-circuit between the electrode 151 and the electrode 152.

Figure 11C:
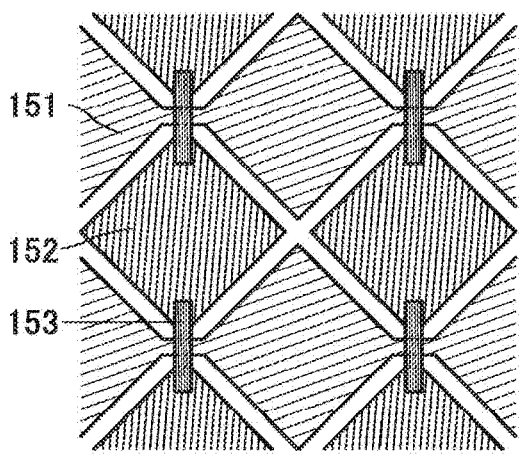

As illustrated in FIG. 11C, the rhombic electrodes 152 may be connected with bridge electrodes 153. The island-shape electrodes 152 are arranged in the longitudinal direction of the figure, and two adjacent electrodes 152 are electrically connected to each other by the bridge electrode 153. Such a structure allows the electrodes 151 and the electrodes 152 to be formed at the same time by processing the same conductive film. This can prevent variations in the thickness of these electrodes, and can prevent the resistance value and the light transmittance of each electrode from varying from place to place. Note that instead of the electrodes 152, the electrodes 151 may include the bridge electrodes 153.

Figure 11D:
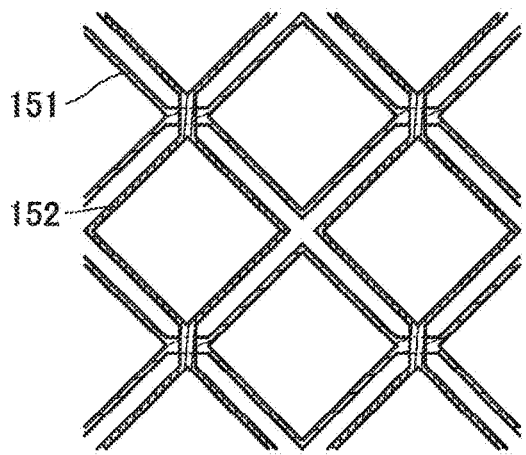

As illustrated in FIG. 11D, a design in which rhombic electrode patterns of the electrodes 151 and 152 illustrated in FIG. 11B are hollowed out and only edge portions are left may be used. At that time, when the electrodes 151 and 152 are narrow enough to be invisible to the users, the electrodes 151 and 152 can be formed using a light-blocking material such as a metal or an alloy, as will be described later. In addition, either the electrodes 151 or the electrodes 152 illustrated in FIG. 11D may include the above bridge electrodes 153.

One of the electrodes 151 is electrically connected to one of the wirings 155. One of the electrodes 152 is electrically connected to one of the wirings 156. Here, either one of the electrodes 151 and 152 corresponds to a row wiring, and the other corresponds to a column wiring.

The IC 158 has a function of driving the touch sensor. A signal output from the IC 158 is supplied to either of the electrodes 151 and 152 through the wirings 155 or 156. A current (or a potential) flowing to either of the electrodes 151 and 152 is input to the IC 158 through the wirings 155 or 156.

When a touch panel is formed in such a manner that the input device 150 is stacked over a display screen of the display panel, a light-transmitting conductive material is preferably used for the electrodes 151 and 152. In the case where a light-transmitting conductive material is used for the electrodes 151 and 152 and light from the display panel is extracted through the electrodes 151 or 152, it is preferable that a conductive film containing the same conductive material be arranged between the electrodes 151 and 152 as a dummy pattern. When part of a space between the electrodes 151 and 152 is thus filled with the dummy pattern, variation in light transmittance can be reduced. As a result, unevenness in luminance of light transmitted through the input device 150 can be reduced.

As the light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

Alternatively, a metal film or an alloy film which is thin enough to have a light-transmitting property can be used. For example, a metal such as gold, silver, platinum, magnesium, nickel, tungsten, chromium, molybdenum, iron, cobalt, copper, palladium, or titanium, or an alloy containing any of these metals can be used. Alternatively, a nitride of the metal or the alloy (e.g., titanium nitride), or the like may be used. Alternatively, a stacked film in which two or more of conductive films containing the above materials are stacked may be used.

For the electrodes 151 and 152, a conductive film that is processed to be thin enough to be invisible to the users may be used. Such a conductive film is processed into a lattice shape (a mesh shape), for example, which makes it possible to achieve both high conductivity and high visibility of the display device. It is preferable that the conductive film have a portion in which the width is greater than or equal to 30 nm and less than or equal to 100 μm, preferably greater than or equal to 50 nm and less than or equal to 50 μm, and further preferably greater than or equal to 50 nm and less than or equal to 20 μm. In particular, the conductive film preferably has a pattern width of 10 μm or less because it is hardly visible to the users.

Figure 12A:
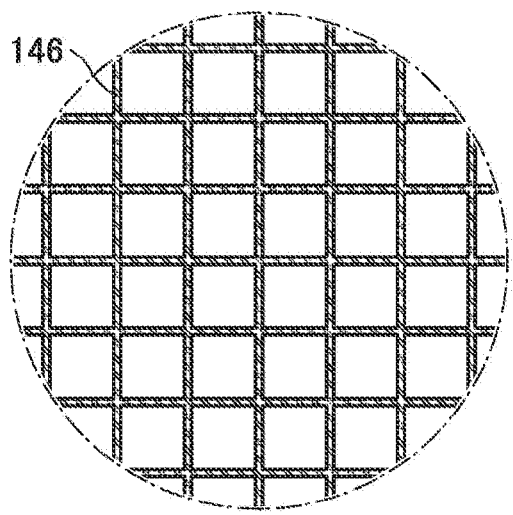
FIGS. 12A to 12D illustrate structure examples of an input device of one embodiment.

As examples, enlarged schematic views of part of the electrodes 151 or 152 are illustrated in FIGS. 12A to 12D. FIG. 12A illustrates an example where a lattice-shape conductive film 146 is used. The conductive film 146 is preferably placed so as not to overlap with the display element included in the display device because light from the display device is not blocked. In that case, it is preferable that the direction of the lattice be the same as the direction of the display element arrangement and that the pitch of the lattice be an integer multiple of the pitch of the display element arrangement.

Figure 12B:
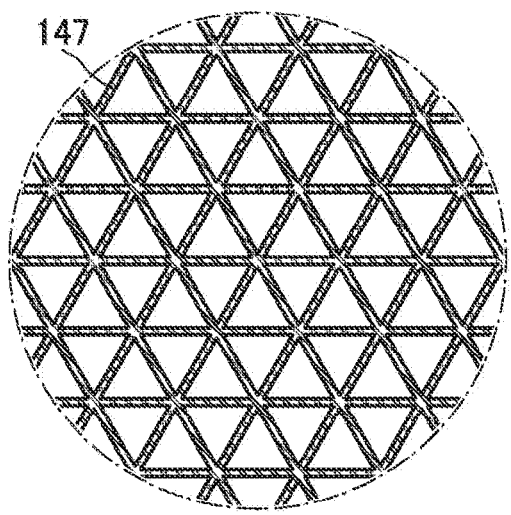

FIG. 12B illustrates an example of a lattice-shape conductive film 147, which is processed so as to be provided with triangle openings. Such a structure makes it possible to further reduce the resistance compared with the structure illustrated in FIG. 12A.

Figure 12C:
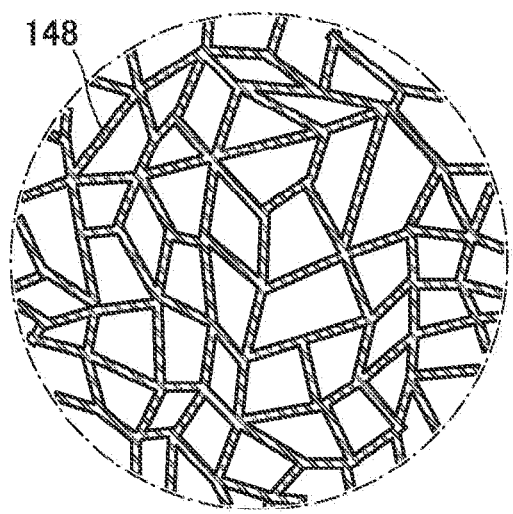

In addition, a conductive film 148, which has an irregular pattern shape, may be used as illustrated in FIG. 12C. Such a structure can prevent generation of moire when overlapping with the display portion of the display device.

Figure 12D:
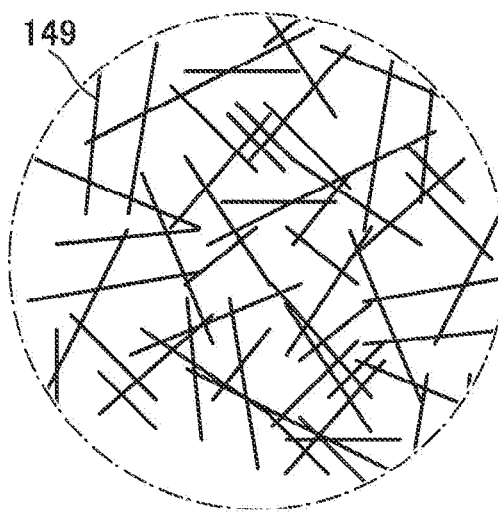

Conductive nanowires may be used for the electrodes 151 and 152. FIG. 12D illustrates an example where nanowires 149 are used. The nanowires 149 are dispersed at appropriate density so as to be in contact with the adjacent nanowires, which can form a two-dimensional network; therefore, the nanowires 149 can function as a conductive film with extremely high light-transmitting property. For example, nanowires which have a mean diameter of greater than or equal to 1 nm and less than or equal to 100 nm, preferably greater than or equal to 5 nm and less than or equal to 50 nm, and further preferably greater than or equal to 5 nm and less than or equal to 25 nm, can be used. As the nanowire 149, a metal nanowire such as an Ag nanowire, a Cu nanowire, or an Al nanowire, a carbon nanotube, or the like can be used. In the case of using an Ag nanowire, a light transmittance of 89% or more and a sheet resistance of 40 ohms per square or more and 100 ohms per square or less can be achieved.

The above is the description of structure examples of a touch sensor.

Structure Example of Touch Panel

As an example of the display device of one embodiment of the present invention, a structure example of a touch panel will be described below with reference to drawings.

FIG. 13A is a schematic perspective view of a touch panel 100. FIG. 13B is a schematic perspective view of a pair of substrates which are developed. Note that only typical components are illustrated for simplicity. In FIG. 13B, the substrate 31 is illustrated only in dashed outline.

The touch panel 100 includes the substrate 21 and the substrate 31 provided with the input device 150, which are provided to overlap with each other. For the structure of the substrate 21, the above description of Structure example 1 or the like can be referred to.

For the structure of the input device 150, the above description of the structure example of the touch sensor can be referred to. FIGS. 13A and 13B illustrate an example in which the input device 150 includes the plurality of electrodes 151, the plurality of electrodes 152, the plurality of wirings 155, and the plurality of wirings 156.

As the input device 150, for example, a capacitive touch sensor can be used. Examples of the capacitive touch sensor include a surface capacitive touch sensor and a projected capacitive touch sensor. Examples of the projected capacitive touch sensor include a self-capacitive touch sensor and a mutual capacitive touch sensor. The use of a mutual capacitive type is preferable because multiple points can be sensed simultaneously. An example of using a projected capacitive touch sensor will be described below.

Note that one embodiment of the present invention is not limited to this example, and any of a variety of sensors capable of sensing the proximity or contact of an object to be sensed, such as a finger or a stylus, can be used as the input device 150.

In the touch panel 100 illustrated in FIGS. 13A and 13B, the input device 150 is provided on the substrate 31. The wirings 155 and 156 and the like of the input device 150 are electrically connected to the FPC 42 connected to the substrate 21 side through a connection portion 169.

With the above structure, the FPC connected to the touch panel 100 can be provided only on one substrate side (here, on the substrate 21 side). Although two or more FPCs may be attached to the touch panel 100, for the simplicity of the structure, the touch panel 100 is preferably provided with one FPC 42 which has a function of supplying signals to both the substrate 21 and the substrate 31 as illustrated in FIGS. 13A and 13B.

The connection portion 169 can include, for example, an anisotropic conductive connector. As the connector, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector, a material capable of elastic deformation or plastic deformation is preferably used. In that case, the conductive particle sometimes has a shape that is vertically crushed. This increases the contact area between the connector and a conductive layer electrically connected to the connector, thereby reducing contact resistance and suppressing the generation of problems such as disconnection.

The connector is preferably provided so as to be covered with the adhesive layer 141 (not illustrated) with which the substrates 21 and 31 are bonded. For example, the connector may be scattered in the connection portion 169 after a paste or the like for forming the adhesive layer 141 is applied. A structure in which the connection portion 169 is provided in a portion where the adhesive layer 141 is provided can be similarly applied not only to a structure in which the adhesive layer 141 is also provided over the display portion 32 (also referred to as a solid sealing structure) but also to, for example, a hollow sealing structure in which the adhesive layer 141 is provided in the periphery of a light-emitting device, a liquid crystal display device, or the like.

Unlike in FIG. 1A, an IC 168 is mounted on the FPC 42 in FIGS. 13A and 13B. In that case, the IC 168 may have a function of driving the input device 150, or an IC for driving the input device 150 may be separately provided on the substrate 21, the substrate 31, the FPC 42, or the like.

Cross-Sectional Structural Example

Figure 14:
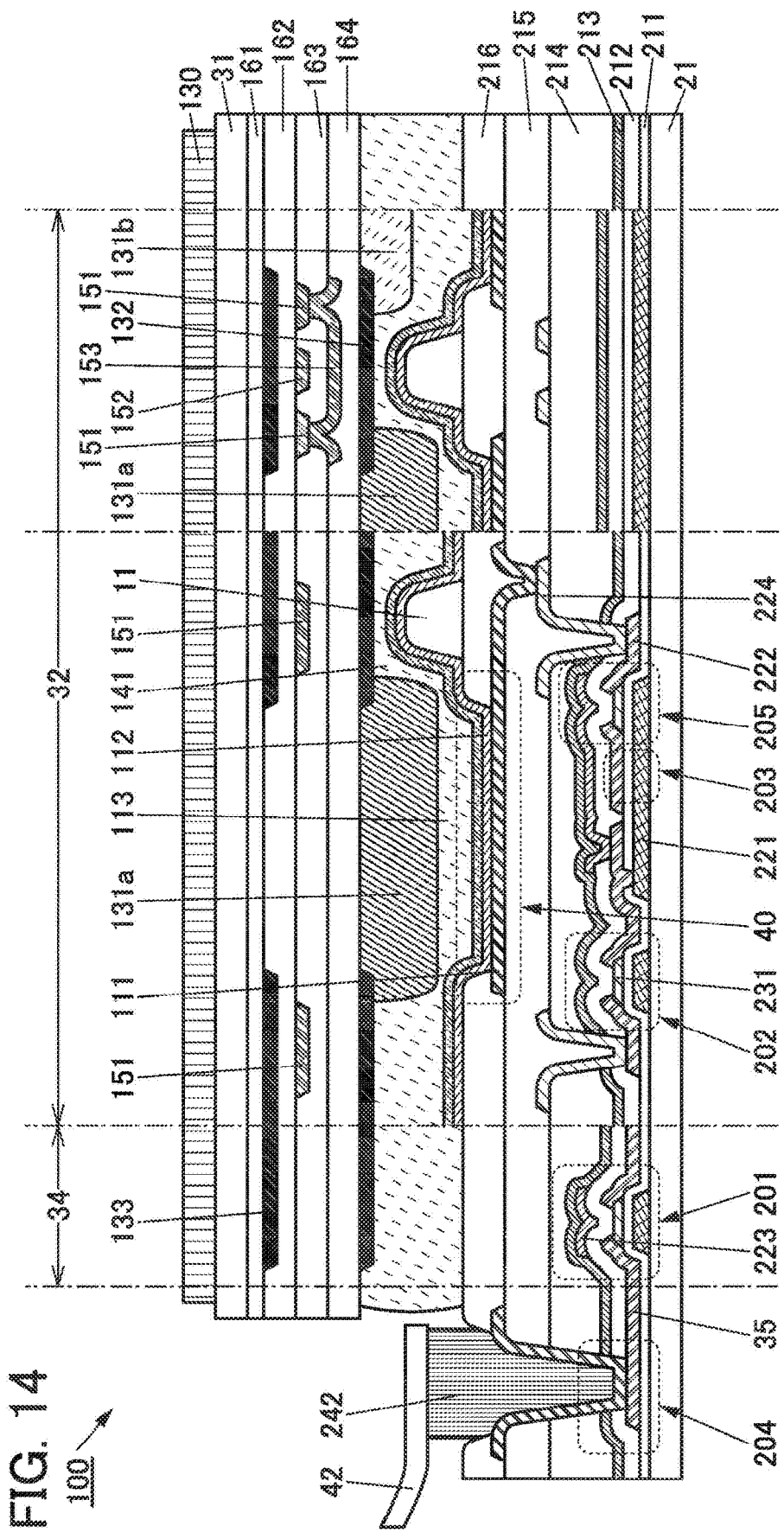
FIG. 14 illustrates a structure example of a display device of one embodiment.

Next, an example of a cross-sectional structure of the touch panel 100 will be described. FIG. 14 is a schematic cross-sectional view of the touch panel 100. FIG. 14 is different from FIG. 9 mainly in the structure between the adhesive layer 141 and the substrate 31.

Insulating layers 161, 162, 163, and 164 and the like are stacked on the surface of the substrate 31 that faces the substrate 21. A light-blocking layer 133 is provided between the insulating layers 161 and 162. The electrodes 151 and 152 and the like are provided between the insulating layers 162 and 163. The bridge electrode 153 is provided between the insulating layers 163 and 164. The coloring layers 131a and 131b, the light-blocking layer 132, and the like are provided on the surface of the insulating layer 164 that faces the adhesive layer 141.

FIG. 14 clearly shows an intersection of the electrodes 151 and 152. Through openings in the insulating layer 163, the bridge electrode 153 is electrically connected to the two electrodes 151 between which the electrode 152 is positioned.

The electrodes 151 and 152 overlap with the light-blocking layer 132. Also in FIG. 14, the electrode 151 does not overlap with the light-emitting element 40. In other words, the electrode 151 has a mesh shape with an opening overlapping with the light-emitting element 40. In such a structure where the electrodes 151 are not arranged on the path of light emitted from the light-emitting element 40, the electrodes 151 do not lead to luminance decrease substantially; thus, a touch panel with high visibility and low power consumption can be achieved. Note that the electrode 152 can have a similar structure.

In addition, not overlapping with the light-emitting element 40, the electrodes 151 and 152 can be formed using a metal material with a relatively low resistance. This increases the sensitivity of the touch sensor as compared to the case where a light-transmitting conductive material is used for the electrodes 151 and 152.

FIG. 14 illustrates an example in which the light-blocking layer 133 is provided between the electrodes 151 and 152 (and the bridge electrode 153) and the substrate 31 so as to overlap with the electrodes 151 and 152. Even in the case where a metal material is used for the electrode 151 and the like, external light reflection on the electrode 151 and the like can be hindered by the light-blocking layer 133, achieving a touch panel with higher visibility. Although the two light-blocking layers 132 and 133 are provided in this example, either one light-blocking layer may be provided.

The polarizing plate 130 is not necessarily provided over the substrate 31, and an object to be sensed, such as a finger or a stylus, may be in direct contact with the substrate 31. In that case, a protective layer (such as a ceramic coat) is preferably provided over the substrate 31. The protective layer can be formed using an inorganic insulating material such as silicon oxide, aluminum oxide, yttrium oxide, or yttria-stabilized zirconia (YSZ). Alternatively, tempered glass may be used for the substrate 31. Physical or chemical processing by an ion exchange method, a wind tempering method, or the like may be performed on the tempered glass, so that compressive stress is applied on the surface. In the case where the touch sensor is provided on one side of the tempered glass and the opposite side of the tempered glass is provided on, for example, the outermost surface of an electronic device for use as a touch surface, the thickness of the whole device can be decreased.

When the light-emitting element 40, the plurality of transistors, the electrodes of the touch sensor, and the like are arranged between the substrates 21 and 31 as illustrated in FIG. 14, a touch panel with a reduced number of components can be achieved.

Note that the structure of the touch panel 100 is not limited to the above, and for example, the touch panel may be fabricated by overlapping the substrate provided with the input device 150 with the display device 10 illustrated in FIG. 1A and the like.

Figure 15:
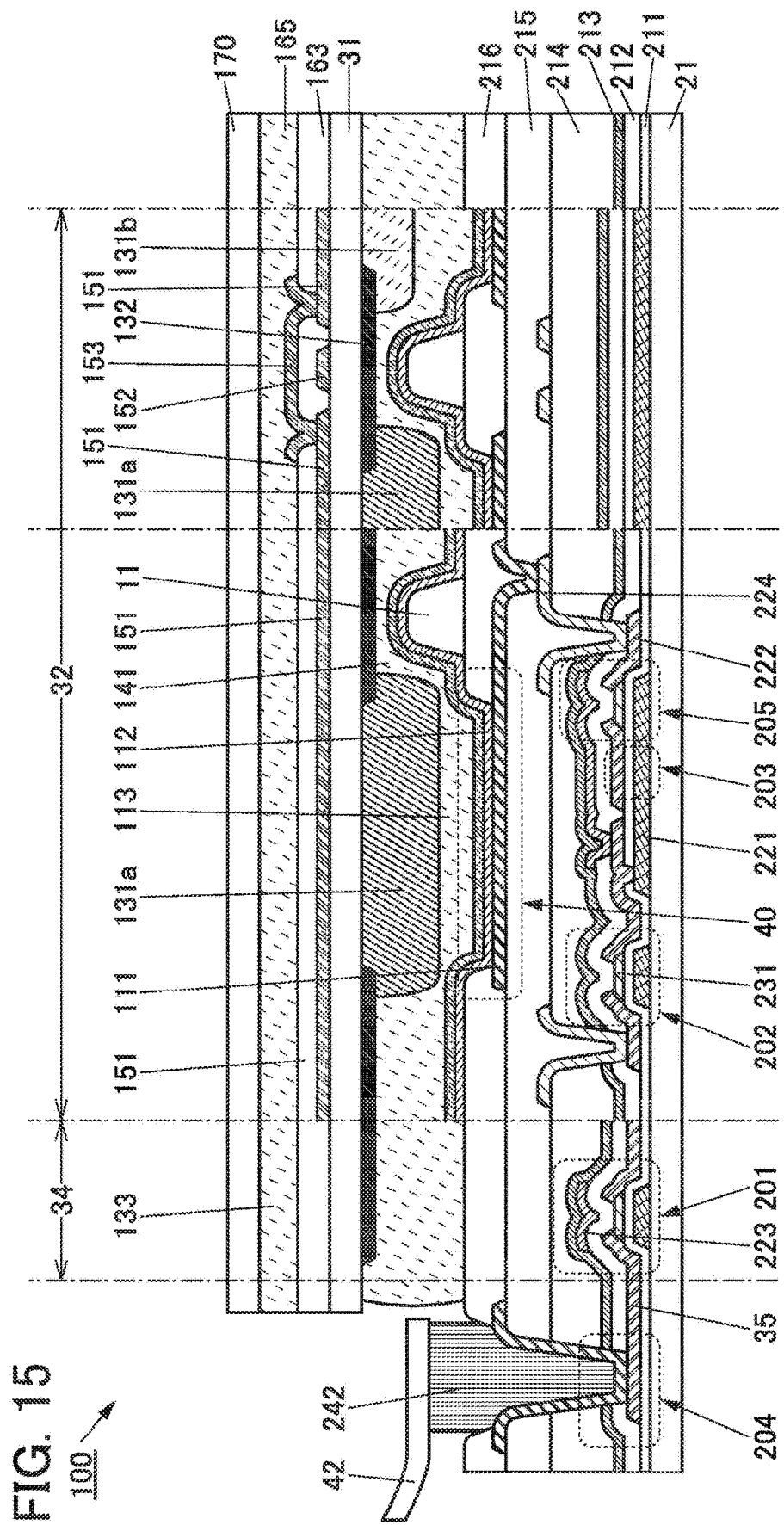
FIG. 15 illustrates a structure example of a display device of one embodiment.

FIG. 15 illustrates an example in which the electrodes 151 and 152 and the like of the touch sensor are formed on the surface of the substrate 31 that is opposite to the surface facing the substrate 21. This structure can be referred to as an on-cell touch panel.

The electrodes 151 and 152 are formed over the substrate 31 and covered with the insulating layer 163. The bridge electrode 153 is provided over the insulating layer 163.

A substrate 170 is a substrate serving as a touch surface, and for example, serves as part of a housing, protective glass, or the like of an electronic device where the touch panel is incorporated. The substrates 170 and 31 are bonded with an adhesive layer 165.

FIG. 15 illustrates an example in which the electrode 151 is arranged not only in a region overlapping with the light-blocking layer 132 but also in a region overlapping with the light-emitting element 40, the coloring layer 131a, and the like. In that case, the electrode 151 can be formed using a material transmitting visible light. For example, a film containing a metal oxide, a film containing graphene, or a film that contains a metal or an alloy and is thin enough to transmit visible light can be used for the electrode 151. The same applies to the electrode 152. The bridge electrode 153 can also be formed using a material transmitting visible light; however, a material blocking visible light, such as a metal or an alloy, may also be used in the case where the bridge electrode 153 overlaps with the light-blocking layer 132 or the area of the bridge electrode 153 is extremely small.

The above is the description of the cross-sectional structure example of the touch panel.

Structure Example 3

As an example of the display device of one embodiment of the present invention, a display device (display panel) that includes both a reflective liquid crystal element and a light-emitting element and can display an image both in a transmissive mode and in a reflective mode will be described below. Such a display panel can also be referred to as a transmissive OLED and reflective LC hybrid display (TR-hybrid display).

One example of such a display panel is a structure in which a liquid crystal element including an electrode that reflects visible light and a light-emitting element are stacked. In this structure, it is preferable that the electrode reflecting visible light have an opening and the opening overlap with the light-emitting element. This enables driving in the transmissive mode by which light is emitted from the light-emitting element through the opening. It is also preferable that a transistor for driving the liquid crystal element and a transistor included in the light-emitting element be positioned on the same plane. In addition, the light-emitting element and the liquid crystal element are preferably stacked with an insulating layer therebetween.

Such a display panel can be driven with extremely low power consumption by displaying an image in the reflective mode in a place with bright external light such as an outdoor space. At night or in a place with weak external light such an indoor space, the display panel can display an image with an optimal luminance by displaying the image in the transmissive mode. Furthermore, by displaying an image in both the transmissive and reflective modes, the display panel can display the image with less power consumption and a higher contrast than a conventional display panel even in a place with extremely bright external light.

Structure Example

FIG. 16A is a block diagram illustrating an example of the structure of a display device 200. The display device 200 includes a plurality of pixels 210 which are arranged in a matrix in the display portion 32. The display device 200 also includes a circuit GD and a circuit SD. The display device 200 includes the plurality of pixels 210 arranged in a direction R, and a plurality of wirings G1, a plurality of wirings G2, a plurality of wirings ANO, and a plurality of wirings CSCOM which are electrically connected to the circuit GD. The display device 200 includes the plurality of pixels 210 arranged in a direction C, and a plurality of wirings S1 and a plurality of wirings S2 which are electrically connected to the circuit SD.

The pixel 210 includes a reflective liquid crystal element and a light-emitting element. In the pixel 210, the liquid crystal element and the light emitting element partly overlap with each other.

FIG. 16B1 illustrates a structure example of a conductive layer 191 included in the pixel 210. The conductive layer 191 serves as a reflective electrode of the liquid crystal element in the pixel 210. The conductive layer 191 includes an opening 251.

In FIG. 16B1, the light-emitting element 40 in a region overlapping with the conductive layer 191 is denoted by a dashed line. The light-emitting element 40 overlaps with the opening 251 included in the conductive layer 191. Thus, light from the light-emitting element 40 is emitted to a display surface side through the opening 251.

In FIG. 16B1, the pixels 210 adjacent in the direction R correspond to different colors. As illustrated in FIG. 16B1, the openings 251 are preferably provided in different positions in the conductive layers 191 so as not to be aligned in the two pixels adjacent to each other in the direction R. This allows the two light-emitting elements 40 to be apart from each other, thereby preventing light emitted from the light-emitting element 40 from entering a coloring layer in the adjacent pixel 210 (such a phenomenon is also referred to as crosstalk). Furthermore, since the two adjacent light-emitting elements 40 can be arranged apart from each other, a high-resolution display device is achieved even when EL layers of the light-emitting elements 40 are separately formed with a shadow mask or the like.

Alternatively, arrangement illustrated in FIG. 16B2 may be employed.

If the ratio of the total area of the opening 251 to the total area except for the opening is too large, display performed using the liquid crystal element is dark. If the ratio of the total area of the opening 251 to the total area except for the opening is too small, display performed using the light-emitting element 40 is dark.

If the area of the opening 251 in the conductive layer 191 serving as a reflective electrode is too small, light emitted from the light-emitting element 40 is not efficiently extracted for display.

The opening 251 may have a polygonal shape, a quadrangular shape, an elliptical shape, a circular shape, a cross-like shape, a stripe shape, a slit-like shape, or a checkered pattern, for example. The opening 251 may be close to the adjacent pixel. Preferably, the opening 251 is provided close to another pixel emitting light of the same color, in which case crosstalk can be suppressed.

Circuit Structure Example

Figure 17:
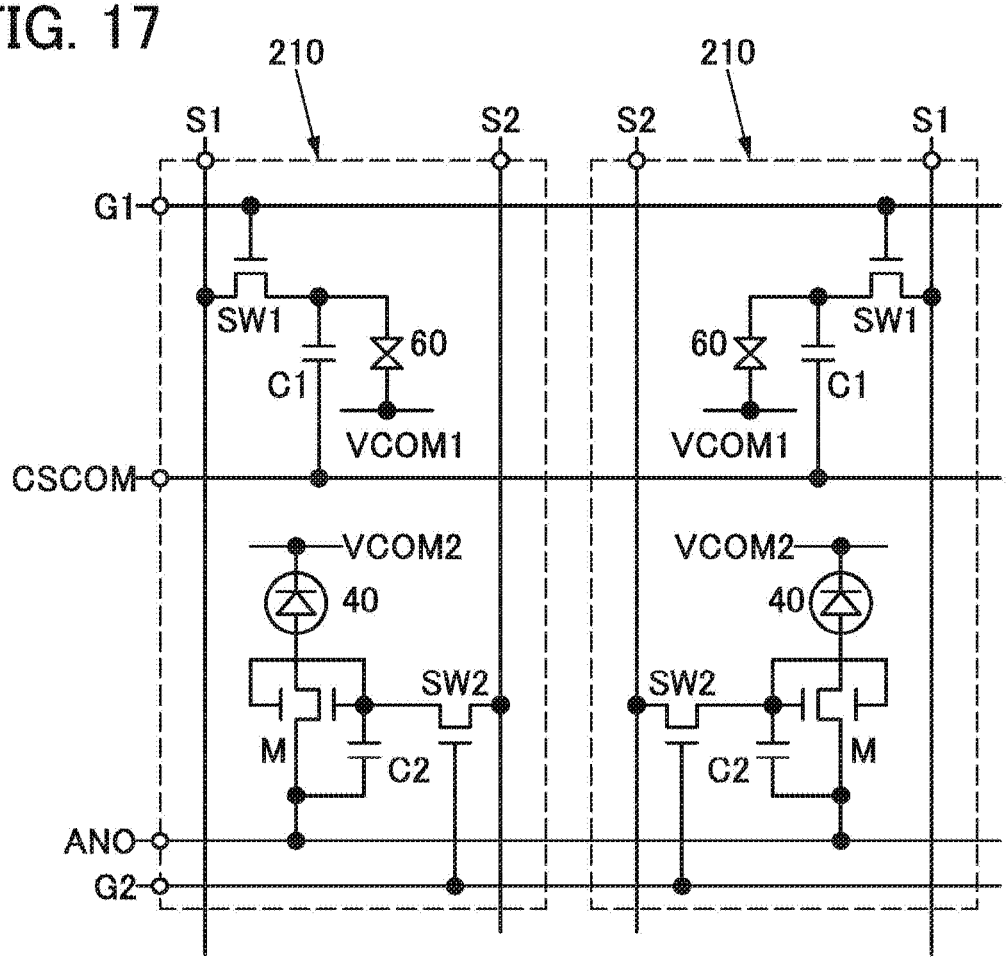
FIG. 17 illustrates a structure example of a display device of one embodiment.

FIG. 17 is a circuit diagram illustrating a structure example of the pixel 210. FIG. 17 shows two adjacent pixels 210.

The pixel 210 includes a switch SW1, a capacitor C1, the liquid crystal element 60, a switch SW2, a transistor M, a capacitor C2, the light-emitting element 40, and the like. The pixel 210 is electrically connected to the wiring G1, the wiring G2, the wiring ANO, the wiring CSCOM, the wiring S1, and the wiring S2. FIG. 17 also illustrates a wiring VCOM1 electrically connected to the liquid crystal element 60 and a wiring VCOM2 electrically connected to the light-emitting element 40.

FIG. 17 illustrates an example in which a transistor is used as each of the switches SW1 and SW2.

A gate of the switch SW1 is connected to the wiring G1. One of a source and a drain of the switch SW1 is connected to the wiring S and the other of the source and the drain is connected to one electrode of the capacitor C1 and one electrode of the liquid crystal element 60. The other electrode of the capacitor C1 is connected to the wiring CSCOM. The other electrode of the liquid crystal element 60 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 40. The other electrode of the light-emitting element 40 is connected to the wiring VCOM2.

FIG. 17 illustrates an example in which the transistor M includes two gates between which a semiconductor is provided and which are connected to each other. This structure can increase the amount of current flowing through the transistor M.

The wiring G1 can be supplied with a signal for changing the on/off state of the transistor SW1. A predetermined potential can be supplied to the wiring VCOM1. The wiring S1 can be supplied with a signal for changing the orientation of liquid crystals of the liquid crystal element 60. A predetermined potential can be supplied to the wiring CSCOM.

The wiring G2 can be supplied with a signal for changing the on/off state of the transistor SW2. The wiring VCOM2 and the wiring ANO can be supplied with potentials having a difference large enough to make the light-emitting element 40 emit light. The wiring S2 can be supplied with a signal for changing the on/off state of the transistor M.

In the pixel 210 of FIG. 17, for example, an image can be displayed in the reflective mode by driving the pixel with the signals supplied to the wiring G1 and the wiring S1 and utilizing the optical modulation of the liquid crystal element 60. In the case where an image is displayed in the transmissive mode, the pixel is driven with the signals supplied to the wiring G2 and the wiring S2 and the light-emitting element 40 emits light. In the case where both modes are performed at the same time, the pixel can be driven with the signals to the wiring GI, the wiring G2, the wiring SI, and the wiring S2.

Cross-Sectional Structure Example of Display Device

Figure 18:
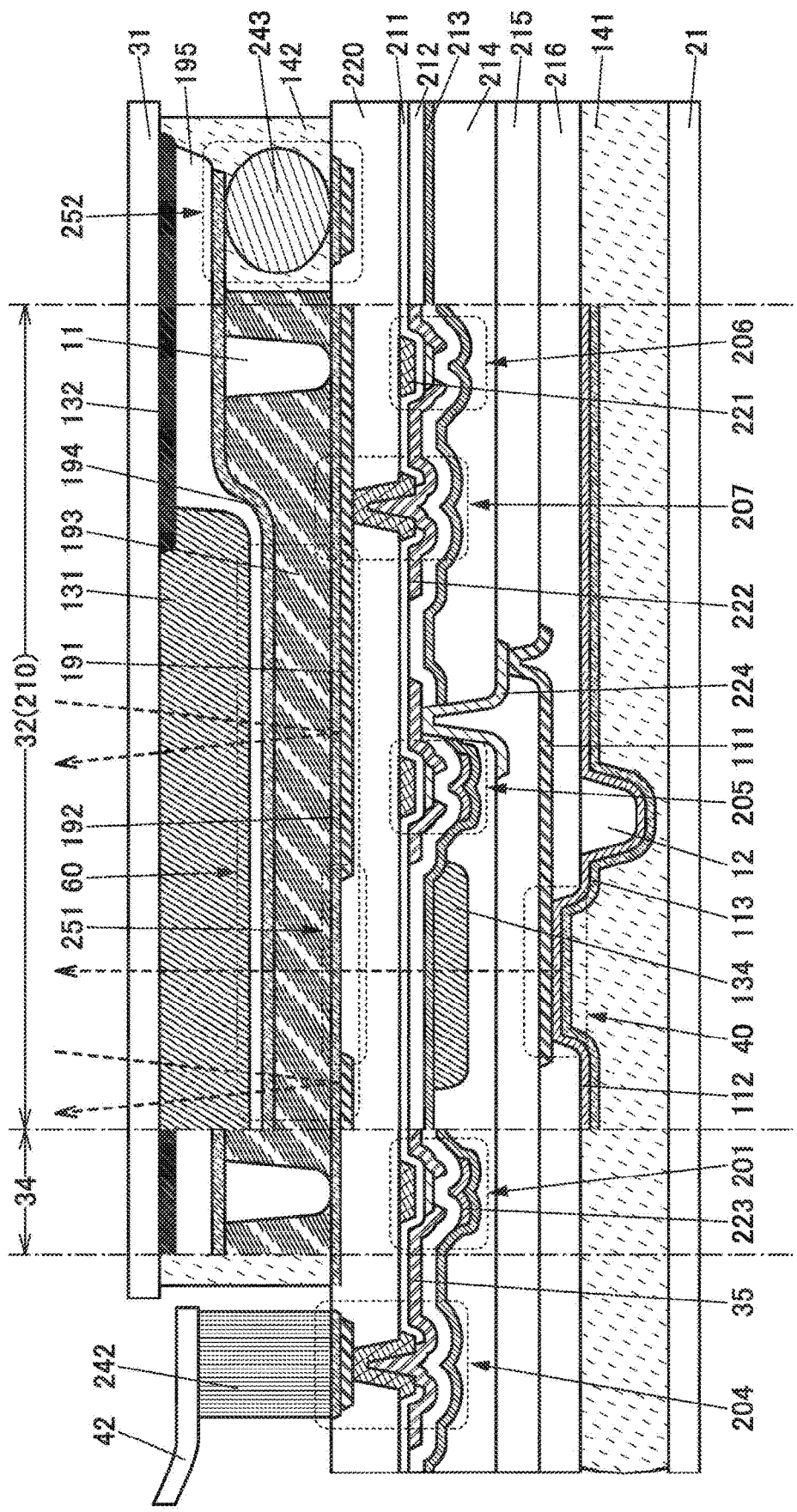
FIG. 18 illustrates a structure example of a display device of one embodiment.

FIG. 18 is a schematic cross-sectional view of the display device 200.

The display device 200 includes an insulating layer 220 between the substrates 21 and 31. The display device 200 also includes the light-emitting element 40, the transistor 205, a transistor 206, a coloring layer 134, and the like between the substrate 21 and the insulating layer 220. Furthermore, the display device 200 includes the liquid crystal element 60, a coloring layer 131, the structure body 11, and the like between the substrate 31 and the insulating layer 220.

The substrate 21 and the insulating layer 220 are bonded with the adhesive layer 141. The substrate 31 and the insulating layer 220 are bonded with an adhesive layer 142 with which a liquid crystal is sealed.

The liquid crystal element 60 is a reflective liquid crystal element. The liquid crystal element 60 has a stacked structure of a conductive layer 192, a liquid crystal 193, and a conductive layer 194. The conductive layer 191 is provided in contact with the surface of the conductive layer 192 that faces the substrate 21. The conductive layer 191 serves as a reflective electrode of the liquid crystal element 60. The conductive layer 191 includes the opening 251. The conductive layer 192 contains a material transmitting visible light.

The light-emitting element 40 is a bottom-emission light-emitting element. The light-emitting element 40 has a structure in which the conductive layer 111, the EL layer 112, and the conductive layer 113 are stacked in this order from the side of the insulating layer 220. The conductive layer 113 contains a material reflecting visible light, and the conductive layer 111 contains a material transmitting visible light.

Light is emitted from the light-emitting element 40 to the substrate 31 side through the coloring layer 134, the insulating layer 220, the opening 251, the conductive layer 192, and the like.

A structure body 12 is provided on the insulating layer 216 covering an end portion of the conductive layer 111. The structure body 12 has a function as a spacer for preventing the insulating layer 220 and the substrate 21 from getting closer more than necessary. The structure body 12 is not necessarily provided.

One of the source and the drain of the transistor 205 is electrically connected to the conductive layer 111 of the light-emitting element 40. The transistor 205 corresponds to, for example, the transistor M in FIG. 17.

One of a source and a drain of the transistor 206 is electrically connected to the conductive layers 191 and 192 through a terminal portion 207. That is, the terminal portion 207 electrically connects the conductive layers provided on both surfaces of the insulating layer 220 through openings in the insulating layer 220 in the display portion 32. The transistor 206 corresponds to, for example, the switch SW1 in FIG. 17.

The terminal portion 204 is provided in a region where the substrates 21 and 31 do not overlap with each other. Similarly to the terminal portion 207, the terminal portion 204 electrically connects the conductive layers provided on both surfaces of the insulating layer 220. On the top surface of the terminal portion 204, a conductive layer obtained by processing the same conductive film as the conductive layer 192 is exposed. Thus, the terminal portion 204 and the FPC 42 can be electrically connected to each other through the connection layer 242.

The coloring layer 131 and the light-blocking layer 132 are provided on the surface of the substrate 31 that faces the substrate 21. In addition, an insulating layer 195 is provided to cover the coloring layer 131 and the light-blocking layer 132. The insulating layer 195 serves as an overcoat. The conductive layer 194 is provided on the surface of the insulating layer 195 that faces the substrate 21.

A connection portion 252 is provided in part of a region where the adhesive layer 142 is provided. In the connection portion 252, the conductive layer obtained by processing the same conductive film as the conductive layer 192 and part of the conductive layer 194 are electrically connected with a connector 243. Accordingly, a signal or a potential input from the FPC 42 connected to the substrate 21 side can be supplied to the conductive layer 194 formed on the substrate 31 side through the connection portion 252.

The structure body 11 is provided between the conductive layers 192 and 194. The structure body 11 has a function of maintaining a cell gap of the liquid crystal element 60. Here, the structure body 11 is formed on the substrate 31 side, which is opposite to the side shown in FIG. 7A. The surface of the insulating layer 195 has a depression, and the structure body 11 is formed to overlap with the depression. The top surface (part of the surface on the display surface side) of the structure body 11 is positioned above the bottom surface of the coloring layer 131. This can reduce the distance between the substrates 21 and 31 and improve viewing angle characteristics.

Although not illustrated here, an alignment film for adjusting the alignment of the liquid crystal 193 may be provided between the conductive layer 194 and the liquid crystal 193 and between the conductive layer 192 and the liquid crystal 193. In that case, part of the alignment film may be provided to cover the surface of the structure body 11.

An example of the method for manufacturing the display device 200 is described. For example, the conductive layer 192, the conductive layer 191, and the insulating layer 220 are formed in order over a supporting substrate provided with a separation layer, and the transistor 205, the light-emitting element 40, and the like are formed. Then, the substrate 21 and the supporting substrate are bonded with the adhesive layer 141. After that, separation is performed at the interface between the separation layer and each of the insulating layer 220 and the conductive layer 192, whereby the supporting substrate and the separation layer are removed. Separately, the coloring layer 131, the light-blocking layer 132, the structure body 11, and the like are formed over the substrate 31 in advance. Then, the liquid crystal 193 is dropped onto the substrate 21 or 31 and the substrates 21 and 31 are bonded with the adhesive layer 142, whereby the display device 200 can be manufactured.

A material for the separation layer can be selected such that separation at the interface with the insulating layer 220 and the conductive layer 192 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating layer 220 over the separation layer. The use of the high-melting-point metal material for the separation layer can increase the formation temperature of a layer formed in a later step, which reduces impurity concentration and achieves a highly reliable display device.

As the conductive layer 192, a metal oxide, a metal nitride, or an oxide such as an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive layer 192.

The above is the description of Structure example 3.

At least part of this embodiment can be implemented in combination with any of the other embodiments described in this specification as appropriate.

Embodiment 2

Described in this embodiment is an example of a driving method of an input device (touch sensor) which can be applied to the display device of one embodiment of the present invention.

Figure 19A:
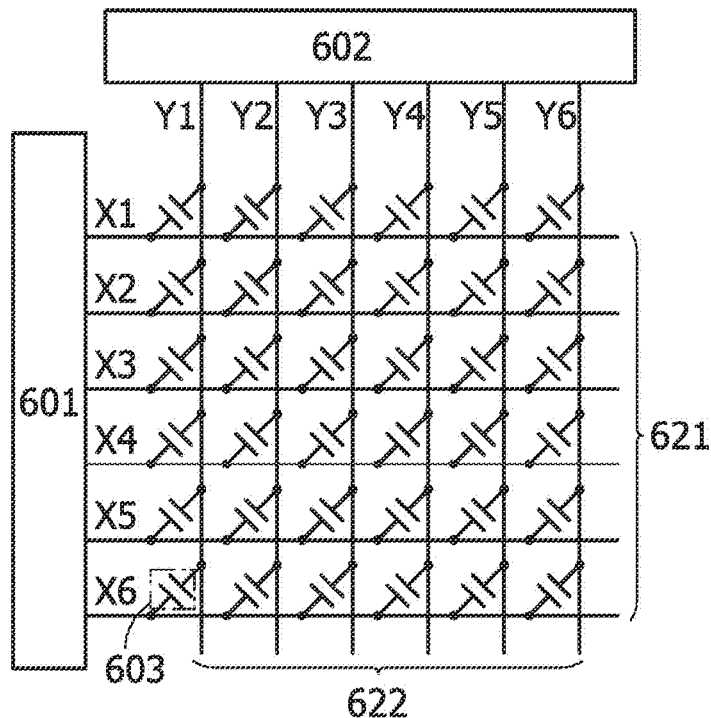
FIGS. 19A and 19B illustrate an example of a driving method of an input device of one embodiment.

FIG. 19A is a block diagram illustrating the structure of a mutual capacitive touch sensor. FIG. 19A illustrates a pulse voltage output circuit 601 and a current sensing circuit 602. Note that in FIG. 19A, six wirings X1 to X6 represent electrodes 621 to which a pulse voltage is applied, and six wirings Y1 to Y6 represent electrodes 622 that sense changes in current. The number of such electrodes is not limited to those illustrated in this example. FIG. 19A also illustrates a capacitor 603 that is formed with the electrodes 621 and 622 overlapping with each other or being provided close to each other. Note that functional replacement between the electrodes 621 and 622 is possible.

For example, the electrode 151 described in Embodiment 1 corresponds to one of the electrodes 621 and 622, and the electrode 152 described in Embodiment 1 corresponds to the other of the electrodes 621 and 622.

The pulse voltage output circuit 601 is, for example, a circuit for sequentially inputting a pulse voltage to the wirings X1 to X6. The current sensing circuit 602 is, for example, a circuit for sensing current flowing through each of the wirings Y1-Y6.

By application of a pulse voltage to one of the wirings X1 to X6, an electric field is generated between the electrodes 621 and 622 of the capacitor 603, and current flows through the electrode 622. Part of the electric field generated between the electrodes is blocked when an object such a finger or a stylus contacts or approaches the device, so that the electric field intensity between the electrodes is changed. Consequently, the amount of current flowing through the electrode 622 is changed.

For example, in the case where there is no approach or no contact of an object, the amount of current flowing in each of the wirings Y1-Y6 depends on the amount of capacitance of the capacitor 603. In the case where part of an electric field is blocked by the approach or contact of an object, a decrease in the amount of current flowing in the wirings Y1-Y6 is sensed. The approach or contact of an object can be sensed by utilizing this change.

Sensing by the current sensing circuit 602 may be performed using an integral value (time integral value) of current flowing in a wiring. In that case, sensing may be performed with an integrator circuit, for example. Alternatively, the peak current value may be sensed. In that case, for example, current may be converted into voltage, and the peak voltage value may be sensed.

Figure 19B:
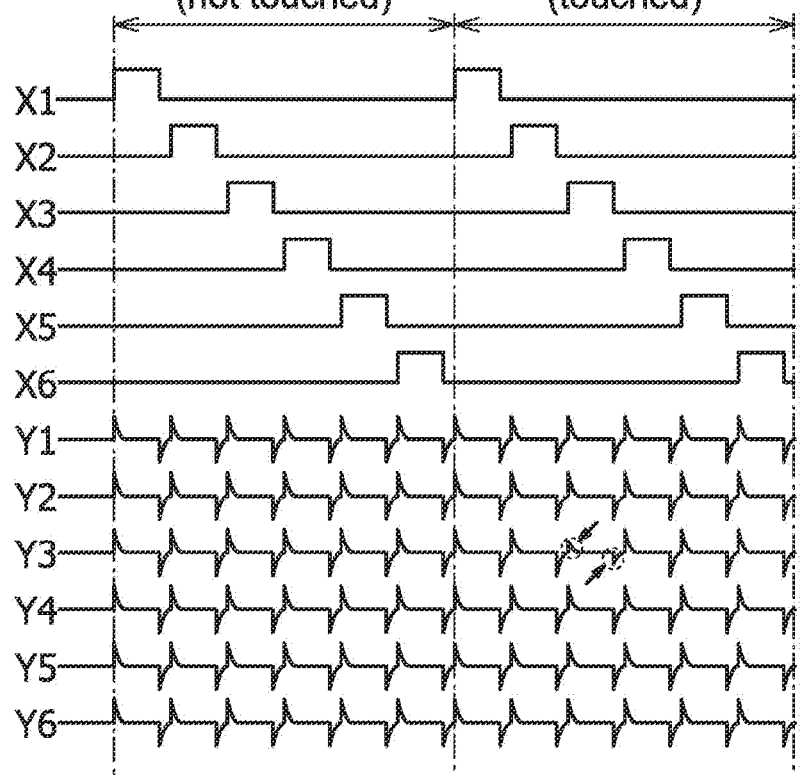

FIG. 19B is an example of a timing chart illustrating input and output waveforms in the mutual capacitive touch sensor in FIG. 19A. In FIG. 19B, sensing in each row and each column is performed in one sensing period. FIG. 19B shows a period when the contact or approach of an object is not sensed (when the touch sensor is not touched) and a period when the contact or approach of an object is sensed (when the touch sensor is touched). Here, the wirings Y1-Y6 each show a waveform of a voltage corresponding to the amount of current to be sensed.

As shown in FIG. 19B, the wirings X1-X6 are sequentially supplied with a pulse voltage. Accordingly, current flows in the wirings Y1-Y6. When the touch sensor is not touched, substantially the same current flows in the wirings Y1-Y6 in accordance with a change in voltages of the wirings X1-X6; thus, the wirings Y1-Y6 have similar output waveforms. Meanwhile, when the touch sensor is touched, current flowing in a wiring in a position which an object contacts or approaches among the wirings Y1-Y6 is reduced; thus, the output waveforms are changed as shown in FIG. 19B.

FIG. 19B shows an example in which an object contacts or approaches the intersection of the wiring X3 and the wiring Y3 or the vicinity thereof.

A change in current due to block of an electric field generated between a pair of electrodes is sensed in this manner in a mutual capacitive touch sensor, so that positional information of an object can be obtained. When the detection sensitivity is high, the coordinates of the object can be determined even when the object is far from a detection surface (e.g., a surface of the touch panel).

By driving a touch panel by a method in which a display period of a display portion and a sensing period of a touch sensor do not overlap with each other, the detection sensitivity of the touch sensor can be increased. For example, a display period and a sensing period may be separately provided in one display frame period. In that case, two or more sensing periods are preferably provided in one frame period. When the frequency of sensing is increased, the detection sensitivity can be increased.

It is preferable that, as an example, the pulse voltage output circuit 601 and the current sensing circuit 602 be formed in an IC. For example, the IC is preferably mounted on a touch panel or a substrate in a housing of an electronic device. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

At least part of this embodiment can be implemented in combination with any of the other embodiments described in this specification as appropriate.

Embodiment 3

In this embodiment, an example of a transistor that can be used as the transistors described in the above embodiments will be described with reference to drawings.

The display device of one embodiment of the present invention can be fabricated by using a transistor with any of various modes, such as a bottom-gate transistor or a top-gate transistor. Therefore, a material for a semiconductor layer or the structure of a transistor can be easily changed in accordance with the existing production line.

[Bottom-Gate Transistor]

FIG. 20A1 is a cross-sectional view of a transistor 810 that is a channel-protective transistor, which is a type of bottom-gate transistor. In FIG. 20A1, the transistor 810 is formed over a substrate 771. The transistor 810 includes an electrode 746 over the substrate 771 with an insulating layer 772 provided therebetween. The transistor 810 includes a semiconductor layer 742 over the electrode 746 with an insulating layer 726 provided therebetween. The electrode 746 can serve as a gate electrode. The insulating layer 726 can serve as a gate insulating layer.

The transistor 810 includes an insulating layer 741 over a channel formation region in the semiconductor layer 742. The transistor 810 includes an electrode 744a and an electrode 744b which are partly in contact with the semiconductor layer 742 and over the insulating layer 726. The electrode 744a can serve as one of a source electrode and a drain electrode. The electrode 744b can serve as the other of the source electrode and the drain electrode. Part of the electrode 744a and part of the electrode 744b are formed over the insulating layer 741.

The insulating layer 741 can serve a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

For example, the insulating layer 772 can be formed using a material and method similar to those of insulating layers 722 and 705. Note that the insulating layer 772 may be formed of a stack of insulating layers. For example, the semiconductor layer 742 can be formed using a material and a method similar to those of the semiconductor layer 708. Note that the semiconductor layer 742 may be formed of a stack of semiconductor layers. For example, the electrode 746 can be formed using a material and a method similar to those of the electrode 706. Note that the electrode 746 may be formed of a stack of conductive layers. The insulating layer 726 can be formed using a material and a method similar to those of the insulating layer 707. Note that the insulating layer 726 may be formed of a stack of insulating layers. For example, the electrodes 744a and 744b can be formed using a material and a method similar to those of the electrode 714 or 715. Note that the electrodes 744a and 744b may be formed of a stack of conductive layers. For example, the insulating layer 741 can be formed using a material and a method similar to those of the insulating layer 726. Note that the insulating layer 741 may be formed of a stack of insulating layers. For example, the insulating layer 728 can be formed using a material and a method similar to those of the insulating layer 710. Note that the insulating layer 728 may be formed of a stack of insulating layers. For example, the insulating layer 729 can be formed using a material and a method similar to those of the insulating layer 711. Note that the insulating layer 729 may be formed of a stack of insulating layers.

The electrode, the semiconductor layer, the insulating layer, and the like used in the transistor disclosed in this embodiment can be formed using a material and a method disclosed in any of the other embodiments.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions ($n^+$ layers). Accordingly, the regions can serve as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce the contact resistance between the semiconductor layer 742 and each of the electrodes 744a and 744b. Accordingly, the electric characteristics of the transistor, such as the field-effect mobility and the threshold voltage, can be favorable.

In the case where a semiconductor such as silicon is used for the semiconductor layer 742, a layer that serves as an n-type semiconductor or a p-type semiconductor is preferably provided between the semiconductor layer 742 and the electrode 744a and between the semiconductor layer 742 and the electrode 744b. The layer that serves as an n-type semiconductor or a p-type semiconductor can serve as the source region or the drain region in the transistor.

The insulating layer 729 is preferably formed using a material that can prevent or reduce diffusion of impurities into the transistor from the outside. The insulating layer 729 is not necessarily formed.

When an oxide semiconductor is used for the semiconductor layer 742, heat treatment may be performed before and/or after the insulating layer 729 is formed. The heat treatment can fill oxygen vacancies in the semiconductor layer 742 by diffusing oxygen contained in the insulating layer 729 or other insulating layers into the semiconductor layer 742. Alternatively, the insulating layer 729 may be formed while the heat treatment is performed, so that oxygen vacancies in the semiconductor layer 742 can be filled.

Note that a CVD method can be generally classified into a plasma enhanced CVD (PECVD) method using plasma, a thermal CVD (TCVD) method using heat, and the like. A CVD method can be further classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLO) method, an ion beam assisted deposition (IBAD) method, an atomic layer deposition (ALD) method, and the like.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 811 illustrated in FIG. 20A2 is different from the transistor 810 in that an electrode 723 that can serve as a back gate electrode is provided over the insulating layer 729. The electrode 723 can be formed using a material and a method similar to those of the electrode 746.

In general, the back gate electrode is formed using a conductive layer and positioned so that a channel formation region of a semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 746 and the electrode 723 can each serve as a gate electrode. Thus, the insulating layers 726, 728, and 729 can each serve as a gate insulating layer. The electrode 723 may also be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Alternatively, one of the electrodes 746 and 723 may be referred to as a "first gate electrode", and the other may be referred to as a "second gate electrode".

By providing the electrodes 746 and 723 with the semiconductor layer 742 provided therebetween and setting the potentials of the electrodes 746 and 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area occupied by a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrodes 746 and 723 each have a function of blocking an electric field generated outside, electric charge of charged particles and the like generated on the insulating layer 772 side or above the electrode 723 do not influence the channel formation region in the semiconductor layer 742. Thus, degradation by a stress test (e.g., a negative gate bias temperature (−GBT) stress test in which negative electric charge is applied to a gate) can be reduced. Furthermore, a change in gate voltage (rising voltage) at which on-state current starts flowing depending on drain voltage can be reduced. Note that this effect is obtained when the electrodes 746 and 723 have the same potential or different potentials.

The BT stress test is one kind of acceleration test and can evaluate, in a short time, a change by long-term use (i.e., a change over time) in characteristics of a transistor. In particular, the amount of change in the threshold voltage of a transistor before and after the BT stress test is an important indicator when examining the reliability of the transistor. As the change in threshold voltage is smaller, the transistor has higher reliability.

By providing the electrodes 746 and 723 and setting the potentials of the electrodes 746 and 723 to be the same, the amount of change in threshold voltage is reduced. Accordingly, variations in electrical characteristics among a plurality of transistors are also reduced.

A transistor including a back gate electrode has a smaller change in threshold voltage before and after a positive GBT stress test, in which positive electric charge is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with high reliability can be provided. Moreover, a semiconductor device with high reliability can be provided.

FIG. 20B1 is a cross-sectional view of a channel-protective transistor 820 that is a type of bottom-gate transistor. The transistor 820 has substantially the same structure as the transistor 810 but is different from the transistor 810 in that the insulating layer 741 covers an end portion of the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selectively removing part of the insulating layer 741 which overlaps with the semiconductor layer 742. A region of the insulating layer 741 which overlaps with the channel formation region can serve as a channel protective layer.

A transistor 821 illustrated in FIG. 20B2 is different from the transistor 820 in that the electrode 723 that can serve as a back gate electrode is provided over the insulating layer 729.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The length between the electrode 744a and the electrode 746 and the length between the electrode 744b and the electrode 746 in the transistors 820 and 821 are larger than those in the transistors 810 and 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

A transistor 825 illustrated in FIG. 20C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 20C2 is different from the transistor 825 in that the electrode 723 which can serve as a back gate electrode is provided over the insulating layer 729.

[Top-Gate Transistor]

FIG. 21A1 is a cross-sectional view of a transistor 830 that is a type of top-gate transistor. The transistor 830 includes the semiconductor layer 742 over the insulating layer 772, the electrodes 744a and 744b that are over the semiconductor layer 742 and the insulating layer 772 and in contact with part of the semiconductor layer 742, the insulating layer 726 over the semiconductor layer 742 and the electrodes 744a and 744b, and the electrode 746 over the insulating layer 726.

Since the electrode 746 overlaps with neither the electrode 744a nor the electrode 744b in the transistor 830, the parasitic capacitance generated between the electrodes 746 and 744a and the parasitic capacitance generated between the electrodes 746 and 744b can be reduced. After the formation of the electrode 746, an impurity 755 is introduced into the semiconductor layer 742 using the electrode 746 as a mask, so that an impurity region can be formed in the semiconductor layer 742 in a self-aligned manner (see FIG. 21A3). According to one embodiment of the present invention, a transistor with favorable electrical characteristics can be provided.

The introduction of the impurity 755 can be performed with an ion implantation apparatus, an ion doping apparatus, or a plasma treatment apparatus.

As the impurity 755, for example, at least one kind of element of Group 13 elements and Group 15 elements can be used. In the case where an oxide semiconductor is used for the semiconductor layer 742, it is possible to use at least one kind of element of a rare gas, hydrogen, and nitrogen as the impurity 755.

A transistor 831 illustrated in FIG. 21A2 is different from the transistor 830 in that the electrode 723 and the insulating layer 727 are included. The transistor 831 includes the electrode 723 formed over the insulating layer 772 and the insulating layer 727 formed over the electrode 723. The electrode 723 can serve as a back gate electrode. Thus, the insulating layer 727 can serve as a gate insulating layer. The insulating layer 727 can be formed using a material and a method similar to those of the insulating layer 726.

Like the transistor 811, the transistor 831 has a high on-state current for its area. That is, the area of the transistor 831 can be small for a required on-state current. According to one embodiment of the present invention, the area occupied by a transistor can be reduced. Therefore, according to one embodiment of the present invention, a semiconductor device having a high degree of integration can be provided.

A transistor 840 illustrated in FIG. 21B1 is a type of top-gate transistor. The transistor 840 is different from the transistor 830 in that the semiconductor layer 742 is formed after the formation of the electrodes 744a and 744b. A transistor 841 illustrated in FIG. 21B2 is different from the transistor 840 in that the electrode 723 and the insulating layer 727 are included. In the transistors 840 and 841, part of the semiconductor layer 742 is formed over the electrode 744a and another part of the semiconductor layer 742 is formed over the electrode 744b.

Like the transistor 811, the transistor 841 has a high on-state current for its area. That is, the area of the transistor 841 can be small for a required on-state current. According to one embodiment of the present invention, the area occupied by a transistor can be reduced. Therefore, according to one embodiment of the present invention, a semiconductor device having a high degree of integration can be provided.

A transistor 842 illustrated in FIG. 22A1 is a type of top-gate transistor. The transistor 842 is different from the transistor 830 or 840 in that the electrodes 744a and 744b are formed after the formation of the insulating layer 729. The electrodes 744a and 744b are electrically connected to the semiconductor layer 742 through openings formed in the insulating layers 728 and 729.

Part of the insulating layer 726 that does not overlap with the electrode 746 is removed, and the impurity 755 is introduced into the semiconductor layer 742 using the electrode 746 and the insulating layer 726 that is left as a mask, so that an impurity region can be formed in the semiconductor layer 742 in a self-aligned manner (see FIG. 22A3). The transistor 842 includes a region where the insulating layer 726 extends beyond an end portion of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region adjacent to a portion of the semiconductor layer 742 which overlaps with the electrode 746.

A transistor 843 illustrated in FIG. 22A2 is different from the transistor 842 in that the electrode 723 is included. The transistor 843 includes the electrode 723 that is formed over the substrate 771 and overlaps with the semiconductor layer 742 with the insulating layer 772 provided therebetween. The electrode 723 can serve as a back gate electrode.

As in a transistor 844 illustrated in FIG. 22B1 and a transistor 845 illustrated in FIG. 22B2, the insulating layer 726 in a region that does not overlap with the electrode 746 may be completely removed. Alternatively, as in a transistor 846 illustrated in FIG. 22C1 and a transistor 847 illustrated in FIG. 22C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

At least part of this embodiment can be implemented in combination with any of the other embodiments described in this specification as appropriate.

Embodiment 4

In this embodiment, a display module and electronic devices that include the display device of one embodiment of the present invention will be described with reference to drawings.

Figure 23:
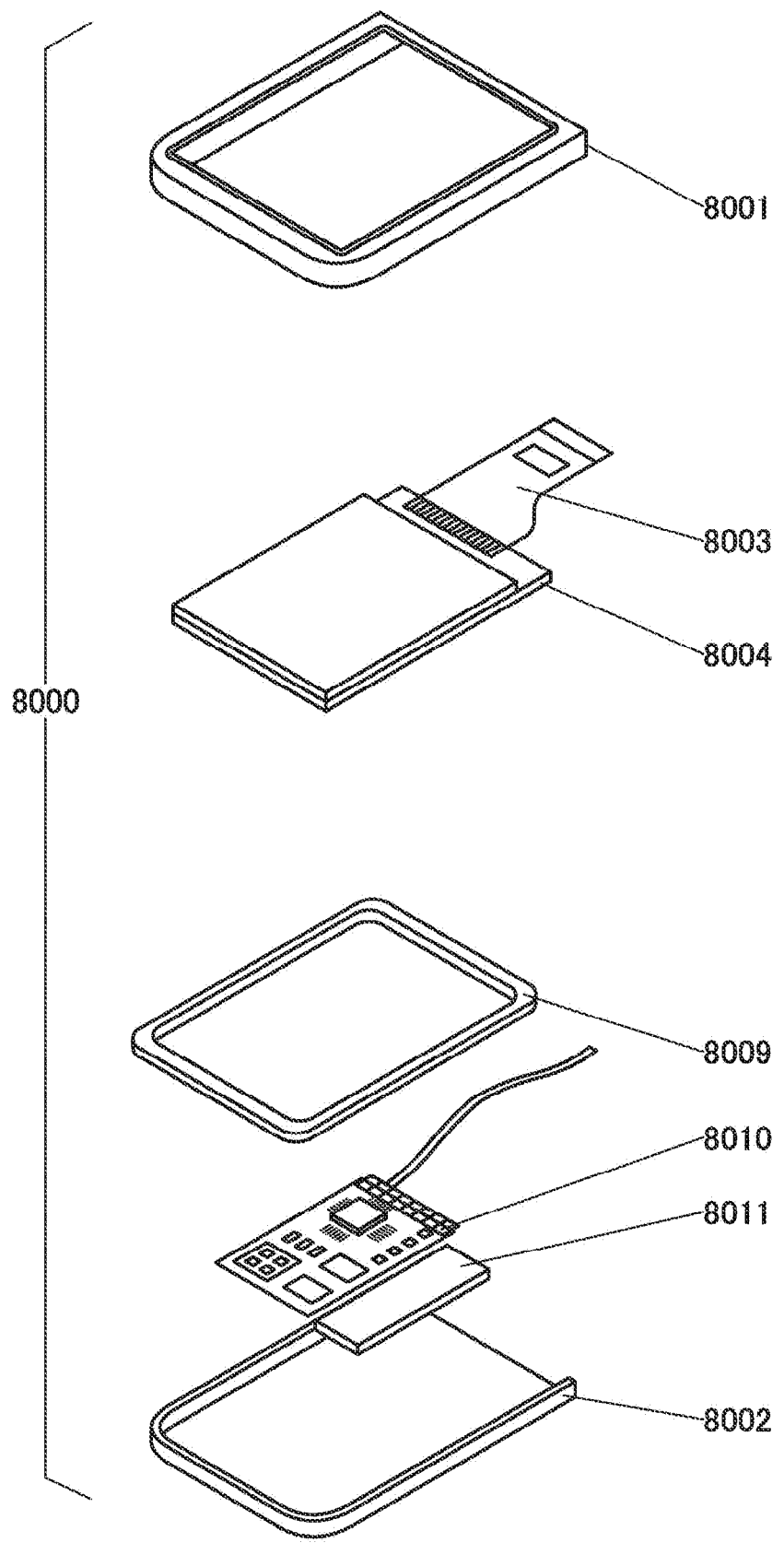
FIG. 23 illustrates a display module of one embodiment.

In a display module 8000 illustrated in FIG. 23, a touch panel 8004 connected to an FPC 8003, a frame 8009, a printed board 8010, and a battery 8011 are provided between an upper cover 8001 and a lower cover 8002.

The display panel, the touch panel, or the touch panel module of one embodiment of the present invention can be used for, for example, the touch panel 8004.

The shapes and sizes of the upper cover 8001 and the lower cover 8002 can be changed as appropriate in accordance with the size of the touch panel 8004.

The touch panel 8004 can be a resistive touch panel or a capacitive touch panel and may be formed so as to overlap with a display panel. A counter substrate (sealing substrate) of the touch panel 8004 can have a touch panel function. A photosensor may be provided in each pixel of the touch panel 8004 so that an optical touch panel can be obtained.

In the case where a transmissive or a semi-transmissive liquid crystal element is used, a backlight may be provided between the touch panel 8004 and the frame 8009. The backlight includes a light source. Note that the light source may be provided over the backlight; alternatively, the light source may be provided at an end portion of the backlight and a light diffusion plate may be further provided. Note that the backlight need not be provided in the case where a self-luminous light-emitting element such as an organic EL element is used or in the case where a reflective panel or the like is employed.

The frame 8009 protects the touch panel 8004 and also serves as an electromagnetic shield for blocking electromagnetic waves generated by the operation of the printed board 8010. The frame 8009 can also serve as a radiator plate.

The printed board 8010 is provided with a power supply circuit and a signal processing circuit for outputting a video signal and a clock signal. As a power source for supplying electric power to the power supply circuit, an external commercial power source or a power source using the battery 8011 provided separately may be used. The battery 8011 can be omitted in the case of using a commercial power source.

The touch panel 8004 can be additionally provided with a component such as a polarizing plate, a retardation plate, or a prism sheet.

Electronic devices and lighting devices can be manufactured by using the display panel, the light-emitting panel, the sensor panel, the touch panel, the touch panel module, the input device, the display device, or the input/output device of one embodiment of the present invention. Highly reliable electronic devices and lighting devices with curved surfaces can be manufactured by using the input device, the display device, or the input/output device of one embodiment of the present invention. In addition, flexible and highly reliable electronic devices and lighting devices can be manufactured by using the input device, the display device, or the input/output device of one embodiment of the present invention. Furthermore, electronic devices and lighting devices including touch sensors with improved sensitivity can be manufactured by using the input device or the input/output device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, and a large game machine such as a pachinko machine.

In the case of having flexibility, the electronic device or the lighting device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium ion battery such as a lithium polymer battery (lithium ion polymer battery) using a gel electrolyte, a nickel-hydride battery, a nickel-cadmium battery, an organic radical battery, a lead-acid battery, an air battery, a nickel-zinc battery, and a silver-zinc battery.

The electronic device of one embodiment of the present invention may include an antenna. When a signal is received by the antenna, an image, data, or the like can be displayed on a display portion. When the electronic device includes a secondary battery, the antenna may be used for contactless power transmission.

FIGS. 24A to 24H and FIGS. 25A and 25B illustrate electronic devices. These electronic devices can each include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 24A:
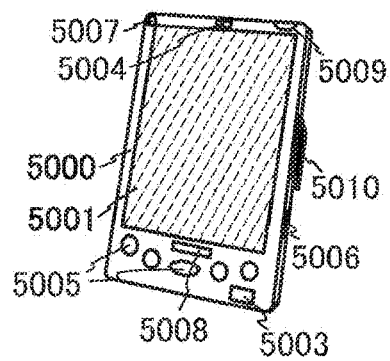
FIGS. 24A to 24H illustrate electronic devices of one embodiment.

FIG. 24A illustrates a mobile computer, which can include a switch 5009, an infrared port 5010, and the like in addition to the above components.

Figure 24B:
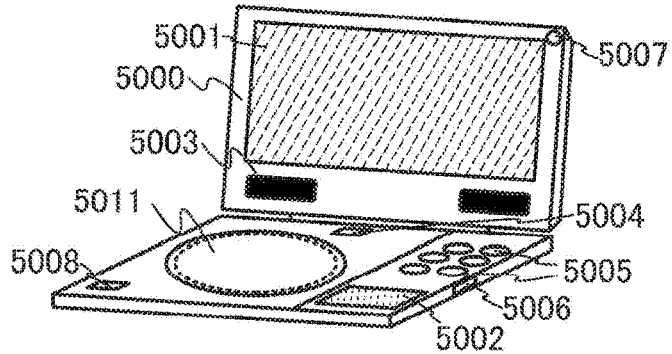

FIG. 24B illustrates a portable image reproducing device provided with a recording medium (e.g., a DVD reproducing device), which can include a second display portion 5002, a recording medium reading portion 5011, and the like in addition to the above components.

Figure 24C:
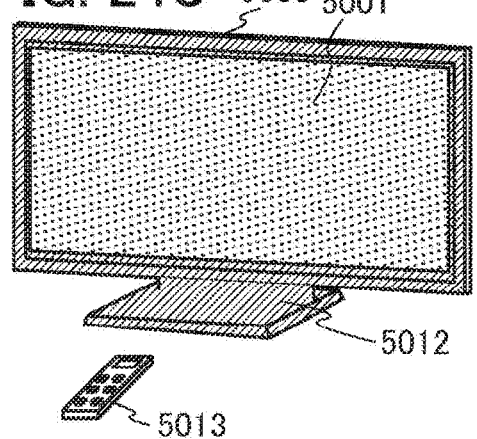

FIG. 24C illustrates a television device, which can include a stand 5012 and the like in addition to the above components. The television device can be operated by an operation switch of the housing 5000 or a separate remote controller 5013. With operation keys of the remote controller 5013, channels and volume can be controlled, and images displayed on the display portion 5001 can be controlled. The remote controller 5013 may be provided with a display portion for displaying data output from the remote controller 5013.

Figure 24D:
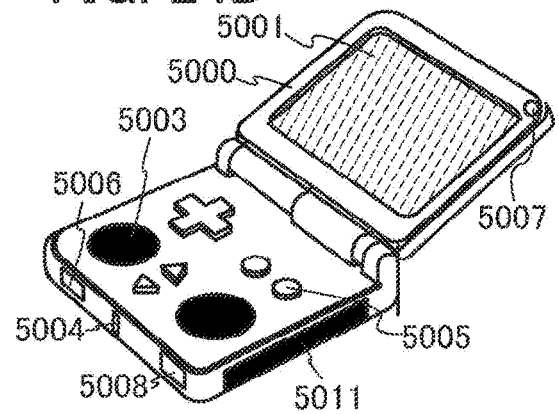

FIG. 24D illustrates a portable game machine, which can include the recording medium reading portion 5011 and the like in addition to the above components.

Figure 24E:
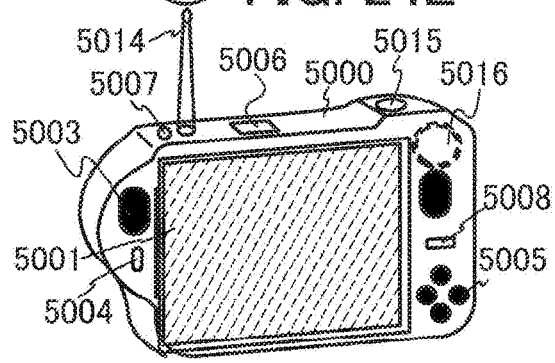

FIG. 24E illustrates a digital camera that has a television reception function and can include an antenna 5014, a shutter button 5015, an image receiving portion 5016, and the like in addition to the above components.

Figure 24F:
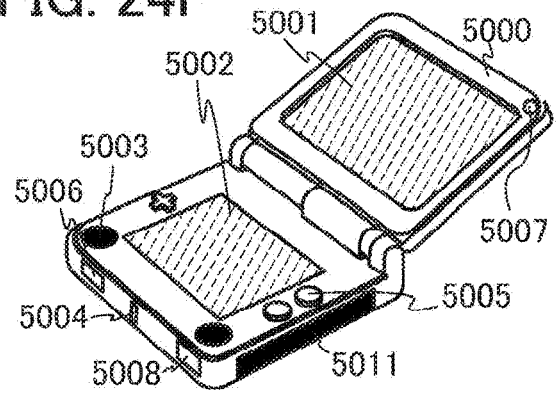

FIG. 24F illustrates a portable game machine, which can include the second display portion 5002, the recording medium reading portion 5011, and the like in addition to the above components.

Figure 24G:
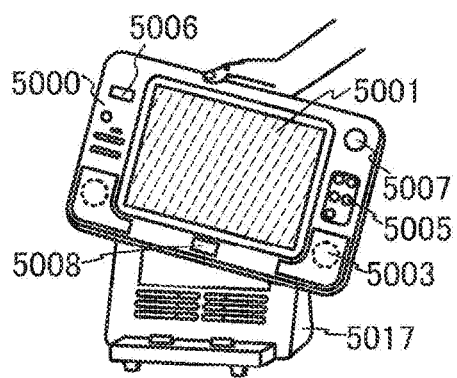

FIG. 24G illustrates a portable television receiver, which can include a charger 5017 capable of transmitting and receiving signals, and the like in addition to the above components.

Figure 24H:

FIG. 24H illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like.

Figure 25A:
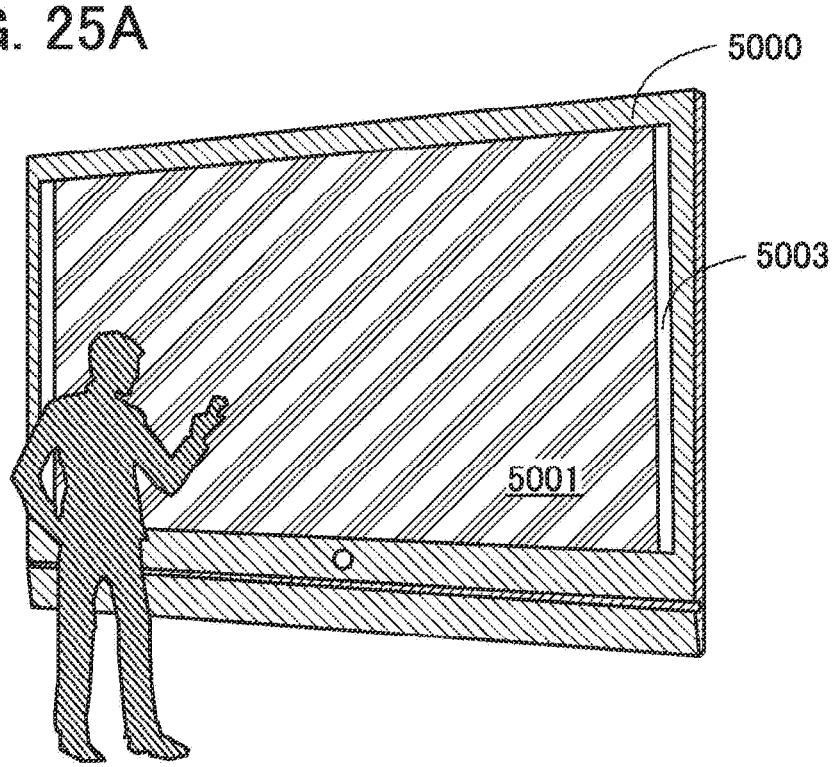
FIGS. 25A and 25B illustrate electronic devices of one embodiment.
Figure 25B:
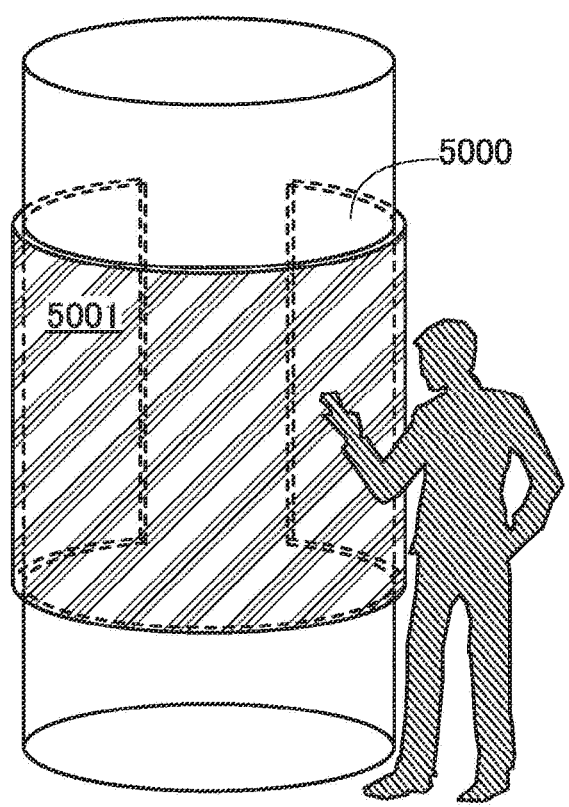

FIG. 25A illustrates a digital signage. FIG. 25B illustrates a digital signage mounted on a cylindrical pillar.

The electronic devices illustrated in FIGS. 24A to 24H and FIGS. 25A and 25B can have a variety of functions, for example, a function of displaying a variety of information (e.g., a stilt image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a recording medium (an external recording medium or a recording medium incorporated in the camera), a function of displaying a photographed image on a display portion, or the like. Note that the functions of the electronic devices illustrated in FIGS. 24A to 24H and FIGS. 25A and 25B are not limited thereto, and the electronic devices can have a variety of functions.

FIGS. 26A, 26B, 26C1, 26C2, 26D, and 26E illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the functional panel, the display panel, the light-emitting panel, the sensor panel, the touch panel, the display device, the input/output device, or the like of one embodiment of the present invention. One embodiment of the present invention makes it possible to provide a highly reliable electronic device having a curved display portion.

FIG. 26A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 26A includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

FIG. 26B illustrates an example of a television set. In a television set 7200, the display portion 7000 is incorporated into a housing 7201. Here, the housing 7201 is supported by a stand 7203.

The television set 7200 illustrated in FIG. 26B can be operated with an operation switch of the housing 7201 or a separate remote controller 7211. The display portion 7000 may include a touch sensor, and can be operated by touch on the display portion 7000 with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 26C1, 26C2, 26D, and 26E illustrate examples of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touch on the display portion 7000 with a finger, a stylus, or the like.

FIG. 26C1 is a perspective view of a portable information terminal 7300. FIG. 26C2 is a top view of the portable information terminal 7300. FIG. 26D is a perspective view of a portable information terminal 7310. FIG. 26E is a perspective view of a portable information terminal 7320.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminals 7300, 7310, and 7320 can display characters and image information on its plurality of surfaces. For example, as illustrated in FIGS. 26C1 and 26D, three operation buttons 7302 can be displayed on one surface, and information 7303 indicated by a rectangle can be displayed on another surface. FIGS. 26C1 and 26C2 illustrate an example in which information is displayed at the top of the portable information terminal. FIG. 26D illustrates an example in which information is displayed on the side of the portable information terminal. Information may be displayed on three or more surfaces of the portable information terminal. FIG. 26E shows an example in which information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7300 can see the display (here, the information 7303) on the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 26F to 26H each illustrate an example of a lighting device having a curved light-emitting portion.

The light-emitting portion included in each of the lighting devices illustrated in FIGS. 26F to 26H can be manufactured using the functional panel, the display panel, the light-emitting panel, the sensor panel, the touch panel, the display device, the input/output device, or the like of one embodiment of the present invention. According to one embodiment of the present invention, a highly reliable lighting device having a curved light-emitting portion can be provided.

A lighting device 7400 illustrated in FIG. 26F includes a light-emitting portion 7402 with a wave-shaped light-emitting surface and thus is a good-design lighting device.

A light-emitting portion 7412 included in a lighting device 7410 illustrated in FIG. 26G has two convex-curved light-emitting portions symmetrically placed. Thus, all directions can be illuminated with the lighting device 7410 as a center.

A lighting device 7420 illustrated in FIG. 26H includes a concave-curved light-emitting portion 7422. This is suitable for illuminating a specific range because light emitted from the light-emitting portion 7422 is collected to the front of the lighting device 7420. In addition, with this structure, a shadow is less likely to be produced.

The light-emitting portion included in each of the lighting devices 7400, 7410 and 7420 may have flexibility. The light-emitting portion may be fixed on a plastic member, a movable frame, or the like so that a light-emitting surface of the light-emitting portion can be bent freely depending on the intended use.

The lighting devices 7400, 7410, and 7420 each include a stage 7401 provided with an operation switch 7403 and the light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 27A1, 27A2, and 27B to 27I each illustrate an example of a portable information terminal including a display portion 7001 having flexibility.

The display portion 7001 is manufactured using the functional panel, the display panel, the light-emitting panel, the sensor panel, the touch panel, the display device, the input/output device, or the like of one embodiment of the present invention. For example, a display device or an input/output device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIGS. 27A1 and 27A2 are a perspective view and a side view illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received image on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed images, and the like can be performed. Although FIGS. 27A1, 27A2, and 27B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 27B illustrates the portable information terminal 7500 in a state where the display portion 7001 is pulled out with the display portion tab 7502. Images can be displayed on the display portion 7001 in this state. In addition, the portable information terminal 7500 may perform different displays in the state where part of the display portion 7001 is rolled as shown in FIG. 27A1 and in the state where the display portion 7001 is pulled out with the display portion tab 7502 as shown in FIG. 27B. For example, in the state shown in FIG. 27A1, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 27C to 27E illustrate an example of a foldable portable information terminal. FIG. 27C illustrates a portable information terminal 7600 that is opened. FIG. 27D illustrates the portable information terminal 7600 that is being opened or being folded. FIG. 27E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 27F and 27G illustrate an example of a foldable portable information terminal. FIG. 27F illustrates a portable information terminal 7650 that is folded so that the display portion 7001 is on the inside. FIG. 27G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 27H illustrates an example of a flexible portable information terminal. A portable information terminal 7700 includes a housing 7701 and the display portion 7001. The portable information terminal 7700 may further include buttons 7703a and 7703b which serve as input means, speakers 7704a and 7704b which serve as sound output means, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, and the battery 7709 have flexibility. Thus, it is easy to curve the portable information terminal 7700 into a desired shape or to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

FIG. 27I illustrates an example of a wrist-watch-type portable information terminal. The portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be arranged to overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 28A:
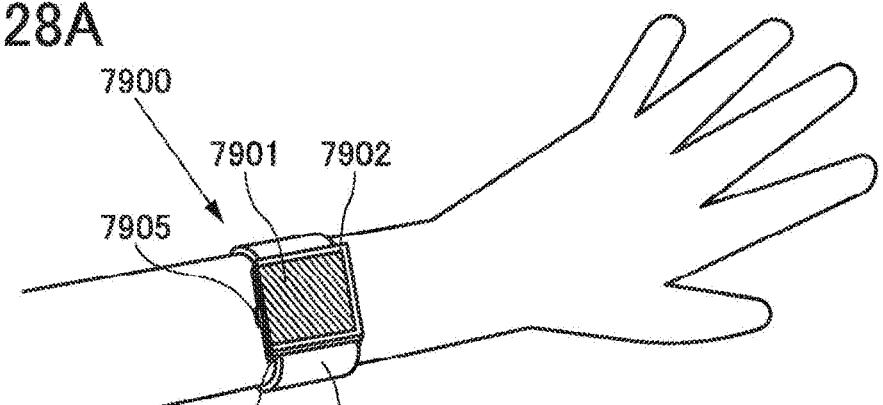
FIGS. 28A to 28E illustrate electronic devices of one embodiment.
Figure 28B:
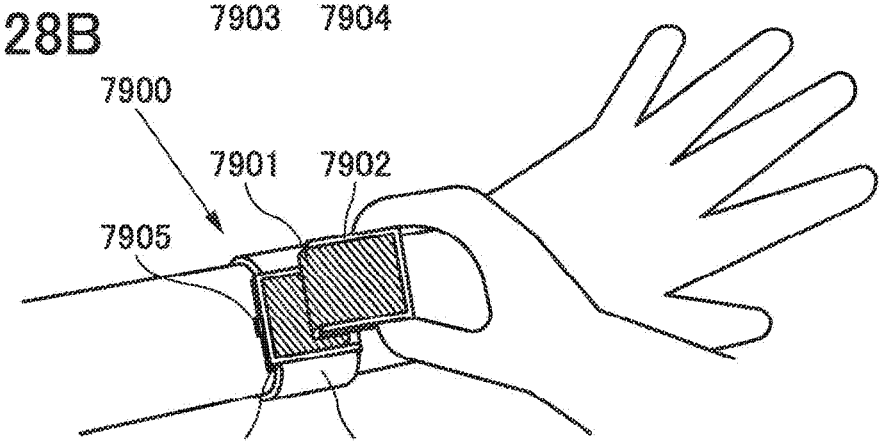
Figure 28C:
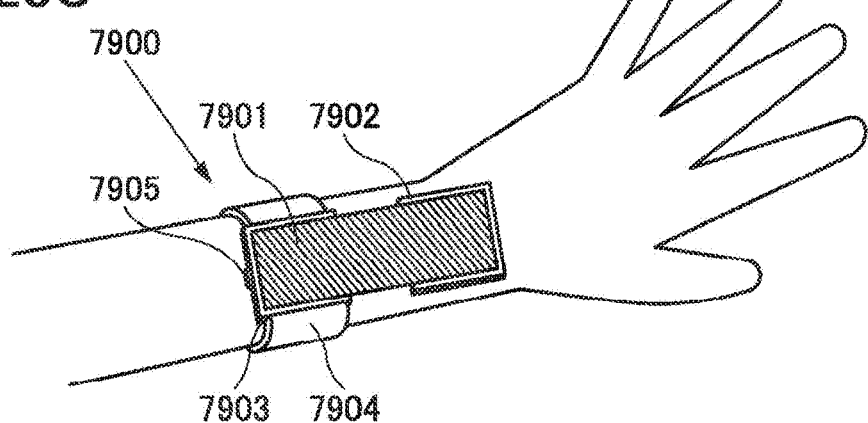

FIGS. 28A to 28C illustrate an example of a watch-type foldable portable information terminal. A portable information terminal 7900 includes a display portion 7901, a housing 7902, a housing 7903, a band 7904, an operation button 7905, and the like.

The portable information terminal 7900 can be reversibly changed in shape from a state in which the housing 7902 overlaps with the housing 7903 as illustrated in FIG. 28A into a state in which the display portion 7901 is opened as illustrated in FIG. 28C by lifting the housing 7902 as illustrated in FIG. 28B. Therefore, the portable information terminal 7900 can be generally used in a state where the display portion 7901 is folded and can be used with a wide display region by developing the display portion 7901.

When the display portion 7901 functions as a touch panel, the portable information terminal 7900 can be operated by touch on the display portion 7901. The portable information terminal 7900 can be operated by pushing, turning, or sliding the operation button 7905 vertically, forward, or backward.

A lock mechanism is preferably provided so that the housing 7902 and the housing 7903 are not detached from each other accidentally when overlapping with each other as illustrated in FIG. 28A. In that case, preferably, the lock state can be canceled by pushing the operation button 7905, for example. Alternatively, the lock state may be canceled by utilizing restoring force of a spring or the like as a mechanism in which the portable information terminal is automatically changed in form from the state illustrated in FIG. 28A into the state illustrated in FIG. 28C. Alternatively, the position of the housing 7902 relative to the housing 7903 may be fixed by utilizing magnetic force instead of the lock mechanism. By utilizing magnetic force, the housing 7902 and the housing 7903 can be easily attached or detached.

Figure 28D:
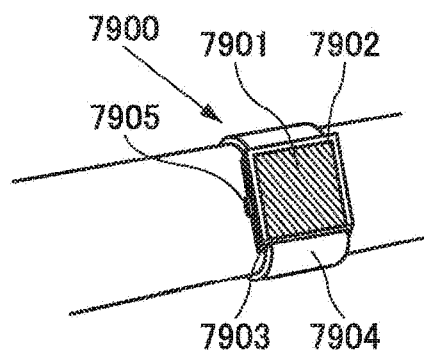
Figure 28E:
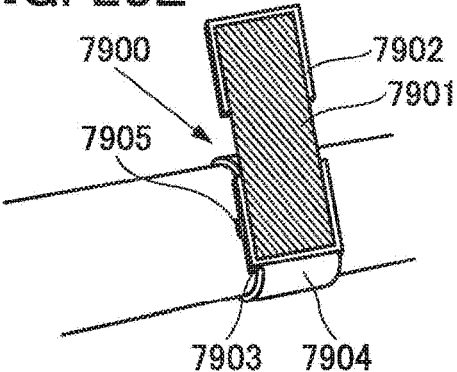

Although the display portion 7901 can be opened in a direction substantially perpendicular to the bending direction of the band 7904 in FIGS. 28A to 28C, the display portion 7901 may be opened in a direction substantially parallel to the bending direction of the band 7904 as illustrated in FIGS. 28D and 28E. In that case, the display portion 7901 may be used in a bent state to be wound to the band 7904.

The electronic devices described in this embodiment each include a display portion for displaying some kind of information. The display device such as the display panel, the touch panel, or the touch panel module of one embodiment of the present invention can be used for the display portion.

At least part of this embodiment can be implemented in combination with any of the other embodiments described in this specification as appropriate.

Example

A display device of one embodiment of the present invention was fabricated, and the observation results of the cross section thereof will be described below. For the cross-sectional structure of the display device fabricated in this example, FIG. 9 can be referred to.

[Fabrication of Display Device]

First, a transistor, a wiring connected to the transistor, and the like were formed over a glass substrate. As the transistor (the transistor 201, 202, 205, or the like), a bottom-gate transistor using an oxide semiconductor for a semiconductor where a channel was formed was employed. In this example, a crystalline oxide semiconductor having c-axis alignment in a direction perpendicular to a film surface (CAAC-OS: c-axis aligned crystalline-oxide semiconductor) was used as the oxide semiconductor.

The CAAC-OS is a crystalline oxide semiconductor in which c-axes of crystals are oriented in a direction substantially perpendicular to the film surface. It has been found that oxide semiconductors have a variety of crystal structures other than a single crystal structure. An example of such structures is a nano-crystal (nc) structure, which is an aggregate of nanoscale microcrystals. The crystallinity of a CAAC-OS structure is lower than that of a single crystal structure and higher than that of an nc structure. Since the CAAC-OS does not have a grain boundary, a stable and uniform film can be formed over a large area, and stress that is caused by bending a flexible light-emitting device does not easily make a crack in a CAAC-OS film.

In this example, In—Ga—Zn-based oxide was used as the oxide semiconductor material Subsequently, a first electrode serving as a pixel electrode was formed over an insulating layer covering the transistor, the wiring, and the like. The first electrode has a layered structure of a titanium film, an aluminum film, and a titanium film. Then, an insulating layer covering an end portion of the first electrode was formed. The insulating layer was formed using photosensitive polyimide with a thickness of approximately 2 µm. After that, a structure body was formed over the insulating layer using photosensitive polyimide with a thickness of approximately 1.25 µm.

Then, an EL layer and a second electrode were deposited by an evaporation method, whereby a light-emitting element was obtained. Here, the EL layer and the second electrode were formed over an entire display region without using a metal mask.

A light-blocking layer was formed over another glass substrate. A black matrix with a thickness of approximately 0.6 µm was used as the light-blocking layer. Subsequently, a red coloring layer (R), a green coloring layer (G), and a blue coloring layer (B) were formed to a thickness of approximately 2.0 µm, a thickness of approximately 1.5 µm, and a thickness of approximately 1.5 µm, respectively.

Then, the two glass substrates were attached with an adhesive, and the adhesive was cured. The adhesive was formed by screen printing on the substrate provided with the coloring layers. A thermosetting epoxy was used for the adhesive. The substrates were attached under a reduced-pressure atmosphere.

White was displayed on the entire display region of the display device fabricated in this example, and the display surface was visually observed perpendicularly and obliquely. As a result, an extremely small change in chromaticity and luminance was found even when the display surface was seen obliquely.

[Cross-Sectional Observation Results]

The fabricated display device was processed by ion milling and the cross section thereof was observed by scanning electron microscope (SEM).

Figure 29A:
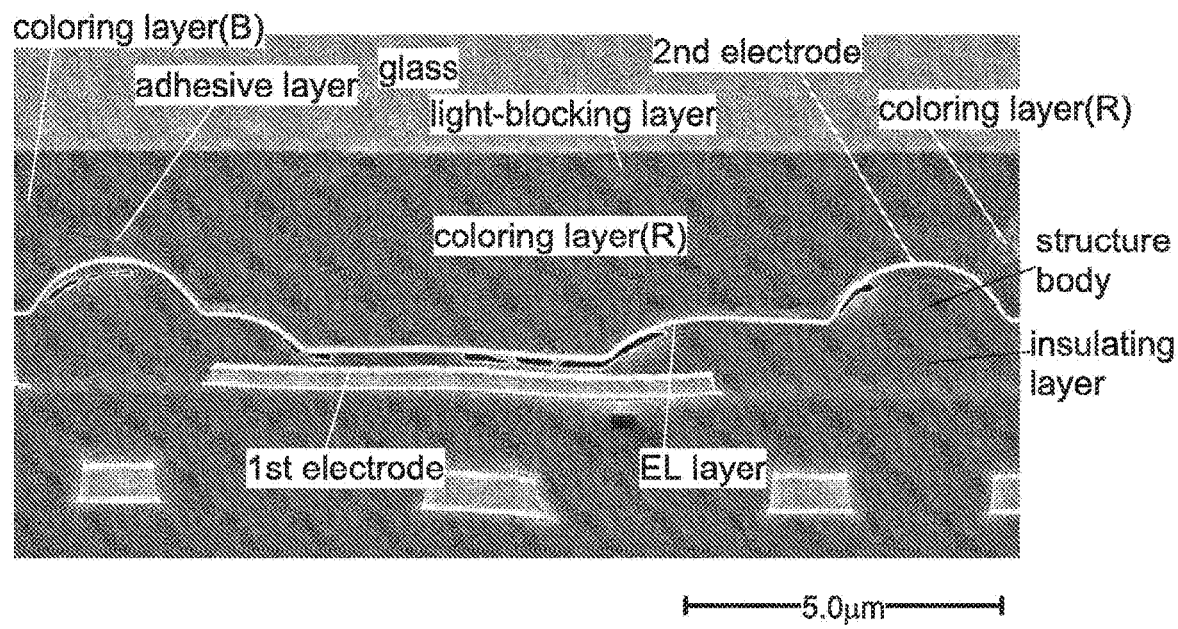
FIGS. 29A and 29B are cross-sectional observation images of Example.
Figure 29B:
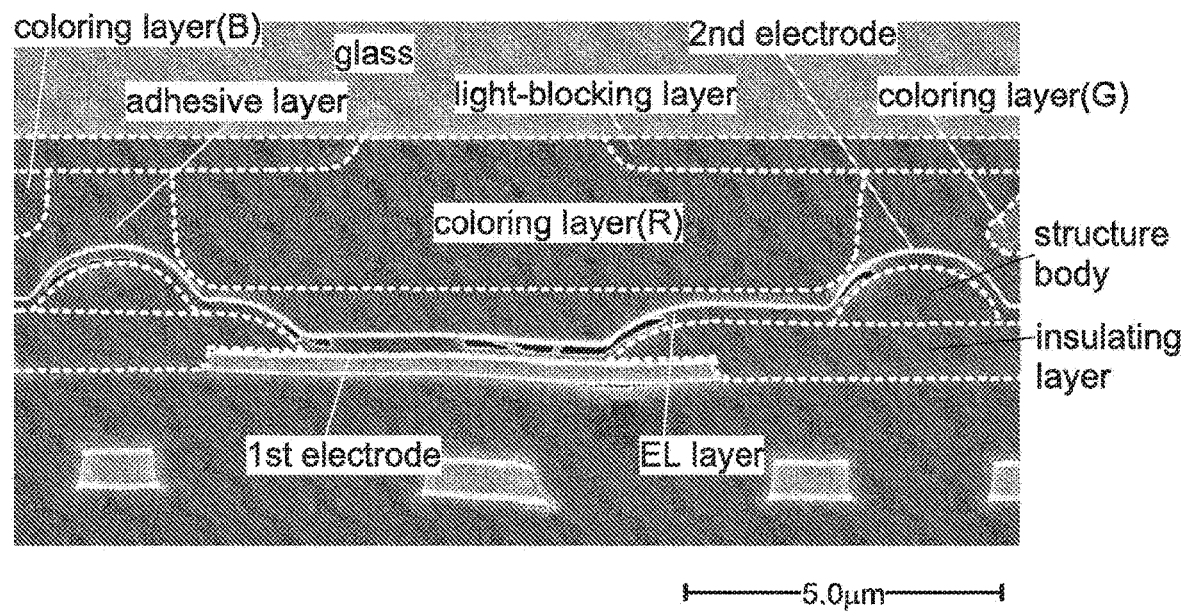

FIGS. 29A and 29B show observed cross-sectional images. FIGS. 29A and 29B show the same image; in FIG. 29B, the outline of each layer in FIG. 29A is denoted by a dashed line for clarity.

Note that holes found in part of the EL layer in FIGS. 29A and 29B were formed in the processing for the cross-sectional observation.

FIGS. 29A and 29B show two structure bodies: the left one is positioned between the coloring layer (R) and the coloring layer (B), and the right one is positioned between the coloring layer (R) and the coloring layer (G). In each of the structure bodies, a portion positioned on an upper side than the bottom surface of the coloring layer (R) was found.

In the fabricated display device, a region in which the distance between the first electrode and the coloring layer (R) (a difference in the height therebetween) was approximately 1.0 µm was found in the opening in the insulating layer. A region in which the distance between the second electrode and the coloring layer (R) was approximately 0.7 µm was also found in the opening in the insulating layer. In addition, a region in which the distance between the first electrode and the light-blocking layer was approximately 2.8 µm was found in the opening in the insulating layer. Furthermore, a region in which the distance between the second electrode and the light-blocking layer was approximately 2.5 µm was found in the opening in the insulating layer.

The display device was found to have a region in which the distance between the structure body and the light-blocking layer was approximately 1.5 µm. It was also found that the distance between the second electrode and the light-blocking layer over the structure body was approximately 1.2 µm.

The structure body had an inverse tapered shape with a taper angle (the angle between the bottom surface and the side surface of the structure body) of approximately 45° to 70°. Part of the EL layer covering the structure body was found to be thinner than another part of the EL layer over the first electrode.

The above results showed that the display device fabricated in this example had an extremely small distance between the pair of substrates. Moreover, improved viewing angle characteristics were observed visually.

The above is the description of this example.

This application is based on Japanese Patent Application serial No. 2015-169163 filed with Japan Patent Office on Aug. 28, 2015, and Japanese Patent Application serial No. 2016-119610 filed with Japan Patent Office on Jun. 16, 2016, the entire contents of which are hereby incorporated by reference.

EXPLANATION OF REFERENCE

10: display device 11: structure body 11a: portion 12: structure body 21: substrate 23: conductive layer 24: EL layer 24a: EL layer 24b: El layer 25: conductive layer 31: substrate 32: display portion 34: circuit 35: wiring 39: adhesive layer 40: light-emitting element 42: FPC 43: IC 51: coloring layer 51a: coloring layer 51b: coloring layer 51c: coloring layer 52: light-blocking layer 52b: coloring layer 60: liquid crystal element 61: conductive layer 62: liquid crystal 63: conductive layer 64: insulating layer 65: insulating layer 70: transistor 71: conductive layer 72: semiconductor layer 73: insulating layer 74a: conductive layer 74b: conductive layer 81: insulating layer 81a: insulating layer 81b: insulating layer 82: insulating layer 82a: portion 90: transistor 91: single crystal substrate 95a: connection layer 95b: connection layer 96: conductive layer 100: touch panel 111: conductive layer 112: EL layer 113: conductive layer 130: polarizing plate 131: coloring layer 131a: coloring layer 131b: coloring layer 132: light-blocking layer 133: light-blocking layer 134: coloring layer 141: adhesive layer 142: adhesive layer 146: conductive film 147: conductive film 148: conductive film 149: nanowire 150: input device 151: electrode 152: electrode 153: bridge electrode 155: wiring 157: FPC 150: IC 160: substrate 161: insulating layer 162: insulating layer 163: insulating layer 164: insulating layer 165: adhesive layer 168: IC 169: connection portion 170: substrate 171: substrate 172: adhesive layer 173: insulating layer 181: substrate 183: insulating layer 191: conductive layer 192: conductive layer 192: liquid crystal 194: conductive layer 195: insulating layer 200: display device 201: transistor 202: transistor 203: capacitor 204: terminal portion 205: transistor 206: transistor 206: terminal portion 210: pixel 211: insulating layer 212: insulating layer 213: insulating layer 214: insulating layer 215: insulating layer 216: insulating layer 220: insulating layer 221: conductive layer 222: conductive layer 223: conductive layer 224: conductive layer 231: semiconductor layer 242: connection layer 243: connector 251: opening 252: connection portion 601: pulse voltage output circuit 602: current sensing circuit 603: capacitor 621: electrode 622: electrode 705: insulating layer 706: electrode 707: insulating layer 708: semiconductor layer 710: insulating layer 711: insulating layer 714: electrode 715: electrode 722: insulating layer 723: electrode 726: insulating layer 727: insulating layer 728: insulating layer 729: insulating layer 741: insulating layer 742: semiconductor layer 744a: electrode 744b: electrode 746: electrode 755: impurity 771: substrate 772: insulating layer 810: transistor 811: transistor 820: transistor 821: transistor 825: transistor 830: transistor 831: transistor 840: transistor 841: transistor 842: transistor 843: transistor 844: transistor 845: transistor 846: transistor 847: transistor 5000: housing 5001: display portion 5002: display portion 5003: speaker 5004: LED lamp 5005: operation key 5006: connection terminal 5007: sensor 5008: microphone 5009: switch 5010: infrared port 5011: recording medium reading portion 5012: stand 5013: remote controller 5014: antenna 5015: shutter button 5016: image receiving portion 5017: charger 5018: band 5019: clasp 5020: icon 5021: icon 7000: display portion 7001: display portion 7100: mobile phone 7101: housing 7103: operation button 7104: external connection port 7105: speaker 7106: microphone 7200: television set 7201: housing 7203: stand 7211: remote controller 7300: portable information terminal 7301: housing 7302: operation button 7303: information 7304: information 7305: information 7306: information 7310: portable information terminal 7320: portable information terminal 7400: lighting device 7401: stage 7402: light-emitting portion 7403: operation switch 7410: lighting device 7412: light-emitting portion 7420: lighting device 7422: light-emitting portion 7500: portable information terminal 7501: housing 7502: member 7503: operation button 7600: portable information terminal 7601: housing 7602: hinge 7650: portable information terminal 7651: non-display portion 7700: portable information terminal 7701: housing 7703a: button 7703b: button 7704a: speaker 7704b: speaker 7705: external connection port 7706: microphone 7709: battery 7800: portable information terminal 7801: band 7802: input/output terminal 7803: operation button 7804: icon 7805: battery 7900: portable information terminal 7901: display portion 7902: housing 7903: housing 7904: band 7905: operation button 8000: display module 8001: upper cover 8002: lower cover 8003: FPC 8004: touch panel 8009: frame 8010: printed board 8011: battery

What is claimed is:

1. A liquid crystal display device comprising:
   a transistor over a first substrate;
   a liquid crystal element over the first substrate, the liquid crystal element electrically connected to the transistor, and the liquid crystal element comprising a first conductive layer, a second conductive layer, and a liquid crystal;
   an insulating layer over the first substrate;
   a first coloring layer and a second coloring layer over the insulating layer;
   a structure body over and in directly contact with the insulating layer, and between the first coloring layer and the second coloring layer; and
   a second substrate over the first coloring layer and the second coloring layer,
   wherein a top surface of the structure body is closer to the second substrate side than a bottom surface of the first coloring layer or a bottom surface of the second coloring layer is,
   wherein a channel formation region of the transistor comprises an oxide semiconductor, and
   wherein the channel formation region of the transistor and the structure body overlap each other.

2. The liquid crystal display device according to claim 1, wherein a thickness of the first coloring layer is different from a thickness of the second coloring layer.

3. The liquid crystal display device according to claim 1, wherein a top surface of the first coloring layer and a top surface of the second coloring layer are closer to the second substrate side than the bottom surface of the first coloring layer and the bottom surface of the second coloring layer.

4. The liquid crystal display device according to claim 1, wherein the first coloring layer and the second coloring layer are apart from each other.

5. The liquid crystal display device according to claim 1, wherein the structure body and the second substrate overlap each other with an adhesive layer therebetween.

6. The liquid crystal display device according to claim 1,
wherein one of the first conductive layer and the second conductive layer is a pixel electrode, and
wherein the other of the first conductive layer and the second conductive layer is a common electrode.

7. A liquid crystal display device comprising:
a transistor over a first substrate;
a liquid crystal element over the first substrate, the liquid crystal element electrically connected to the transistor, and the liquid crystal element comprising a first conductive layer, a second conductive layer, and a liquid crystal overlapping with the first conductive layer and the second conductive layer;
an insulating layer over the first substrate;
a first coloring layer and a second coloring layer over the insulating layer; and
a structure body over the insulating layer, and between the first coloring layer and the second coloring layer,
wherein a channel formation region of the transistor comprises an oxide semiconductor,
wherein the channel formation region of the transistor and the structure body overlap each other, and
wherein one of the first conductive layer and the second conductive layer comprises a slit.

8. The liquid crystal display device according to claim 7, wherein a thickness of the first coloring layer is different from a thickness of the second coloring layer.

9. The liquid crystal display device according to claim 7, wherein the first coloring layer and the second coloring layer are apart from each other.

10. The liquid crystal display device according to claim 7,
wherein one of the first conductive layer and the second conductive layer is a pixel electrode, and
wherein the other of the first conductive layer and the second conductive layer is a common electrode.

11. The liquid crystal display device according to claim 7, further comprising a second substrate over the first coloring layer and the second coloring layer.

12. A liquid crystal display device comprising:
a transistor over a first substrate;
a liquid crystal element over the first substrate, the liquid crystal element electrically connected to the transistor, and the liquid crystal element comprising a first conductive layer, a second conductive layer, and a liquid crystal overlapping with the first conductive layer and the second conductive layer;
an insulating layer over the first substrate;
a first coloring layer and a second coloring layer over the insulating layer; and
a structure body over the insulating layer, and between the first coloring layer and the second coloring layer,
wherein a channel formation region of the transistor comprises an oxide semiconductor,
wherein the channel formation region of the transistor and the structure body overlap each other,
wherein one of the first conductive layer and the second conductive layer comprises a slit, and
wherein the first coloring layer, the second coloring layer, and the structure body extend in the same direction when seen from above.

13. The liquid crystal display device according to claim 12, wherein a thickness of the first coloring layer is different from a thickness of the second coloring layer.

14. The liquid crystal display device according to claim 12, wherein the first coloring layer and the second coloring layer are apart from each other.

15. The liquid crystal display device according to claim 12,
wherein one of the first conductive layer and the second conductive layer is a pixel electrode, and
wherein the other of the first conductive layer and the second conductive layer is a common electrode.

16. The liquid crystal display device according to claim 12, further comprising a second substrate over the first coloring layer and the second coloring layer.

* * * * *